(12) United States Patent
Kwon et al.

(10) Patent No.: US 11,805,655 B2
(45) Date of Patent: Oct. 31, 2023

(54) MEMORY DEVICE

(71) Applicant: SAMSUNG ELECTRONICS CO., LTD., Suwon-si (KR)

(72) Inventors: Donghoon Kwon, Hwaseong-si (KR); Junsuk Kim, Hwaseong-si (KR); Jongheun Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 272 days.

(21) Appl. No.: 17/324,411

(22) Filed: May 19, 2021

(65) Prior Publication Data
US 2022/0102370 A1    Mar. 31, 2022

(30) Foreign Application Priority Data

Sep. 29, 2020 (KR) .......................... 10-2020-0126569

(51) Int. Cl.
| | |
|---|---|
| H01L 21/00 | (2006.01) |
| H10B 43/50 | (2023.01) |
| H01L 23/535 | (2006.01) |
| H01L 21/768 | (2006.01) |
| H10B 41/27 | (2023.01) |
| H10B 41/41 | (2023.01) |
| H10B 41/50 | (2023.01) |
| H10B 43/27 | (2023.01) |
| H10B 43/40 | (2023.01) |

(52) U.S. Cl.
CPC ....... *H10B 43/50* (2023.02); *H01L 21/76805* (2013.01); *H01L 21/76895* (2013.01); *H01L 23/535* (2013.01); *H10B 41/27* (2023.02); *H10B 41/41* (2023.02); *H10B 41/50* (2023.02); *H10B 43/27* (2023.02); *H10B 43/40* (2023.02)

(58) Field of Classification Search
CPC .............. H10B 43/50; H01L 21/76805; H01L 21/76895
See application file for complete search history.

(56) References Cited

U.S. PATENT DOCUMENTS

| | | |
|---|---|---|
| 7,679,133 B2 | 3/2010 | Son et al. |
| 8,178,917 B2 * | 5/2012 | Tanaka .................... H10B 69/00 438/257 |
| 8,236,650 B2 | 8/2012 | Son et al. |

(Continued)

FOREIGN PATENT DOCUMENTS

KR    10-1226685 B1    1/2013

*Primary Examiner* — Laura M Menz
(74) *Attorney, Agent, or Firm* — Lee IP Law, P.C.

(57) ABSTRACT

A memory device includes a cell stacked structure on a substrate, the cell stacked structure including insulation layers and gate patterns alternately stacked, a channel structure passing through the cell stacked structure, the channel structure extending in a vertical direction, a dummy structure on the substrate, the dummy structure being spaced apart from the cell stacked structure, and the dummy structure including insulation layers and metal patterns alternately stacked, a first through via contact passing through the dummy structure, the first through via contact extending in the vertical direction, and a first capping insulation pattern between a sidewall of the first through via contact and each of the metal patterns in the dummy structure, the first capping insulation pattern insulating the first through via contact from each of the metal patterns.

20 Claims, 39 Drawing Sheets

(56) References Cited

U.S. PATENT DOCUMENTS

| | | | |
|---|---|---|---|
| 8,492,828 B2 | 7/2013 | Son et al. | |
| 8,581,323 B2 | 11/2013 | Uenaka et al. | |
| 8,951,859 B2 * | 2/2015 | Higashitani | H10B 43/27 |
| | | | 438/738 |
| 9,111,592 B2 * | 8/2015 | Maejima | H10B 43/40 |
| 9,520,562 B2 * | 12/2016 | Xie | H10N 70/021 |
| 9,620,512 B1 | 4/2017 | Nishikawa et al. | |
| 9,673,213 B1 | 6/2017 | Yu et al. | |
| 9,698,151 B2 * | 7/2017 | Lee | H10B 43/50 |
| 9,698,155 B2 * | 7/2017 | Shim | H10B 43/10 |
| 9,754,960 B2 | 9/2017 | Jeon | |
| 9,780,104 B2 | 10/2017 | Nomachi et al. | |
| 9,985,048 B2 * | 5/2018 | Lee | H01L 29/792 |
| 10,115,667 B2 * | 10/2018 | Yun | H10B 43/40 |
| 10,319,729 B2 * | 6/2019 | Hasegawa | H01L 29/40117 |
| 10,438,998 B2 * | 10/2019 | Lee | H10B 43/27 |
| 11,289,507 B2 * | 3/2022 | Kanamori | H01L 21/31111 |
| 11,456,335 B2 * | 9/2022 | Lim | H10B 43/40 |
| 2019/0115361 A1 * | 4/2019 | Kim | G11C 16/0466 |
| 2019/0312051 A1 * | 10/2019 | Park | H10B 43/30 |
| 2020/0105783 A1 * | 4/2020 | Baek | H01L 21/31111 |
| 2020/0411540 A1 * | 12/2020 | Cheon | H10B 43/27 |
| 2020/0411542 A1 * | 12/2020 | Yang | H10B 41/50 |
| 2021/0036010 A1 * | 2/2021 | Sim | H10B 43/10 |
| 2021/0125928 A1 * | 4/2021 | Kim | H01L 21/76877 |
| 2021/0296324 A1 * | 9/2021 | Lim | H10B 43/40 |
| 2021/0327896 A1 * | 10/2021 | Cheon | G11C 7/18 |
| 2021/0399003 A1 * | 12/2021 | Shin | H10B 43/50 |
| 2022/0028877 A1 * | 1/2022 | Hwang | H10B 41/41 |
| 2022/0102370 A1 * | 3/2022 | Kwon | H10B 43/27 |
| 2022/0208696 A1 * | 6/2022 | Lee | H01L 23/562 |
| 2022/0223525 A1 * | 7/2022 | Hwang | H10B 43/50 |
| 2022/0223615 A1 * | 7/2022 | Kim | H10B 41/35 |
| 2022/0254802 A1 * | 8/2022 | Kwon | H10B 43/10 |
| 2022/0384477 A1 * | 12/2022 | Kwon | H10B 43/27 |
| 2023/0054445 A1 * | 2/2023 | Kanamori | H10B 41/27 |
| 2023/0125995 A1 * | 4/2023 | Kim | H10B 43/50 |
| | | | 257/314 |

* cited by examiner

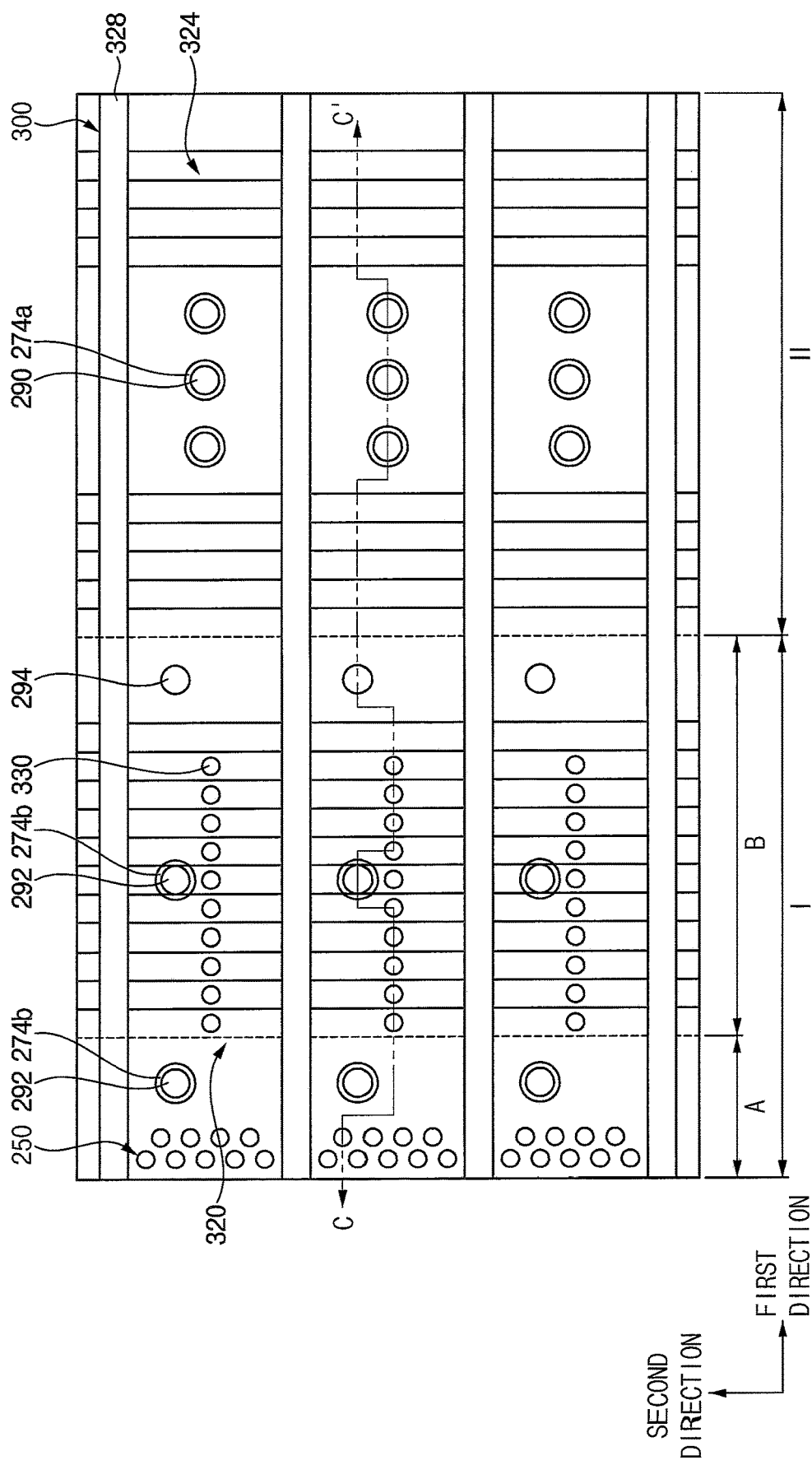

MEMORY DEVICE

CROSS-REFERENCE TO RELATED APPLICATION

Korean Patent Application No. 10-2020-0126569, filed on Sep. 29, 2020 in the Korean Intellectual Property Office, and entitled: "Memory Device," is incorporated by reference herein in its entirety.

BACKGROUND

1. Field

Example embodiments relate to a memory device and an electronic system including the same.

2. Description of the Related Art

In an electronic system requiring data storage, a semiconductor device capable of storing high-capacity data may be required. For integration of the semiconductor device, a vertical non-volatile memory device in which memory cells are stacked in a vertical direction may be developed. The vertical memory device may have a cell on peripheral (COP) structure in which peripheral circuits are formed on a substrate and cell stacked structures including stacked memory cells are formed over on the peripheral circuits. The vertical memory device may include through via contacts for connecting the may be the memory cells and the peripheral circuits.

SUMMARY

According to example embodiments, there is provided a memory device that may a cell stacked structure on a substrate, a channel structure passing through the cell stacked structure, a dummy structure on the substrate, a first through via contact passing through the dummy structure, and a first capping insulation pattern. The cell stacked structure may include insulation layers and gate patterns alternately stacked. The channel structure may extend in a vertical direction. The dummy structure may be spaced apart from the cell stacked structure to be adjacent to the cell stacked structure. The dummy structure may include insulation layers and metal patterns alternately stacked. The first through via contact may extend in the vertical direction. The first capping insulation pattern may be between a sidewall of the first through via contact and each of the metal patterns. The first through via contact and each of the metal patterns may be insulated from each other by the first capping insulation pattern.

According to example embodiments, there is provided a memory device that may include a circuit pattern formed on a substrate, a base semiconductor pattern on the circuit pattern, a cell stacked structure on the base semiconductor pattern, a channel structure passing through the cell stacked structure and extending in a vertical direction, a dummy structure on the base semiconductor pattern, a first through via contact passing through the dummy structure and extending in the vertical direction, and a first capping insulation pattern. The cell stacked structure may include insulation layers and gate patterns alternately stacked. The channel structure may include a channel electrically connected to the base semiconductor pattern. The dummy structure may be spaced apart from the cell stacked structure to be adjacent to the cell stacked structure. The dummy structure including insulation layers and metal patterns alternately stacked. The first through via contact being electrically connected to the circuit pattern. The first capping insulation pattern may be between a sidewall of the first through via contact and each of the metal patterns. The first through via contact and each of the metal patterns may be insulated from each other by the first capping insulation pattern. The gate patterns in the cell stacked structure may include a material the same as a material of the metal patterns in the dummy structure.

According to example embodiments, there is provided an electric system that may include a memory device and a controller for controlling the memory device. The controller may be electrically connected to the memory device through an input/output pad of the memory device. The memory device may include a peripheral circuit pattern on a substrate, a cell stacked structure on the peripheral circuit pattern, a channel structure passing through the cell stacked structure and extending in a vertical direction, a dummy structure on the peripheral circuit pattern, a first through via contact passing through the dummy structure and extending in the vertical direction, a first capping insulation pattern and the input/output pad. The cell stacked structure may include insulation layers and gate patterns alternately stacked. The dummy structure may be spaced apart from the cell stacked structure to be adjacent to the cell stacked structure. The dummy structure may include insulation layers and metal patterns alternately stacked. The first through via contact may be electrically connected to the peripheral circuit pattern. The first capping insulation pattern may be between a sidewall of the first through via contact and each of the metal patterns. The first through via contact and each of the metal patterns may be insulated from each other by the first capping insulation pattern. The input/output pad may be electrically connected to the peripheral circuit pattern.

BRIEF DESCRIPTION OF THE DRAWINGS

Features will become apparent to those of skill in the art by describing in detail exemplary embodiments with reference to the attached drawings, in which:

FIG. 8 is a plan view illustrating the NAND flash memory device in accordance with example embodiments;

DETAILED DESCRIPTION

Hereinafter, a direction substantially perpendicular to an upper surface of the substrate is defined as a vertical direction, and two directions substantially crossing with each other in horizontal directions substantially parallel to the upper surface of the substrate are defined as first and second directions, respectively. In example embodiments, the first and second directions may be perpendicular to each other.

Figure 1:
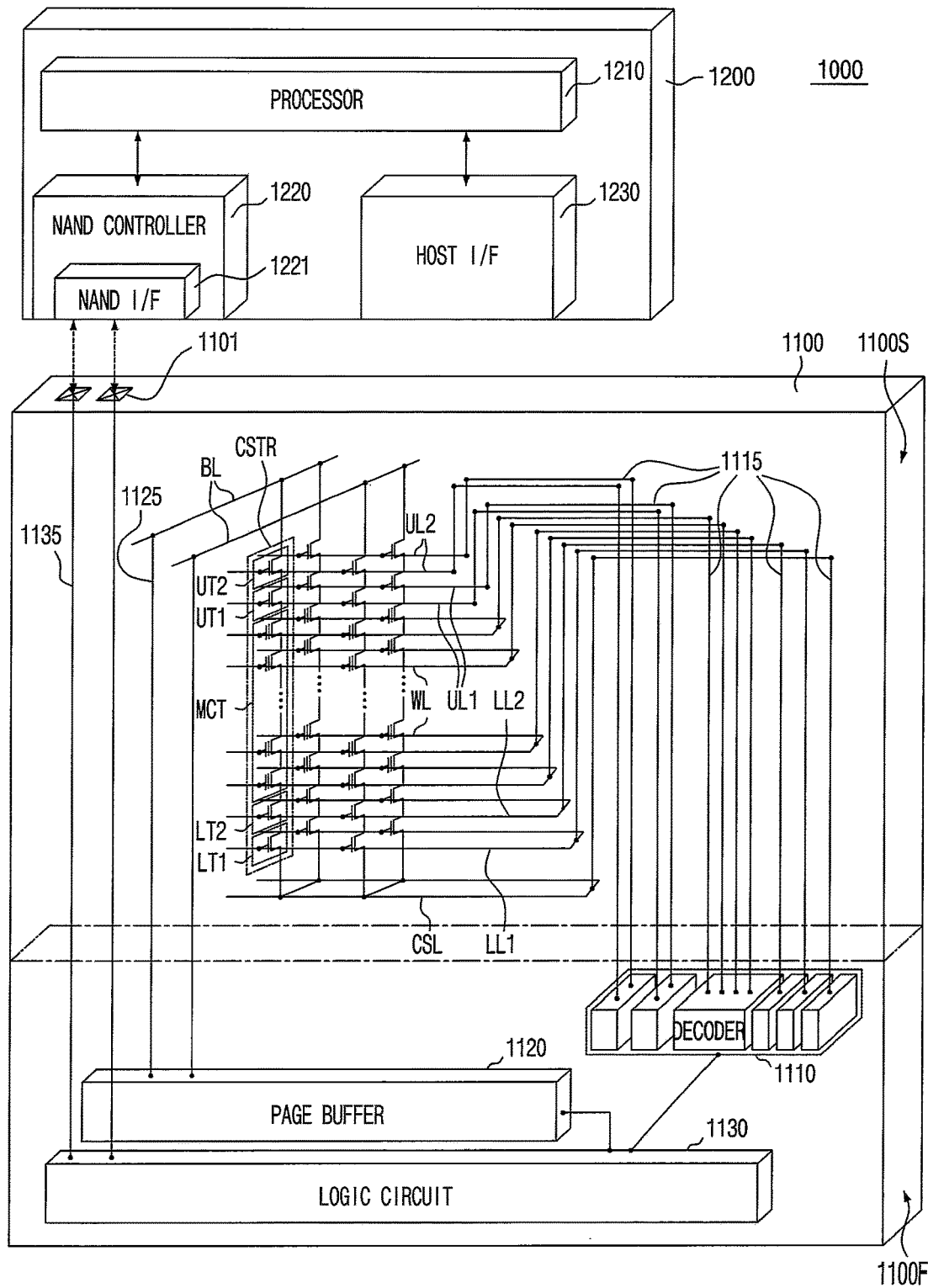
FIG. 1 is a schematic diagram of an electronic system including a semiconductor device in accordance with example embodiments.

FIG. 1 is a schematic diagram of an electronic system including a semiconductor device in accordance with example embodiments.

Referring to FIG. 1, an electronic system 1000 in accordance with example embodiments may include a semiconductor device 1100 and a controller 1200 electrically connected to the semiconductor device 1100. The electronic system 1000 may be a storage device including one or more semiconductor devices 1100 or an electronic device including a storage device. For example, the electronic system 1000 may be a solid state drive device (SSD), a universal serial bus (USB), a computing system, a medical device, or a communication device, which include one or more semiconductor devices 1100.

The semiconductor device 1100 may be a non-volatile memory device. For example, the semiconductor device 1100 may be one of the NAND flash memory devices illustrated with reference to FIGS. 6 to 39.

The semiconductor device 1100 may include a first structure 1100F and a second structure 1100S on the first structure 1100F. The first structure 1100F may be a peripheral circuit structure including a decoder circuit 1110, a page buffer 1120, and a logic circuit 1130. The second structure 1100S may include a bit line BL, a common source line CSL, word lines WL, first and second gate upper lines UL1 and UL2, first and second gate lower lines LL1 and LL2, and memory cell strings CSTR between the bit line BL and the common source line CSL. The second structure 1100S may serve as a memory cell structure.

The controller 1200 may include a processor 1210, a NAND controller 1220, and a host interface (I/F) 1230. In example embodiments, the electronic system 1000 may include a plurality of semiconductor devices 1100. In this case, the controller 1200 may control the plurality of semiconductor devices 1100.

The processor 1210 may control an overall operation of the electronic system 1000 including the controller 1200. The processor 1210 may operate according to a firmware. The processor 1210 may control the NAND controller 1220 so that the semiconductor device 1100 may be accessed. The NAND controller 1220 may include a NAND interface (I/F) 1221 for communication with the semiconductor device 1100. A control command for controlling the semiconductor device 1100, data for writing in the memory cell transistors MCT of the semiconductor device 1100, and data for reading from the memory cell transistors MCT of the semiconductor device 1100 may be transmitted by the NAND I/F 1221. The host I/F 1230 may be communicated between the electronic system 1000 and an external host. When the control command is received from the external host by the host I/F 1230, the processor 1210 may control the semiconductor device 1100 in response to the control command.

Figure 2:
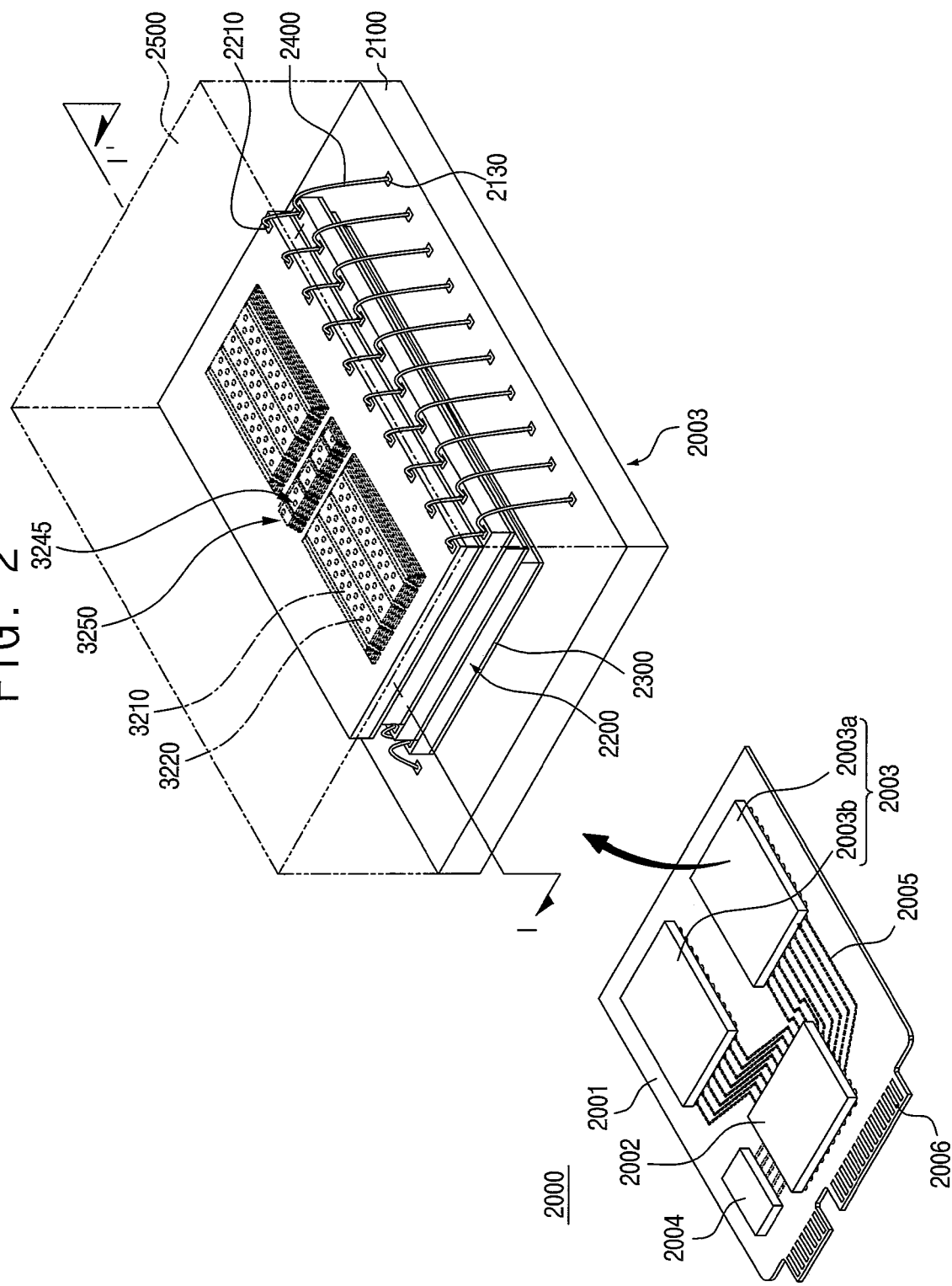
FIG. 2 is a schematic perspective view of an electronic system including a semiconductor device in accordance with example embodiments.

FIG. 2 is a schematic perspective view of an electronic system including a semiconductor device in accordance with example embodiments.

Referring to FIG. 2, an electronic system 2000 in accordance with example embodiments may include a main substrate 2001, a controller 2002 mounted on the main substrate 2001, one or more semiconductor packages 2003, and a dynamic random access memory (DRAM) 2004. The semiconductor package 2003 and the DRAM 2004 may be connected to the controller 2002 by wiring patterns 2005 formed on the main substrate 2001.

The main substrate 2001 may include a connector 2006 having a plurality of pins coupled to an external host. The number and arrangement of the plurality of pins in the connector 2006 may be controlled according to a communication interface between the electronic system 2000 and the external host. In example embodiments, the electronic system 2000 may be communicated with the external host by one of interfaces including a Universal Serial Bus (USB), a Peripheral Component Interconnect Express (PCI-Express), a Serial Advanced Technology Attachment (SATA), an M-Phy for Universal Flash Storage (UFS), etc. In example embodiments, the electronic system 2000 may be operated by power supplied from the external host through the connector 2006. The electronic system 2000 may further include a Power Management Integrated Circuit (PMIC) for distributing the power supplied from the external host to the controller 2002 and the semiconductor package 2003.

The controller 2002 may write data in the semiconductor package 2003, or the controller 2002 may read data from the semiconductor package 2003. An operation speed of the electronic system 2000 may be improved by the controller 2002.

The DRAM 2004 may be a buffer memory for reducing a difference between a speed of the semiconductor package 2003 for storing data and a speed of the external host. The DRAM 2004 included in the electronic system 2000 may also operate as a type of a cache memory, and the DRAM 2004 may provide a space for temporarily storing data in a control operation of the semiconductor package 2003. When the DRAM 2004 is included in the electronic system 2000, the controller 2002 may include a DRAM controller for controlling the DRAM 2004 and a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesion layers 2300 disposed on a lower surface of each of the semiconductor chips 2200, a connection structure 2400 electrically connected to the semiconductor chips 2200 and the package substrate 2100, and a molding layer 2500 on the package substrate 2100 to cover the semiconductor chips 2200 and the connection structure 2400.

The package substrate 2100 may be a printed circuit board including package upper pads 2130. Each of semiconductor chips 2200 may include an input/output pad 2210. The input/output pad 2210 may correspond to the input/output pad 1101 of FIG. 1. Each of the semiconductor chips 2200 may include cell stacked structures 3210 and channel structures 3220. Each of the semiconductor chips 2200 may include, e.g., one of the NAND flash memory devices illustrated with reference to FIGS. 6 to 39.

In example embodiments, the connection structure 2400 may be a bonding wire for electrically connecting with the input/output pad 2210 and the package upper pads 2130. Thus, in each of the first and second semiconductor packages 2003a and 2003b, the semiconductor chips 2200 may be electrically connected to each other by the bonding wire. The semiconductor chips 2200 may be electrically connected to the package upper pads 2130 on the package substrate 2100. For example, in each of the first and second semiconductor packages 2003a and 2003b, the semiconductor chips 2200 may be electrically connected to each other by the connection structures 2400 including through silicon vias (TSV) instead of the bonding wiring.

In example embodiments, the controller 2002 and the semiconductor chips 2200 may be included in one package. In some example embodiments, the controller 2002 and the semiconductor chips 2200 may be mounted on a separate interposer substrate different from the main substrate 2001, and the controller 2002 and the semiconductor chips 2220 may be connected to each other by wirings formed on the interposer substrate.

Figure 3:
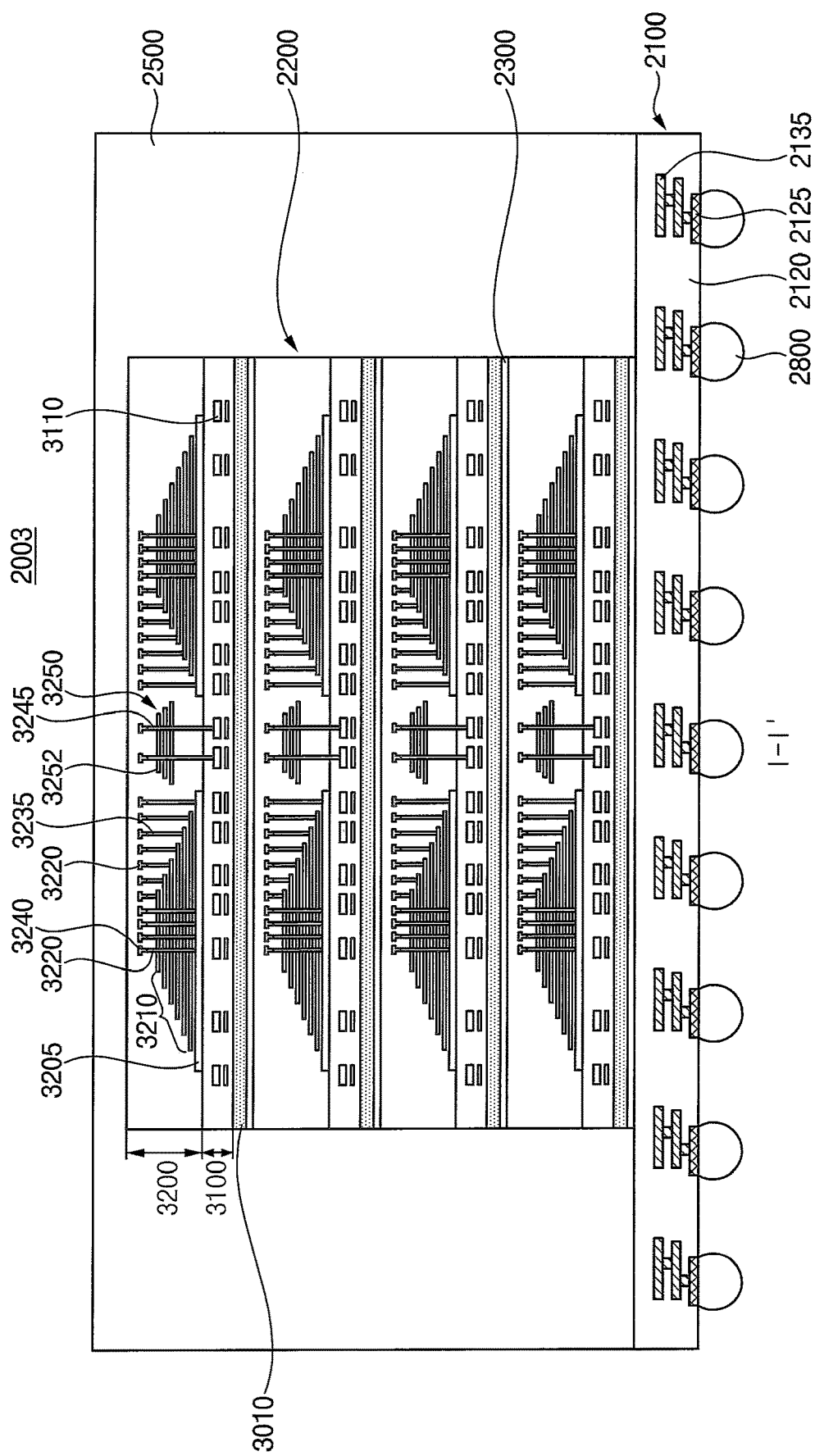
FIGS. 3 and 4 are cross-sectional views schematically illustrating semiconductor packages in accordance with example embodiments.
Figure 4:
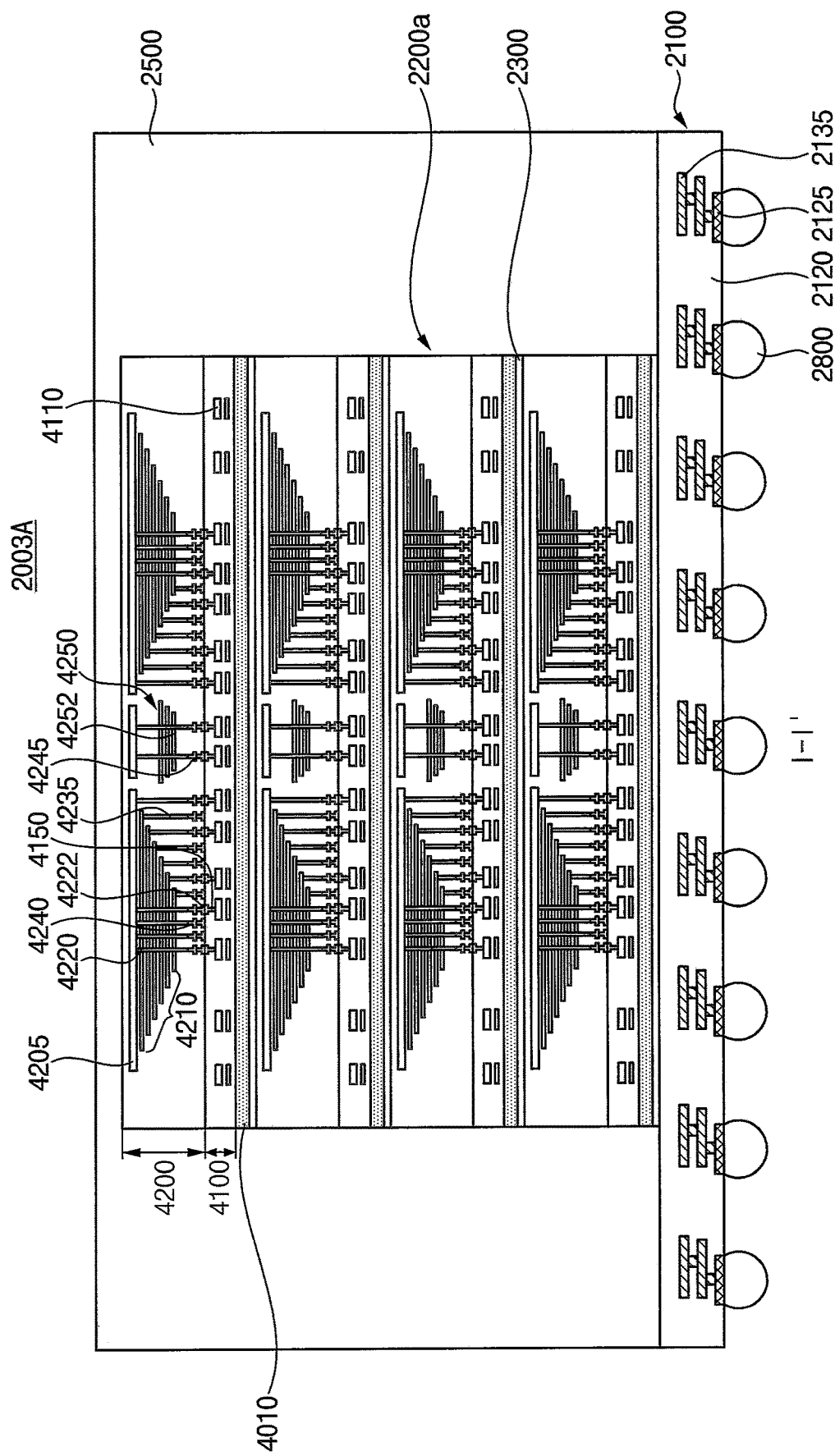

FIGS. 3 and 4 are cross-sectional views schematically illustrating semiconductor packages in accordance with example embodiments. Each of FIGS. 3 and 4 illustrates an example embodiment of the semiconductor package 2003 in FIG. 2. Each of FIGS. 3 and 4 conceptually show a portion along line I-I' in FIG. 2.

Referring to FIG. 3, in the semiconductor package 2003, the package substrate 2100 may be a printed circuit board. The package substrate 2100 may include a package substrate body part 2120, package upper pads (refer to FIG. 2, 2130) disposed on an upper surface of the package substrate body part 2120, lower pads 2125 disposed at a lower surface of the package substrate body part 2120 or exposed through the lower surface of the package substrate body part 2120, and internal wirings 2135 for electrically connecting with the upper pads 2130 and the lower pads 2125 in an inner portion of the package substrate body part 2120. The upper pads 2130 may be electrically connected to the connection structures 2400 (in FIG. 2). The lower pads 2125 may be connected to the wiring patterns 2005 of the main substrate 2001 in the electronic system 2000 in FIG. 2 through the conductive connection parts 2800.

Each of the semiconductor chips 2200 may include a semiconductor substrate 3010 and first and second structures 3100 and 3200 sequentially stacked on the semiconductor substrate 3010. The first structure 3100 may include a peripheral circuit region having peripheral wirings 3110. The second structure 3200 may include a common source line 3205, a cell stacked structure 3210 on the common source line 3205, channel structures 3220 and separation structures passing through the cell stacked structure 3210, bit lines 3240 electrically connected to the channel structures 3220, and gate connection wirings 3235 electrically connected to the word lines (WL in FIG. 1) in the cell stacked structure 3210.

Each of the semiconductor chips 2200 may include a through via contact 3245. The through via contact 3245 may extend into the second structure 3200, and may be electrically connected to the peripheral wirings 3110 in the first structure 3100.

A dummy structure 3250 may be spaced apart from the cell stacked structure 3210, and the dummy structure 3250 may be adjacent to the cell stacked structure 3210. The dummy structure 3250 may include conductive patterns 3252 including the same material as the gates in the cell stacked structure 3210. That is, the dummy structure 3250 may have a structure in which insulation layers and conductive patterns are alternately stacked.

Figure 7A:
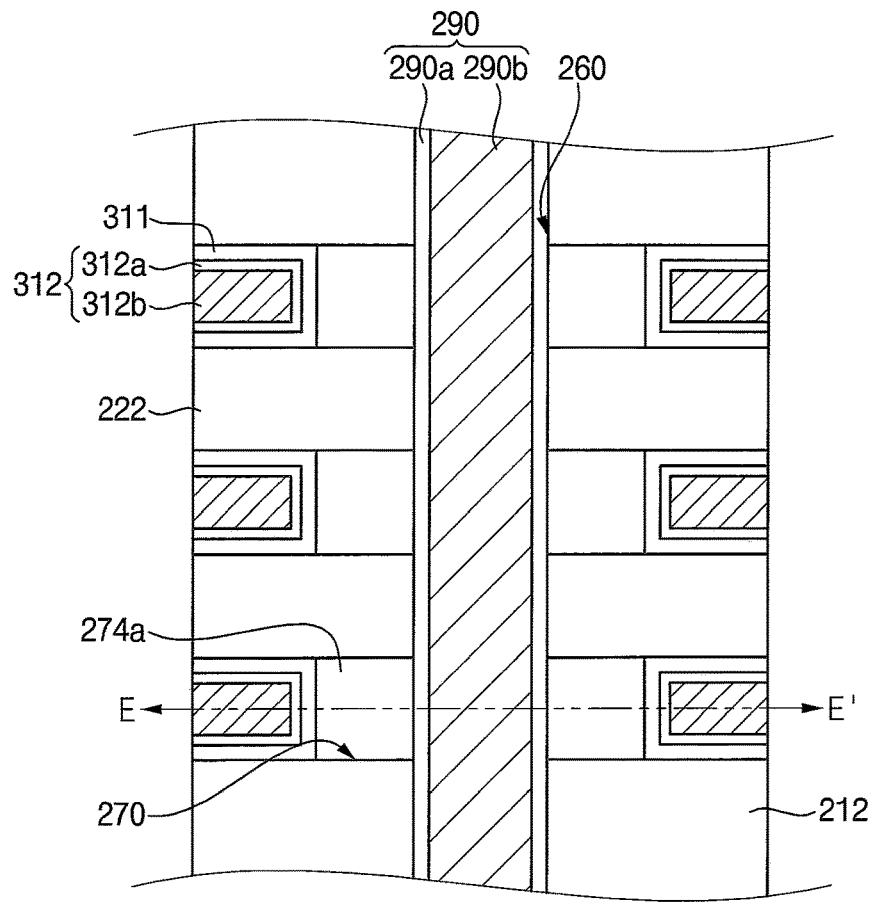
FIGS. 7A and 7B are enlarged cross-sectional views of a portion of a dummy structure in the NAND flash memory device.
Figure 7B:
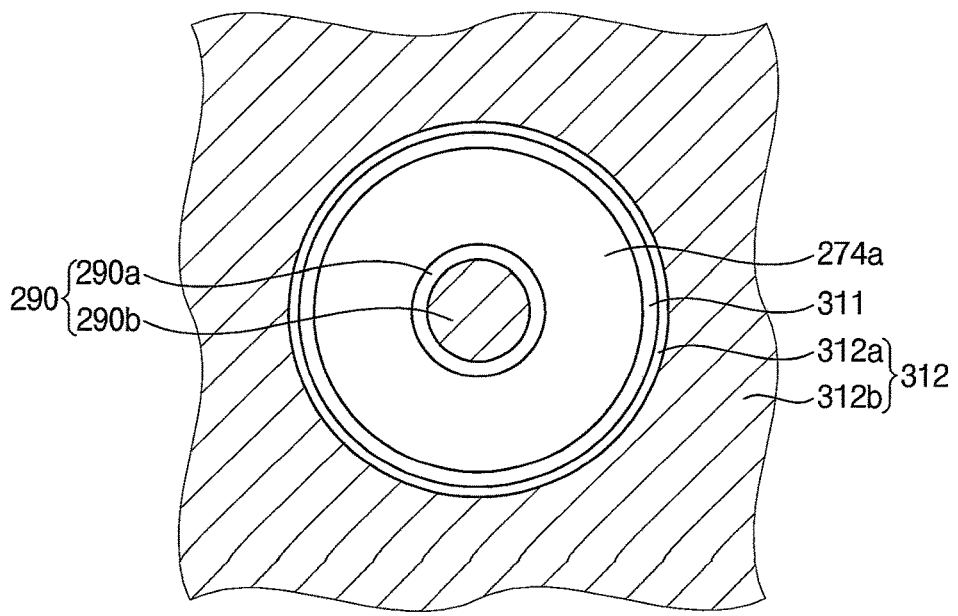

A portion of the dummy structure 3250 is shown enlarged in FIGS. 7A and 7B. The through via contact 3245 may pass through the dummy structure 3250, and may be electrically connected to the peripheral wirings 3110 of the first structure 3100. A capping insulation pattern (refer to FIG. 7A) may be formed between the through via contact 3245 and the conductive patterns 3252 of the dummy structure. In example embodiments, some of the through via contacts 3245 may pass through the cell stacked structure 3210.

Each of the semiconductor chips 2200 may further include an input/output connection wiring and an input/output pad 2210 (FIG. 2). The input/output connection wiring may be electrically connected to the peripheral wirings 3110 of the first structure 3100, and may extend into the second structure 3200. The input/output pad 2210 may be electrically connected to the input/output connection wiring. Some of the through via contacts 3245 may be disposed outside the cell stacked structure 3210. Some of the through via contacts 3245 may be further disposed to pass through the cell stacked structure 3210. Each of the semiconductor chips 2200 may further include an input/output pad (refer to FIG. 2, 2210) electrically connected to the peripheral wirings 3110 in the first structure 3100.

Referring to FIG. 4, in the semiconductor package 2003A, each of the semiconductor chips 2200a may include a semiconductor substrate 4010, a first structure 4100 on the semiconductor substrate 4010, and a second structure 4200 bonded on the first structure 4100. The second structure 4200 and the first structure 4100 may be bonded to each other by a wafer bonding process.

The first structure 4100 may include a peripheral circuit region in which a peripheral wiring 4110 and first bonding structures 4150 are formed. The second structure 4200 may include a common source line 4205, a cell stacked structure 4210 between the common source line 4205 and the first structure 4100, channel structures 4220 and a separation structure passing through the cell stacked structure 4210, and second bonding structures 4222 electrically connected to the word lines (WL in FIG. 1) of the cell stacked structure 4210 and the channel structures 4220. For example, the second bonding structures 4222 may be electrically connected to the channel structures 4220 and the word lines (WL in FIG. 1) through the bit lines electrically connected to the channel structures 4220 and the connection wirings 4235 electrically connected to the word lines WL.

Each of the semiconductor chips 2200a may include a through via contact 4245 electrically connected to the peripheral wirings 4110 in the first structure 4100 and extending into the second structure 3200.

A dummy structure 4250 may be spaced apart from the cell stacked structure 4210, and the dummy structure 4250 may be adjacent to the cell stacked structure 4210. The dummy structure 4250 may include conductive patterns 4252 including the same material as the gates included in the cell stacked structure 4210. A portion of the dummy structure is enlarged in FIGS. 7A and 7B.

The through via contact 4245 may pass through the dummy structure 4250, and may be electrically connected to the peripheral wirings 4110 in the first structure 4100. A capping insulation pattern (refer to FIG. 7A) may be formed between the through via contact 4245 and the conductive patterns of the dummy structure 4250. Some of the through via contacts 4245 may pass through the cell stacked structure 4210.

The first bonding structures 4150 of the first structure 4100 and the second bonding structures 4222 of the second structure 4200 may be bonded to each other. A contacting portion between the first bonding structure 4150 and the second bonding structure 4222 may be formed of, e.g., copper (Cu).

Each of the semiconductor chips 2200a may further include an input/output pad (2210 in FIG. 2) electrically connected to the peripheral wirings 4110 of the first structure 4100.

The semiconductor chips 2200 shown in FIG. 3 and the semiconductor chips 2200a shown in FIG. 4 may be electrically connected to each other by the connection structures 2400 having a wire bonding type. In some example embodiments, the semiconductor chips in one semiconductor package, e.g., the semiconductor chips 2200 shown in FIG. 3 and the semiconductor chips 2200a shown in FIG. 4, may be electrically connected to each other by the connection structures 2400 including the through silicon vias.

Figure 5:
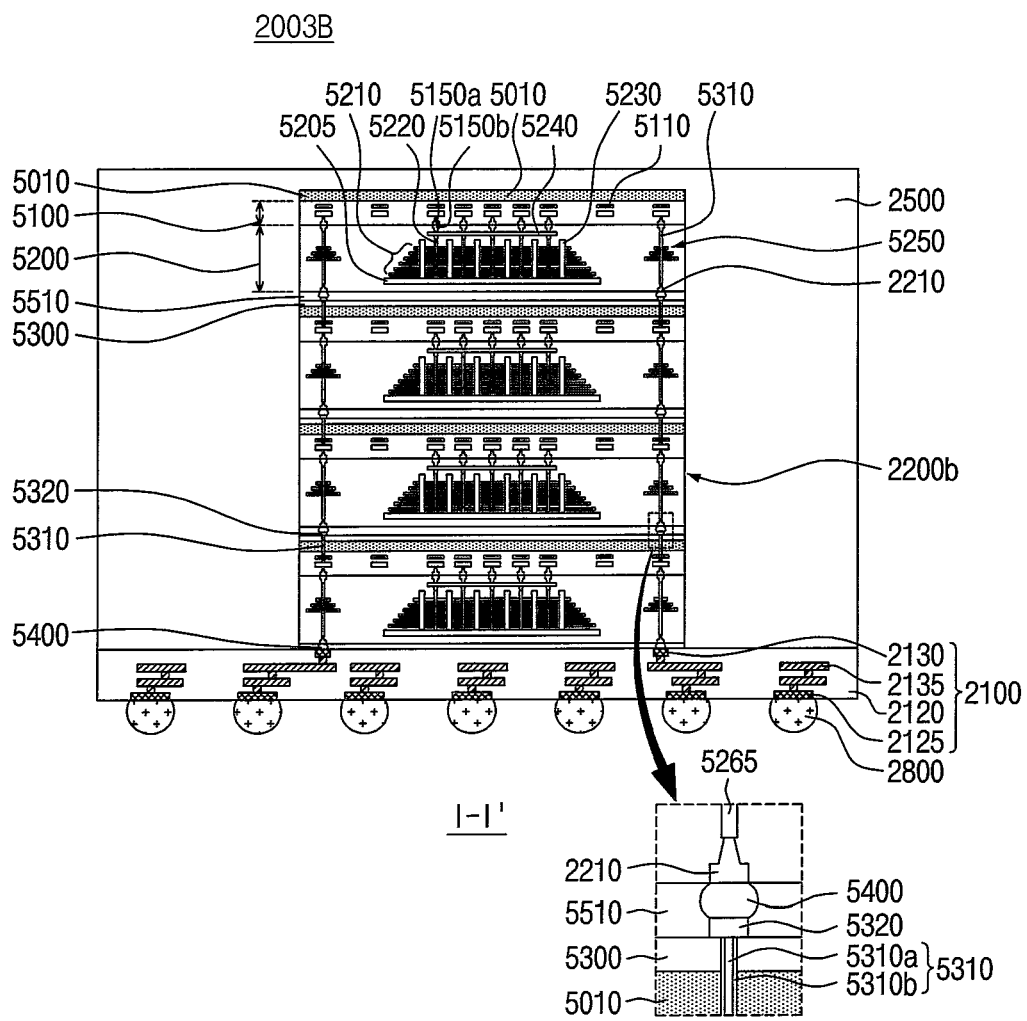
FIG. 5 is a schematic cross-sectional view of a semiconductor package in accordance with example embodiments.

FIG. 5 is a schematic cross-sectional view of a semiconductor package in accordance with example embodiments. FIG. 5 illustrates an example embodiment of the semiconductor package in FIG. 2 along line I-I' in FIG. 2.

Referring to FIG. 5, in the second semiconductor package 2003B, a plurality of semiconductor chips 2200b may be vertically aligned with each other. Each of the semiconductor chips 2200b may include a semiconductor substrate 5010, a first structure 5100 formed under the semiconductor substrate 5010, a second structure 5200 formed under the first structure 5100. The first structure 5100 and the second structure 5200 may be bonded to each other by a wafer bonding process.

The first structure 5100 may include a peripheral circuit region in which a peripheral wiring 5110 and first bonding structures 5150a are formed. The second structure 5200 may include a common source line 5205, a cell stacked structure 5210 between the common source line 5205 and the first structure 5100, memory channel structures 5220 and the separation structures 5230 passing through the cell stacked structure 5210, and second bonding structures 5150b electrically connected to the word lines (WL in FIG. 1) of the cell stacked structure 5210 and the memory channel structures 5220. For example, the second bonding structures 5150b may be electrically connected to the memory channel structures 5220 and the word lines (WL in FIG. 1) through bit lines 5240 electrically connected to the memory channel structures 5220 and gate connection wirings (3235 in FIG. 3) electrically connected to the word lines (WL in FIG. 1). The first bonding structures 5150a of the first structure 5100 and the second bonding structures 5150b of the second structure 5200 may be bonded to each other. A bonding portion between the first bonding structures 5150a and the second bonding structures 5150b may be formed of, e.g., copper (Cu).

A dummy structure 5250 may be spaced apart from the cell stacked structure 5210, and the dummy structure 5250 may be adjacent to the cell stacked structure 5210. The dummy structure 5250 may include conductive patterns including a same material as a material of the gates included in the cell stacked structure 5210. An enlarged portion of the dummy structure is shown in FIGS. 7A and 7B.

The semiconductor chips 2200b, except for an uppermost semiconductor chip, may further include a backside of insulation layer 5300 on the semiconductor substrate 5010, a backside of input/output pads 5320 on the backside of insulation layer 5300, and through via contacts 5310 passing through the semiconductor substrate 5010 and the backside of insulation layer 5300. The through via contacts 5310 may be electrically connected to the peripheral wirings 5110 of the first structure 5100 and the backside of input/output pads 5320. Some of the through via contacts 5310 may pass through the cell stacked structure 5210.

Each of the through via contacts 5310 may include a through electrode 5310a and an insulation spacer 5310b surrounding a sidewall of the through electrode 5310a. The second semiconductor package 2003B may further include connection structures 5400 disposed under each of the semiconductor chips 2200b. The connection structures 5400 may include, e.g., conductive bumps. The connection structures 5400 may be electrically connected to the semiconductor chips 2200b. Thus, the connection structures 5400 may be electrically connected to the semiconductor chips 2200b and the package substrate 2100. An underfill material layer 5510 may surround a sidewall of the conductive bump.

Hereinafter, a NAND flash memory device included in the semiconductor system or the semiconductor package will be described.

Figure 6:
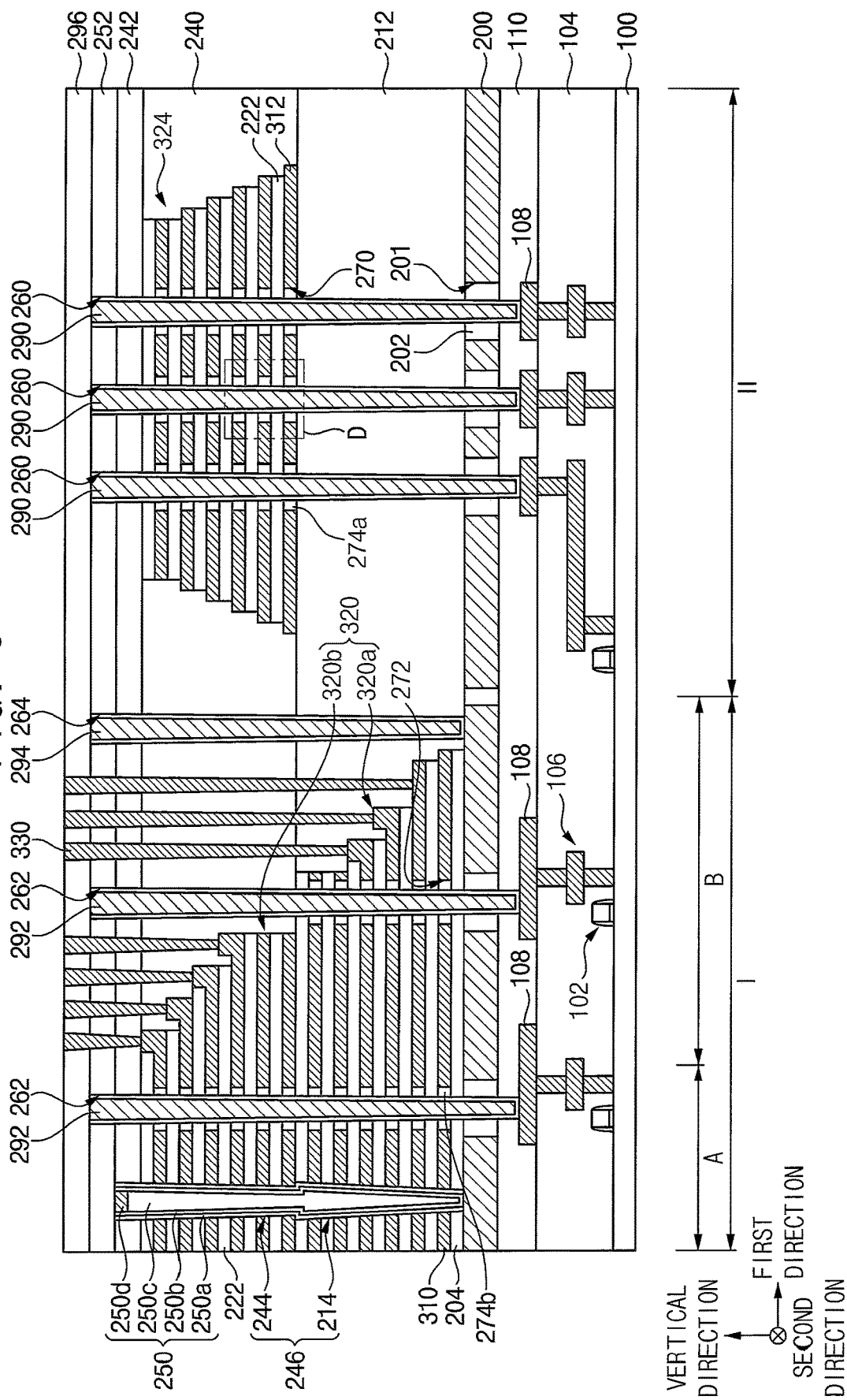
FIG. 6 is a cross-sectional view illustrating a NAND flash memory device in accordance with example embodiments.

FIG. 6 is a cross-sectional view illustrating a NAND flash memory device in accordance with example embodiments. FIGS. 7A and 7B are enlarged cross-sectional views of a portion of a dummy structure in the NAND flash memory device. FIG. 8 is a plan view illustrating the NAND flash memory device in accordance with example embodiments. In detail, FIG. 6 is a cross-sectional view along line of C-C' in FIG. 8, FIG. 7A is an enlarged view of portion D of FIG. 6, and FIG. 7B is a cross-sectional view along line of E-E' in FIG. 7A.

Referring to FIGS. 6 to 8, the NAND flash memory device may include circuit patterns constituting a peripheral circuit on a substrate 100. In example embodiments, the circuit pattern may include lower transistors 102 and a lower wiring 106. The lower wiring 106 may include lower contact plugs and lower conductive patterns. The lower wiring 106 may be electrically connected to the lower transistors 102.

The substrate 100 may include a single crystal semiconductor material. For example, the substrate 100 may include silicon, germanium, and silicon-germanium. The substrate 100 may include a first region I, in which a cell stacked structure 320 is formed, and a second region II disposed adjacent to the cell stacked structure 320. The first region I may include a cell region A for forming memory cells and a pad region B for forming wiring connected to the memory cells.

A first lower insulating interlayer 104 covering the circuit patterns may be formed on the substrate 100. A lower pad pattern 108 may be formed on the first lower insulating interlayer 104, and a second lower insulating interlayer 110 may be formed on the first lower insulating interlayer 104 and the lower pad pattern 108. An upper surface of the second lower insulating interlayer 110 may be substantially flat. In example embodiments, the lower pad pattern 108 may be electrically connected to the lower transistors 102 through the lower contact plug and the lower conductive patterns.

Base semiconductor patterns 200 may be formed on the second lower insulating interlayer 110. The base semiconductor pattern 200 may include, e.g., polysilicon. For example, the polysilicon may be doped with n-type impurities. A first opening 201 may be formed between the base semiconductor patterns 200. A lower filling pattern 202 may be formed in the first opening 201. The lower filling pattern 202 may include, e.g., silicon oxide.

In example embodiments, the base semiconductor pattern 200 may be disposed in the first and second regions I and II of the substrate 100. The first opening 201 may vertically face a portion for forming the through via contact. That is, the base semiconductor pattern 200 may not be formed around, e.g., to vertically overlap, the portion for forming the through via contact.

The cell stacked structure 320 may be formed on the base semiconductor pattern 200 and the lower filling pattern 202 in the first region I. A dummy structure 324 may be formed on the base semiconductor pattern 200 and the lower filling pattern 202 in the second region II. It is noted that while the dummy structure 324 may have a structure with a shape identical or similar to that of cell stacked structure 320, the dummy structure 324 may not be electrically connected to any circuitry or may not perform any specific electrical functions.

In example embodiments, the cell stacked structure 320 may include a first cell stacked structure 320a and a second cell stacked structure 320b stacked in the vertical direction. In example embodiments, the dummy structure 324 may be only at a same vertical level as the vertical level of the second cell stacked structure 320b in a horizontal direction, e.g., the dummy structure 324 may not overlap the first cell stacked structure 320a along the horizontal direction.

The cell stacked structure 320 may have a structure in which insulation layers 204 and 222 and gate patterns 310 are alternately and repeatedly stacked. The cell stacked structure 320 may extend in the first direction. Edge portions in the first direction of the cell stacked structure 320 may have a step shape, e.g., a step shape profile. That is, the cell stacked structure 320 disposed on the pad region B may have a step shape. In example embodiments, the cell stacked structure 320 disposed on the pad region B may have a step shape in each of the first direction and the second direction. Hereinafter, the step is defined as an exposed portion not covered by an upper layer in the cell stacked structure.

In example embodiments, a plurality of cell stacked structures 320 may be spaced apart in the second direction. A trench 300 extending in the first direction may be formed between the cell stacked structures 320.

In example embodiments, in the cell stacked structure 320, a step portion of the gate pattern 310 (that is, an end portion in the first direction of the gate pattern) may have a height higher than a height of the other portion of the gate pattern 310, e.g., along the vertical direction. Further, the step portion of the gate pattern 310 may have a thickness greater than a thickness of the other portion of the gate pattern 310.

The insulation layers 204 and 222 may include, e.g., silicon oxide. Each of the gate patterns 310 may include a barrier metal pattern and a metal pattern. The barrier metal pattern may surround a surface of the metal pattern. The barrier metal pattern may include, e.g., titanium, titanium nitride, tantalum, tantalum nitride, or the like. The metal pattern may include, e.g., tungsten, copper, or aluminum. For example, the metal pattern may include tungsten. In some example embodiments, a second blocking layer may be further formed on the surface of the gate pattern 310, and the second blocking layer may contact a first blocking layer of a channel structure subsequently described.

The dummy structure 324 may have a structure in which the insulation layers 222 and conductive patterns 312 are repeatedly and alternately stacked. The insulation layers 222 included in the cell stacked structure 320 and the dummy structure 324 may include the same material. Further, the gate patterns 310 included in the cell stacked structure 320 and the conductive patterns 312 included in the dummy structure 324 may include the same material. For example, each of the conductive patterns 312 may include a barrier metal pattern 312a and a metal pattern 312b. In some example embodiments, a second blocking layer 311 may be further formed on the surface of the conductive pattern 312.

In example embodiments, a plurality of dummy structures 324 may be spaced apart in the second direction. That is, the trench 300 extending in the first direction may be formed between adjacent ones of the dummy structures 324.

In example embodiments, the trench 300 may, e.g., continuously, extend from the first region I to the second region II. The cell stacked structure 320 and the dummy structure 324 may be arranged, e.g., adjacent to each other, in the first direction. Further, the cell stacked structure 320 and the dummy structure 324 may be arranged in the first direction at, e.g., along, sidewalls of one of the trenches 300. That is, neighboring cell stacked structures 320 in the second direction and neighboring dummy structures 324 in the second direction may be separated from each other by the trench 300. A separation layer pattern 328 may be formed in the trench 300.

In example embodiments, the gate patterns 310 of the cell stacked structure 320 may serve as gate patterns of a ground selection transistor, cell transistors, and cell selection transistors, respectively. The gate patterns of the cell transistors may serve as word lines. In some example embodiments, some of the gate patterns of the cell stacked structure 320 may serve as a GIDL transistor for erasing data.

A first lower insulation pattern 212 covering the step portion of the first cell stacked structure 320a may be formed on the base semiconductor pattern 200. The first lower insulation pattern 212 may include, e.g., silicon oxide. The dummy structure 324 may be formed on the first lower insulation pattern 212.

A second lower insulation pattern 240 may be formed on the first lower insulation pattern 212 to fill a portion between the second cell stacked structure 320b and the dummy structure 324. The second lower insulation pattern 240 may cover sidewalls of the second cell stacked structure 320b and the dummy structure 324. The second lower insulation pattern 240 may include, e.g., silicon oxide.

In example embodiments, each of the gate patterns 310 included in the second cell stacked structure 320b and each of the conductive patterns 312 included in the dummy structure 324 may be positioned at the same level in the vertical direction. For example, as illustrated in FIG. 6, each of the gate patterns 310 in the second cell stacked structure 320b may have a same thickness and a coplanar upper surface as those of a corresponding one of the conductive patterns 312 in the dummy structure 324.

A first insulating interlayer 242 may be formed to cover the first and second cell stacked structures 320a and 320b, the second lower insulation pattern 240, and the dummy structure 324. The first insulating interlayer 242 may include, e.g., silicon oxide.

Channel holes 246 may pass through the first insulating interlayer 242 and the cell stacked structure 320 to expose an upper surface of the base semiconductor pattern 200. A channel structure 250 may be formed in each of the channel holes 246.

The channel hole 246 may include a lower channel hole 214 and an upper channel hole 244 communicating, e.g., in fluid communication, with each other in the vertical direction. The lower channel hole 214 may pass through the first cell stacked structure 320a to expose the upper surface of the base semiconductor pattern 200. The upper channel hole 244 may be disposed on the lower channel hole 214, and may pass through the first insulating interlayer 242 and the second cell stacked structure 320b. Each of the lower channel hole 214 and the upper channel hole 244 may have a sidewall of an oblique slope. Thus, a lower diameter of each of the lower channel hole 214 and the upper channel hole 244 may be smaller than an upper diameter of each of the lower channel hole 214 and the upper channel hole 244. A boundary portion between the lower channel hole 214 and the upper channel hole 244 may have a bent portion.

The channel structure 250 may include a charge storage structure 250a, a channel 250b, a filling insulation pattern 250c, and a capping pattern 250d.

The charge storage structure 250a may contact a sidewall of the channel hole 246. The charge storage structure 250a may include a first blocking layer, a charge storage layer, and a tunnel insulation layer. The first blocking layer, the charge storage layer, and the tunnel insulation layer may be sequentially stacked from a sidewall of the channel hole 246. The channel 250b may contact the tunnel insulation layer. The channel 250b may be electrically connected to the base semiconductor pattern 200.

In example embodiments, the channel 250b may directly contact the base semiconductor pattern 200. A second insulating interlayer 252 may be formed on the channel structure 250 and the first insulating interlayer 142. The second insulating interlayer 252 may include, e.g., silicon oxide.

A first through hole 260 may pass through the first and second insulating interlayers 242 and 252, the dummy structure 324, the first lower insulation pattern 212, the lower filling pattern 202, and the second lower insulating interlayer 110 to expose the lower pad pattern 108.

Each of second through holes 262 may pass through the first and second insulating interlayers 242 and 252, the cell stacked structure 320, the lower filling pattern 202, and the second lower insulating interlayer 110 to expose the lower pad pattern 108. Some of the second through holes 262 may pass through the step portion of the cell stacked structure 320 in the pad region B. Some of the second through holes 262 may pass through the cell stacked structure 320 in the memory cell region A.

A contact hole 264 may pass through the first and second insulating interlayers 242 and 252, the second lower insulation pattern 240, and the first lower insulation pattern 212 to expose the upper surface of the base semiconductor pattern 200. The contact hole 264 may expose an edge portion of the base semiconductor pattern 200 in the first region I.

First gaps 270 may be communicated with, e.g., directly contact, a sidewall of the first through hole 260, and the first gaps 270 may surround, e.g., an entire perimeter of, the sidewall of the first through hole 260. The first gaps 270 may be disposed at a portion of each of the conductive patterns 312 in the dummy structure 324.

Second gaps 272 may be communicated with, e.g., directly contact, a sidewall of the second through hole 262, and the second gaps 272 may surround, e.g., an entire perimeter of, the sidewall of the second through hole 262. The second gaps 272 may be disposed at a portion of each of the gate patterns 310 in the cell stacked structure 320. Thus, a side of the gate pattern 310 may be exposed by the second gap 272.

First and second capping insulation patterns 274a and 274b may fill the first and second gaps 270 and 272, respectively. The first and second capping insulation patterns 274a and 274b may include, e.g., silicon oxide.

A first through via contact 290 may be formed in the first through hole 260. A second through via contact 292 may be formed in the second through hole 262. A contact plug 294 may be formed in the contact hole 264.

A sidewall of the first through via contact 290 may contact the first and second insulating interlayers 242 and 252, the second insulation layer 222 and the first capping insulation pattern 274a in the dummy structure 324, the first lower insulation pattern 212, the lower filling pattern 202, and the second lower insulating interlayer 110. That is, the sidewall of the first through via contact 290 may only contact insulation materials. Each of the first capping insulation patterns 274a in the dummy structure 324 may have a ring shape surrounding the, e.g., entire perimeter of, sidewall of the first through via contact 290. The first capping insulation patterns 274a may contact the conductive patterns 312, respectively. The first through via contact 290 may not directly contact the conductive patterns 312 in the dummy structure 324 by the first capping insulation patterns 274a. The first through via contact 290 and the conductive patterns 312 in the dummy structure 324 may be insulated from each other by the first capping insulation patterns 274a, e.g., the first capping insulation patterns 274a may completely separate between the first through via contact 290 and the conductive patterns 312 in the dummy structure 324.

A sidewall of the second through via contact 292 may contact the first and second insulating interlayers 242 and 252, the first and second insulation layers 204 and 222 in the cell stacked structure 320, the second capping insulation pattern 274b, the lower filling pattern 202, and the second lower insulating interlayer 110. That is, the sidewall of the second through via contact 292 may only contact insulation materials. Each of the second capping insulation patterns 274b in the cell stacked structure 320 may have a ring shape surrounding the sidewall of the second through via contact 292. The second capping insulation patterns 274b may contact the gate patterns 310, respectively. The second through via contact 292 may not directly contact the gate patterns 310 in the cell stacked structure 320 by the second capping insulation patterns 274b. The second through via contact 292 and the gate patterns 310 in the cell stacked structure 320 may be insulated from each other by the second capping insulation patterns 274b, e.g., the second capping insulation patterns 274b may completely separate between the second through via contact 292 and the gate patterns 310 in the cell stacked structure 320.

The contact plug 294 may pass through the first and second insulating interlayers 242 and 252, the second lower insulation pattern 240, and the first lower insulation pattern 212. The contact plug 294 may contact the upper surface of the base semiconductor pattern 200.

Each of the first and second through via contacts 290 and 292 and the contact plug 294 may include a barrier pattern 290a and a metal pattern 290b. The barrier pattern 290a may be conformally formed on a surface of the through hole, and the metal pattern 290b may be formed on the barrier pattern 290a to fill the through hole. The metal pattern may include, e.g., tungsten.

The first and second through via contacts 290 and 292 may pass through an inner portion of the first opening 201. In example embodiments, a plurality of the first through via contacts 290 and a plurality of the second through via contacts 292 may be formed in the first openings 201. In example embodiments, one of first through via contacts 290 may be formed in one of the first openings 201. In some example embodiments, a plurality of first through via contacts 290 may be formed in one of the first openings 201 to be spaced apart from each other.

A third insulating interlayer 296 may be formed on the second insulating interlayer 252, the first and second through via contacts 290 and 292, and the contact plug 294. Cell contact plugs 330 may pass through the third insulating interlayer 296, the second insulating interlayer 252, the first insulating interlayer 242, and the first and second lower insulation patterns 212 and 240. Upper wirings may be formed on the third insulating interlayer 296, and the upper wirings may be electrically connected to the cell contact plug 330 and the first and second through via contacts 290 and 292.

The cell contact plugs 330 may contact upper surfaces of edges of the gate patterns in the cell stacked structure 320, respectively. The cell contact plug 330 may contact the step portion of the gate pattern 310. As shown in FIG. 6, the step portion of the gate pattern 310 may have an upper surface higher than an upper surface of the other portion of the gate pattern 310, e.g., the gate pattern 310 may have a cross-section of a rotated L-shape to define the step portion at its edge with a upper surface higher than a remainder of the gate pattern 310. Further, the step portion of the gate pattern 310 may have a thickness greater than a thickness of the other portion of the gate pattern 310. Therefore, a punching defect of the cell contact plug 330, e.g., when a cell contact plug is excessively extended into a gate pattern under a pad portion of a target gate pattern, may be prevented or substantially decreased.

As described above, in the NAND flash memory device, the dummy structure 324 may be formed outside, e.g., at a periphery of, the cell stacked structure 320, and may be adjacent to the cell stacked structure 320. The dummy structure 324 may be spaced apart from an upper sidewall of the cell stacked structure 320 in a horizontal direction, e.g., in the first direction. As the dummy structure 324 is formed, dishing, e.g., excessive polishing, of an upper surface of the second lower insulation pattern 240 may be decreased.

The dummy structure 324 and the cell stacked structure 320 have the same stacked structure in which an insulation material and a conductive material are repeatedly stacked, e.g., to a same height relative to a bottom of the substrate 100, so that a level difference between upper surfaces of the dummy structure 324 and the cell stacked structure 320 may be decreased, e.g., may be negligible. Thus, a level difference between an upper surface of the second insulating interlayer 252 covering the dummy structure 324 and an upper surface of the second insulating interlayer 252 covering the cell stacked structure 320 may be decreased, e.g., there may be no level difference therebetween. That is, the upper surface of the second insulating interlayer 252 may be substantially flat. Therefore, reliability defects and process defects, e.g., caused by a potential level difference of the upper surface of the second insulating interlayer 252, may be decreased.

Figure 9A:
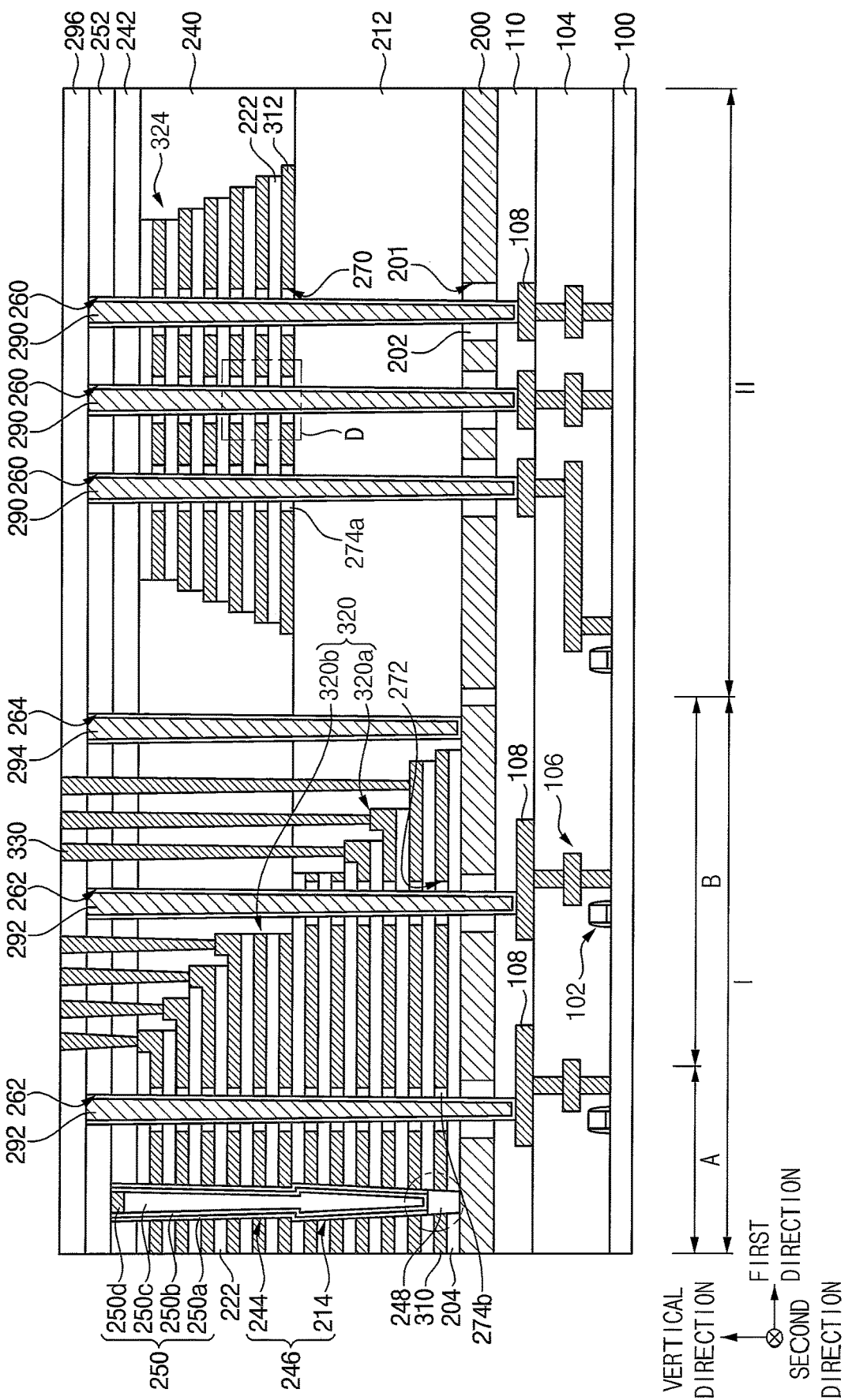
FIGS. 9A and 9B are cross-sectional views illustrating a NAND flash memory device in accordance with example embodiments.
Figure 9B:
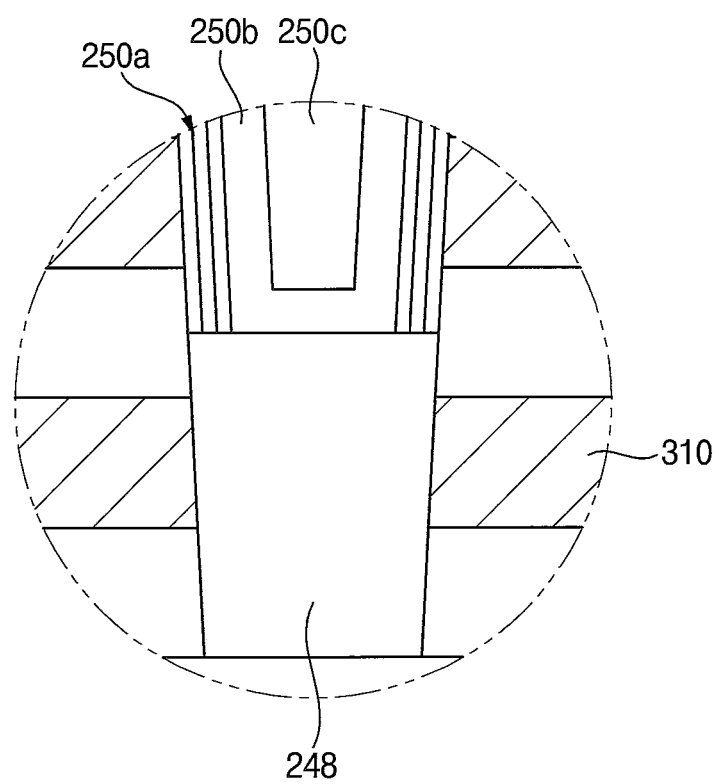
Figure 10A:
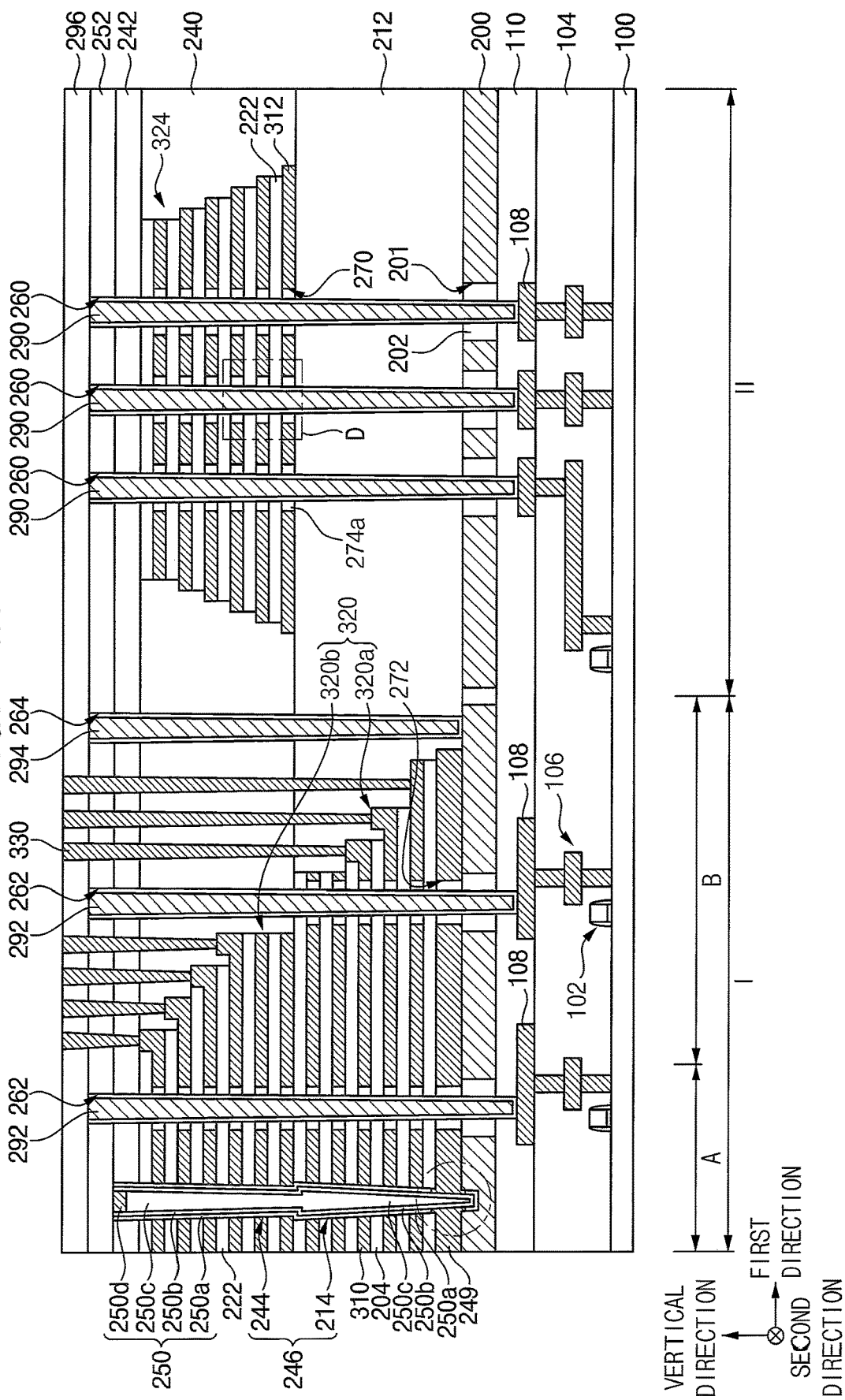
FIGS. 10A and 10B are cross-sectional views illustrating a NAND flash memory device in accordance with example embodiments.
Figure 10B:
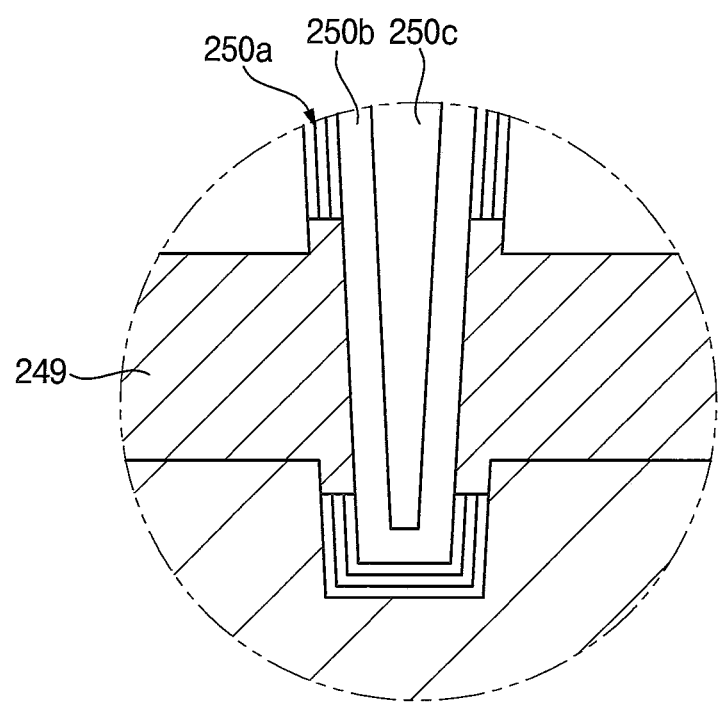

FIGS. 9A and 9B are cross-sectional views illustrating a NAND flash memory device in accordance with example embodiments. FIGS. 10A and 10B are cross-sectional views illustrating a NAND flash memory device in accordance with example embodiments. In detail, FIG. 9B is an enlarged view of a lower portion of a channel structure and a structure adjacent to the lower portion of the channel structure in the NAND flash memory device of FIG. 9A. FIG. 10B is an enlarged view of a lower portion of a channel structure and a structure adjacent to the lower portion of the channel structure in the NAND flash memory device of FIG. 10A.

Each of the NAND flash memory devices shown in FIGS. 9A and 10A may be substantially the same as the NAND flash memory device illustrated with reference to FIGS. 6 to 8, except for the lower portion of the channel structure and the structure adjacent to the lower portion of the channel structure. Therefore, the NAND flash memory device in FIGS. 9A to 10B is mainly described with reference to the lower portion of the channel structure and the structure adjacent to the lower portion of the channel structure.

Referring to FIGS. 9A and 9B, the channel holes 246 may pass through the first insulating interlayer 242 and the cell stacked structure 320 to expose an upper surface of the base semiconductor pattern 200. A semiconductor pattern 248 may be formed at a lower portion of the channel hole 246 (dashed circle in FIG. 9A).

In detail, the semiconductor pattern 248 may contact the base semiconductor pattern 200, so that the semiconductor pattern 248 may be electrically connected to the base semiconductor pattern 200. In example embodiments, the semiconductor pattern 248 may include, e.g., silicon. The semiconductor pattern 248 may be formed by, e.g., a selective epitaxial growth process.

In example embodiments, an upper surface of the semiconductor pattern 248 may be higher than an upper surface of a lowermost one of the gate patterns 310. For example, the upper surface of the semiconductor pattern 248 may be higher than the upper surface of the gate pattern of the ground selection transistor.

The channel structure 250 may be formed on the semiconductor pattern 248 to fill each of the channel holes 246. The channel structure 250 may include the charge storage structure 250a, the channel 250b, the filling insulation pattern 250c, and the capping pattern 250d.

The charge storage structure 250a may contact a sidewall of the channel hole 246. The charge storage structure 250a may include a first blocking layer, a charge storage layer, and a tunnel insulation layer. The first blocking layer, the charge storage layer, and the tunnel insulation layer may be sequentially stacked from the sidewall of the channel hole 246. The channel 250b may contact a surface of the tunnel insulation layer and an upper surface of the semiconductor pattern 248. Thus, the channel 250b may be electrically connected to the base semiconductor pattern 200.

Referring to FIGS. 10A and 10B, a channel connection pattern 249 may be further formed on the base semiconductor pattern 200. In example embodiments, the channel connection pattern 249 may include, e.g., polysilicon. A bottom of the channel connection pattern 249 may contact the base semiconductor pattern 200, so that the channel connection pattern 249 and the base semiconductor pattern 200 may be electrically connected to each other.

A sidewall of the channel 250b may contact the channel connection pattern 249. That is, a lower sidewall of the channel 250b facing the channel connection pattern 249 may contact the channel connection pattern 249. Thus, each of the tunnel insulation layer, the charge storage layer, and the first blocking layer may include a cutting portion, and the cutting portion may be positioned at a portion facing the channel connection pattern 249. The filling insulation pattern 250c may be formed on the channel 250b to fill the channel hole 246. The channel connection pattern 249 may be electrically connected to a lower portion of each of the channels 250b, so that the channel 250b may be electrically connected to the base semiconductor pattern 200.

FIGS. 11 to 28 are cross-sectional views and plan views of stages in a method of manufacturing a NAND flash memory device in accordance with example embodiments.

Figure 11:
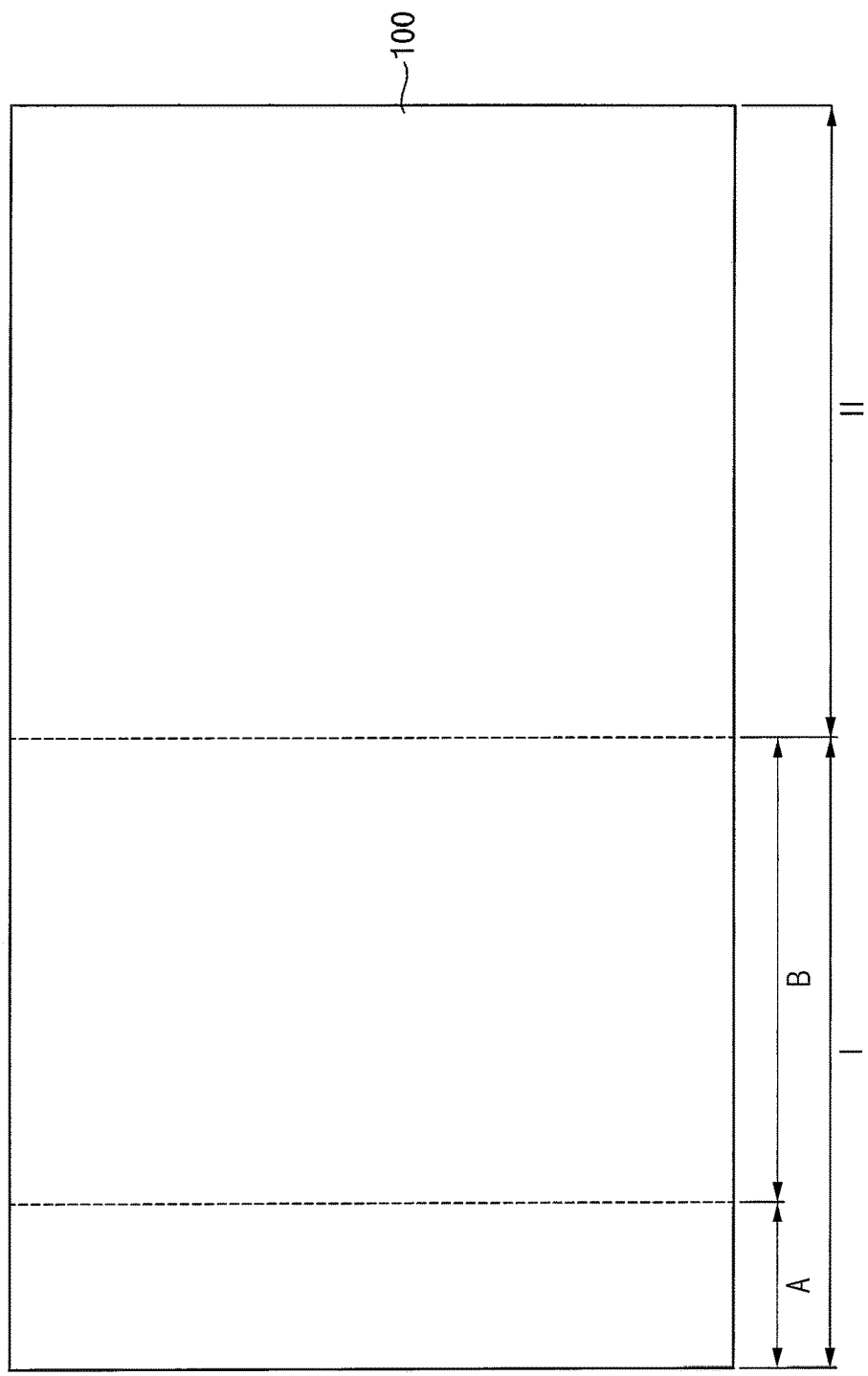
FIGS. 11 to 28 are cross-sectional views and plan views of stages in a method of manufacturing a NAND flash memory device in accordance with example embodiments.
Figure 12:
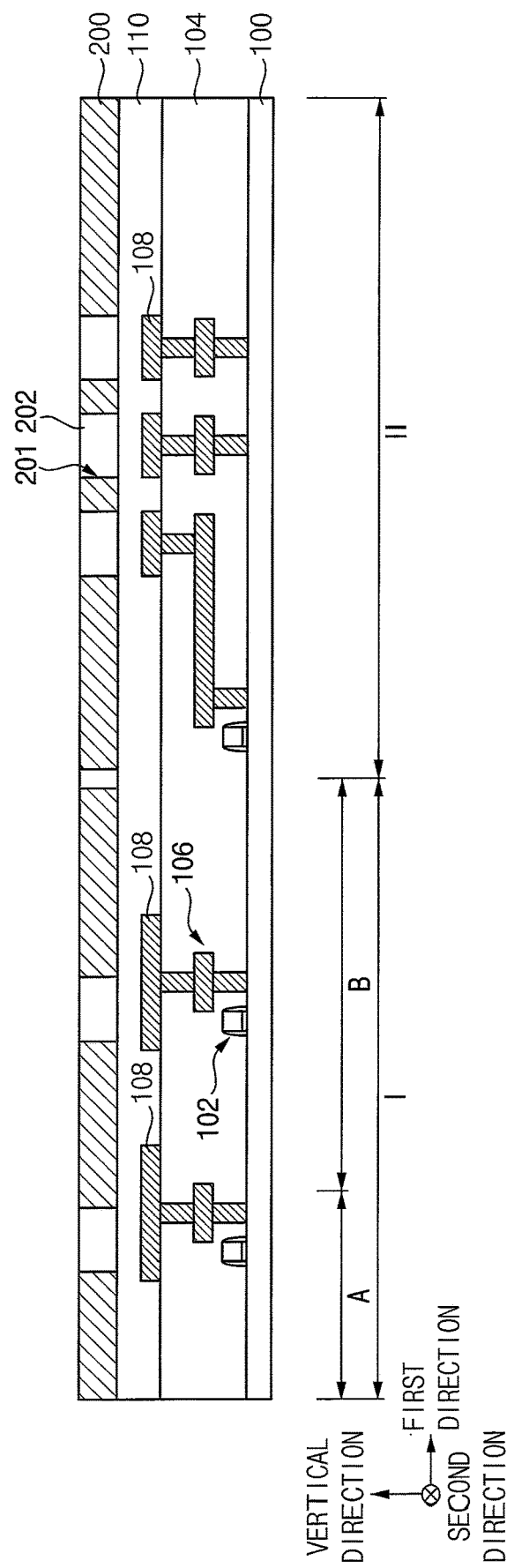

Referring to FIGS. 11 and 12, the lower transistors 102 and the lower wiring 106 constituting a peripheral circuit may be formed on the substrate 100. The first lower insulating interlayer 104 may be formed to cover the lower transistors 102 and the lower wiring 106. The substrate 100 may include the first region I for forming the cell stacked structure, and the second region II adjacent to the cell stacked structure.

The lower pad pattern 108 may be formed on the first lower insulating interlayer 104. The second lower insulating interlayer 110 may be formed on the first lower insulating interlayer 104 and the lower pad pattern 108.

A base semiconductor layer may be formed on the second lower insulating interlayer 110, and the base semiconductor layer may be patterned to form the base semiconductor patterns 200. The first opening 201 may be formed between the base semiconductor patterns 200. In example embodiments, the first opening 201 may be formed at a portion for forming the through via contact and around the portion for forming the through via contact. That is, the first opening 201 may be disposed to face the portion for forming the through via contact.

A lower insulation layer may be formed on the base semiconductor pattern 200 to fill the first opening 201. The lower insulation layer may include, e.g., silicon oxide. The lower insulation layer may be planarized until an upper surface of the base semiconductor pattern 200 may be exposed to form the lower filling pattern 202 in the first opening 201. The planarization process may include, e.g., a chemical mechanical polishing (CMP) process.

Figure 13:
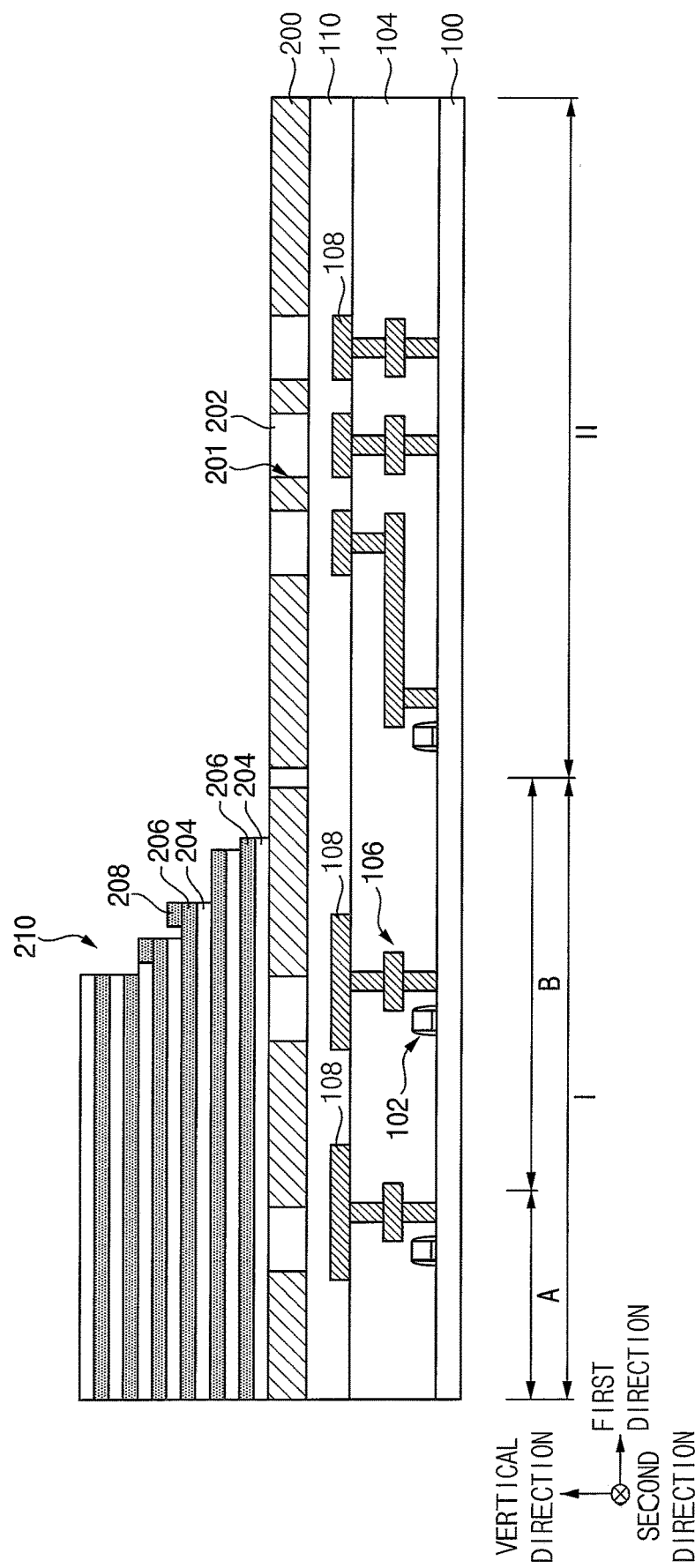

Referring to FIG. 13, first insulation layers 204 and first sacrificial layers 206 may be alternately and repeatedly stacked on the base semiconductor pattern 200 and the lower filling pattern 202. In this case, one of the first insulation layers may be disposed at an uppermost portion of a stacked structure. The first insulation layer 204 may include, e.g., silicon oxide. The first sacrificial layer 206 may include a material having an etching selectivity with respect to the first insulation layer 204. The first sacrificial layer 206 may include a nitride, e.g., silicon nitride.

The first sacrificial layer 206 may serve as a sacrificial layer for forming one of the gates of a ground select transistor and cell transistors positioned at a lower portion of the cell stacked structure in the NAND flash memory device. The first sacrificial layers 206 and the first insulation layers 204 may be patterned to form a first preliminary cell mold structure 210 in the first region I. The first sacrificial layers 206 and the first insulation layers 204 in second region II may be removed by the patterning process. Thus, the base semiconductor pattern 200 and the lower filling pattern 202 may be exposed on the second region II. An edge portion of the first preliminary cell mold structure 210 may have a step shape. The steps of the first preliminary cell mold structure 210 may be formed in the first direction. In some example embodiments, the steps of the first preliminary cell mold structure 210 may be formed in each of the first and second directions.

Particularly, a photoresist pattern may be formed on an uppermost of the first insulation layers 204. The first insulation layer 204 and the first sacrificial layer 206 may be etched using the photoresist pattern as an etching mask. Thereafter, a trimming process for removing an edge portion of the photoresist pattern may be performed, and then the first insulation layer 204 and the first sacrificial layer 206 may be etched using the trimmed photoresist pattern. By repeatedly performing the trimming process and the etching process, a first preliminary cell mold structure 210 having the step shape may be formed in the first region I.

In example embodiments, insulation pad patterns 208 may be further selectively formed on upper surfaces of end portions in the first direction of the first sacrificial layers 206, respectively. A material of the first sacrificial layer 206 may be substantially the same as a material of the insulation pad pattern 208. Thus, a portion in which the first sacrificial layer 206 and the insulation pad pattern 208 are stacked may have a thickness greater than a thickness of a portion in which only the first sacrificial layer 206 is formed. In order to avoid a complexity of the drawing, the insulation pad patterns 208 formed only on two the first sacrificial layers 206 may be illustrated. The insulation pad patterns 208 may be formed on end portions in the first direction of all the first sacrificial layers 206, respectively.

In some example embodiments, the insulation pad pattern 208 may not be formed on the end portions in the first direction of the first sacrificial layers 206. In this case, a thickness of the end portion of the first sacrificial layer 206 may be substantially the same as a thickness of the other portion of the first sacrificial layer 206, e.g., the thickness of the first sacrificial layer 206 may be uniform along its entire length.

Figure 14:
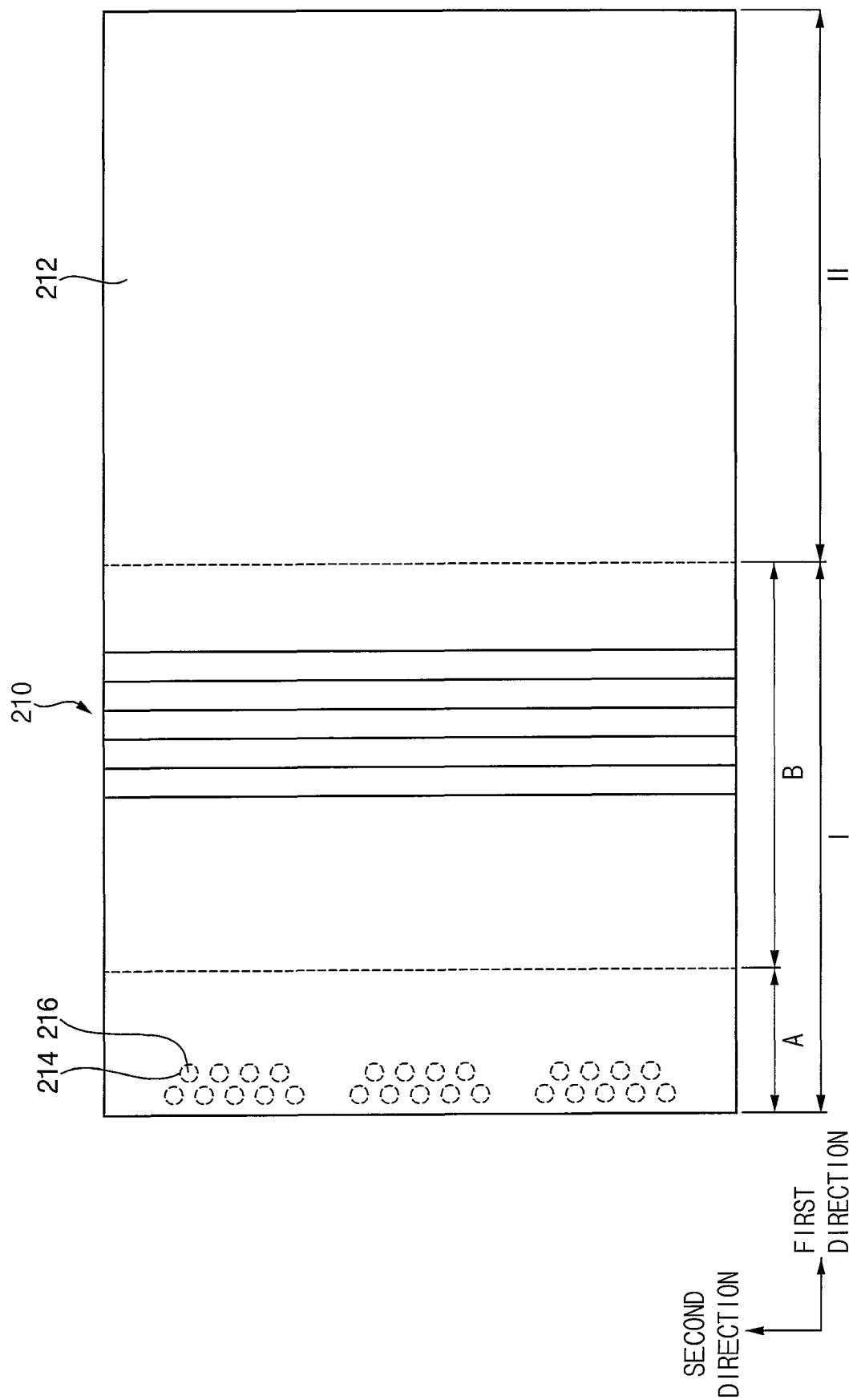
Figure 15:
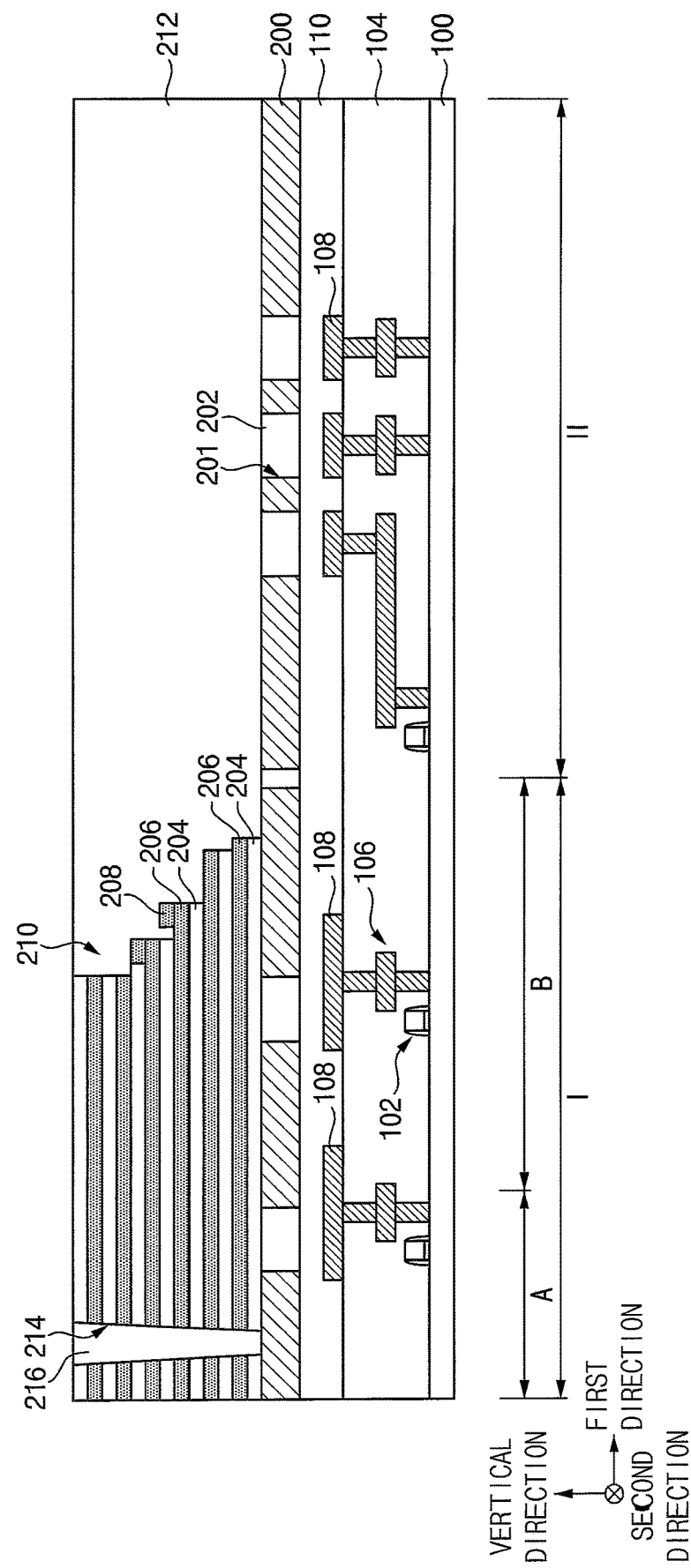

Referring to FIGS. 14 and 15, an insulation layer may be formed to cover the first preliminary cell mold structure 210, the base semiconductor pattern 200, and the lower filling pattern 202. The lowest portion of an upper surface of the insulation layer may be higher than an upper surface of the first preliminary cell mold structure 210. That is, the upper surface of the insulation layer formed on the base semiconductor pattern 200 and the lower filling pattern 202 may be higher than the upper surface of the first preliminary cell mold structure 210.

Thereafter, an upper portion of the insulation layer may be planarized by a planarization process to form the first lower insulation pattern 212. The planarization process may include a chemical mechanical polishing (CMP) process. Thus, upper surfaces of the first preliminary cell mold structure 210 and the first lower insulation pattern 212 may be substantially flat. The upper surfaces of the first preliminary cell mold structure 210 and the first lower insulation pattern 212 may be coplanar with each other.

The first preliminary cell mold structure 210 may be etched by a photolithography process to form the lower channel hole 214 exposing the upper surface of the base semiconductor pattern 200 in the cell region A. A filling sacrificial layer 216 may be formed to fill the lower channel hole 214. The filling sacrificial layer 216 may include, e.g., silicon oxide or polysilicon. As shown in FIG. 14, a plurality of lower channel holes 214 may be regularly arranged.

Figure 16:
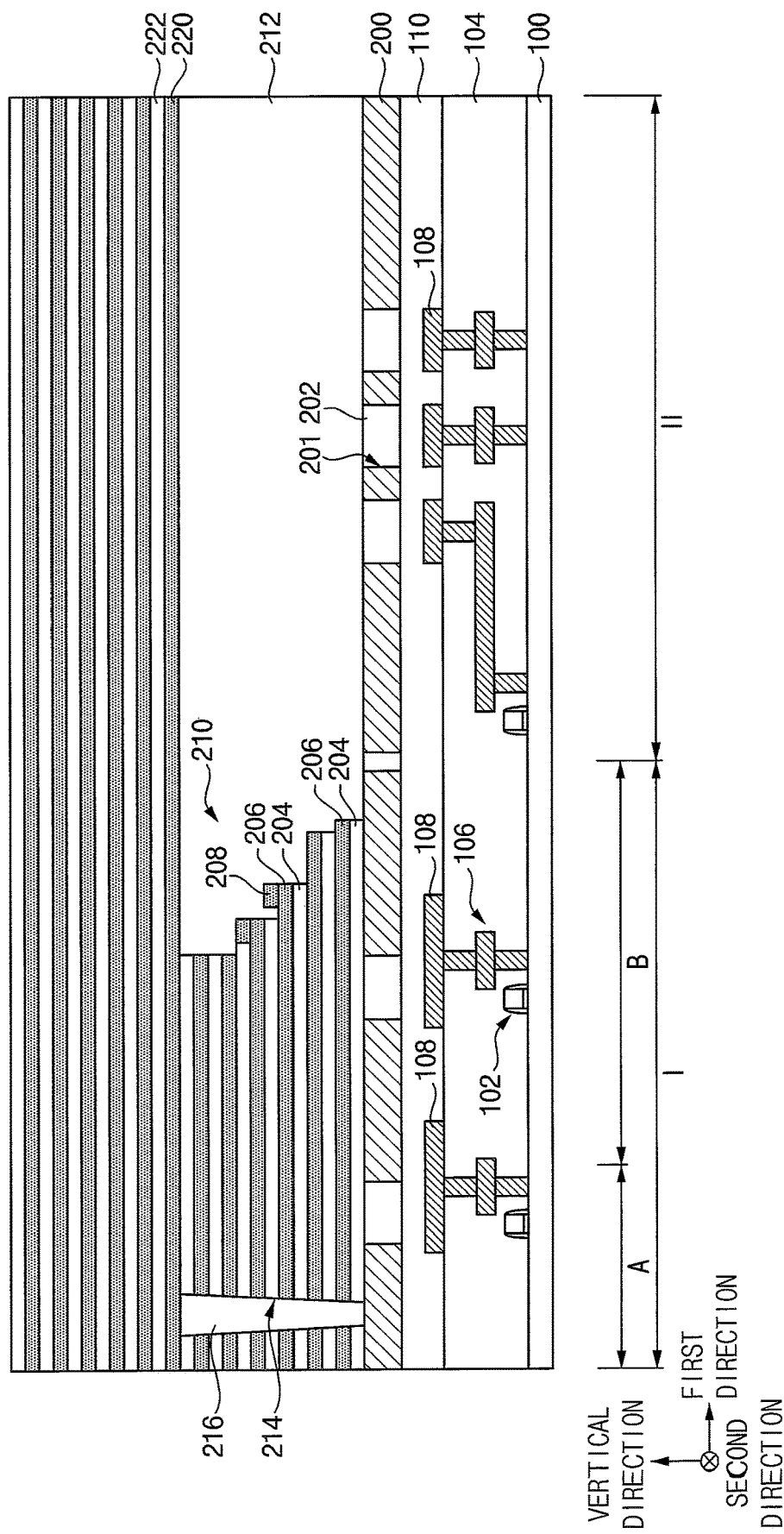

Referring to FIG. 16, second sacrificial layers 220 and second insulation layers 222 may be alternately and repeatedly stacked on the first preliminary cell mold structure 210, the filling sacrificial layer 216, and the first lower insulation pattern 212. For example, as illustrated in FIG. 16, the structure of alternating second sacrificial layers 220 and second insulation layers 222 may extend along an entire length of the substrate 100, e.g., in the first and second direction. In example embodiments, one of the second insulation layers 222 may be formed at an uppermost portion of the stacked structure including the second sacrificial layers 220 and the second insulation layers 222. The second sacrificial layer 220 may serve as a sacrificial layer for forming one of gates of cell transistors and a string select transistor.

Figure 17:
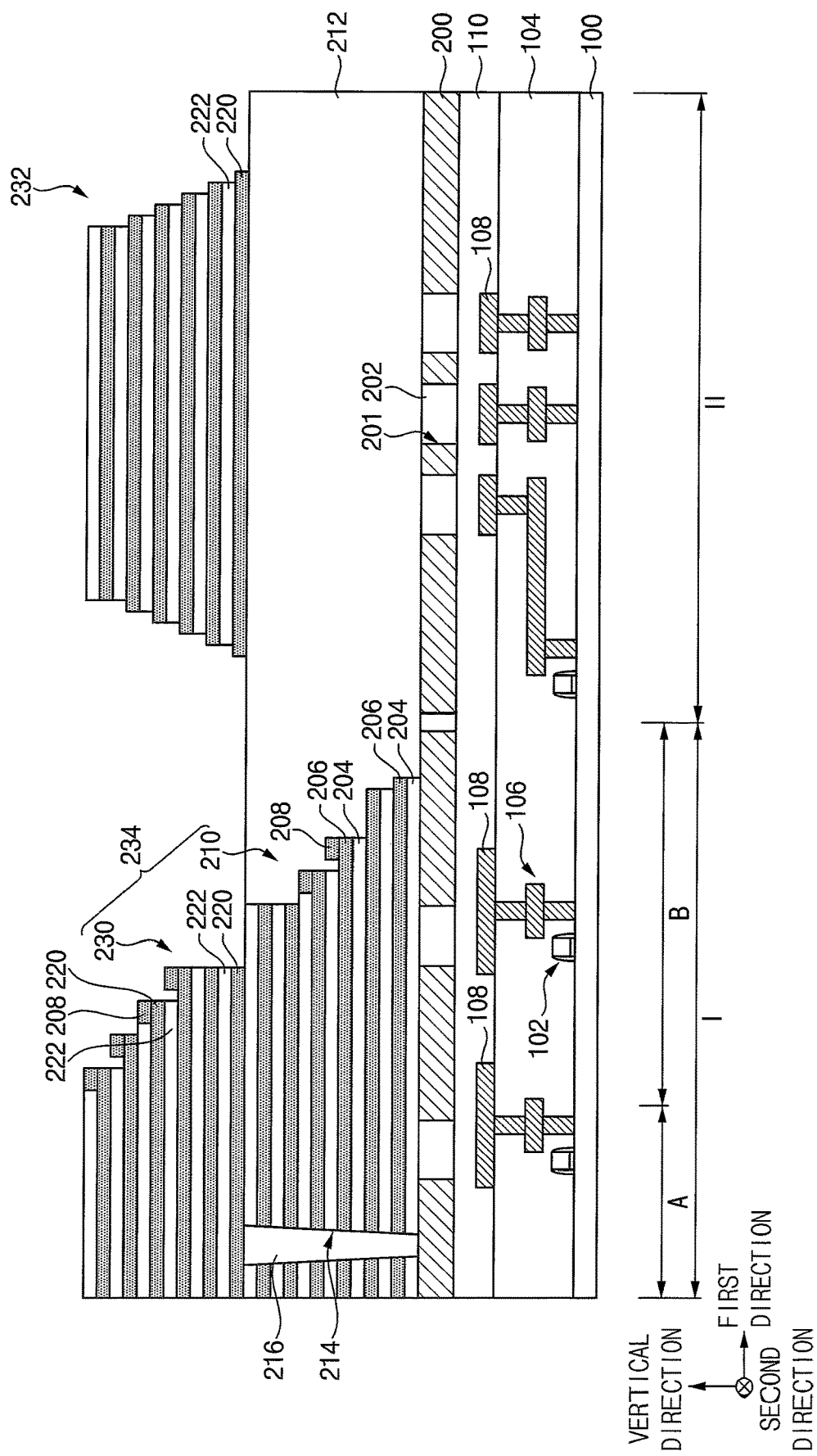

Referring to FIG. 17, the second sacrificial layers 220 and the second insulation layers 222 may be patterned to form a second preliminary cell mold structure 230 on the first preliminary cell mold structure 210, i.e., in the first region I, and a preliminary dummy mold structure 232 on the first lower insulation pattern 212, i.e., in the second region II. An edge portion in the first direction of the second preliminary cell mold structure 230 may have a step shape connected from the step portion of the first preliminary cell mold structure 210. In example embodiments, an edge portion in the first direction of the preliminary dummy mold structure 232 may have a step shape.

In example embodiments, as shown in FIG. 17, the insulation pad patterns 208 may be selectively formed on the upper surfaces of the end portions in the first direction of the second sacrificial layers 220, respectively. In order to avoid a complexity of the drawing, the insulation pad patterns 208 formed only on two of the second sacrificial layers 220 are illustrated. The insulation pad patterns 208 may be formed on end portions in the first direction of all the second sacrificial layers 220, respectively.

Therefore, a preliminary cell mold structure 234 in which the first preliminary cell mold structure 210 and the second preliminary cell mold structure 230 are stacked may be formed in the first region I. An edge portion in the first direction of the preliminary cell mold structure 234 may have a step shape.

Figure 18:
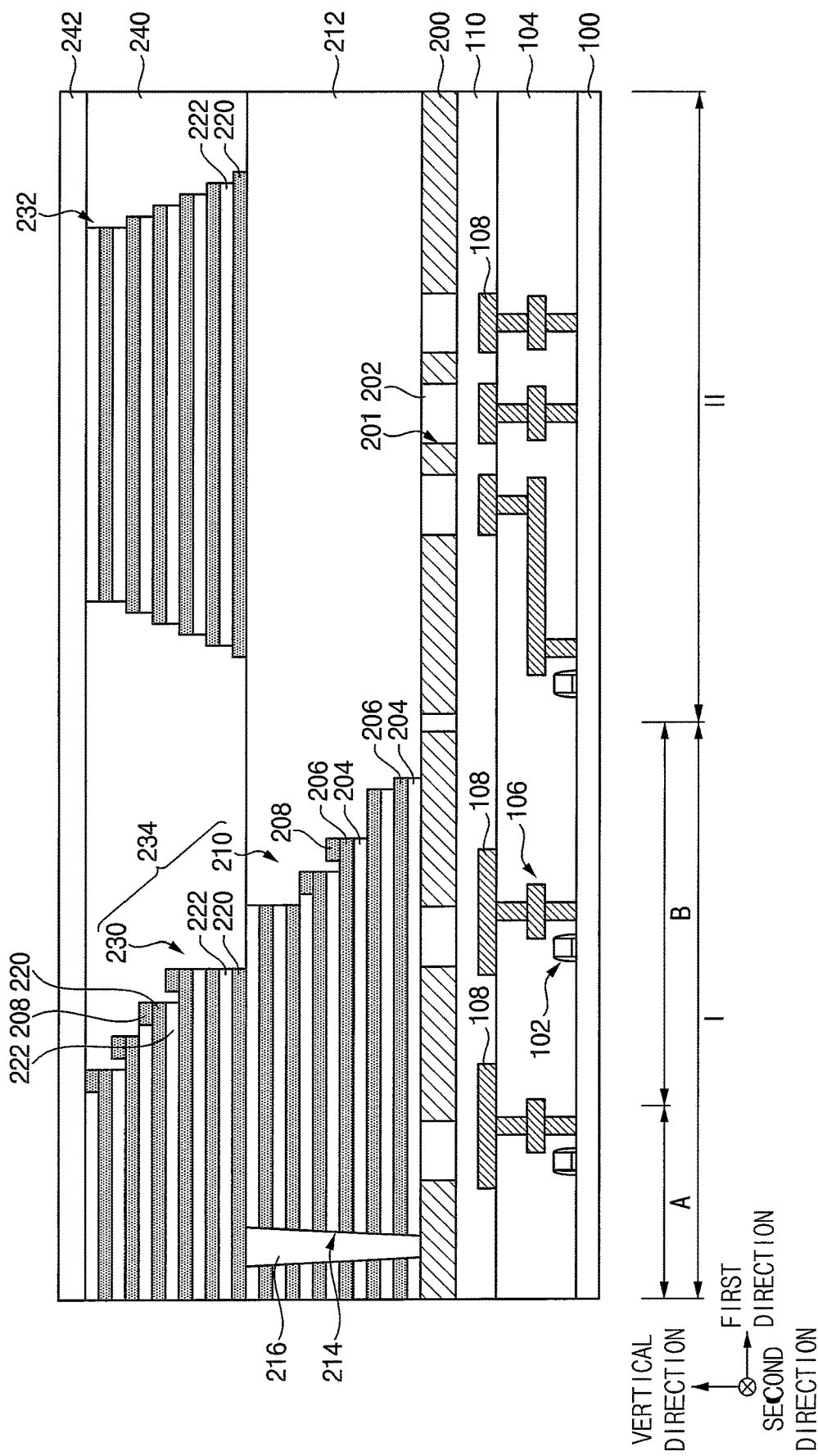

Referring to FIG. 18, a second lower insulation layer may be formed on the second preliminary cell mold structure 230, the preliminary dummy mold structure 232, and the first lower insulation pattern 212 therebetween. The lowest portion of an upper surface of the second lower insulation layer may be higher than the upper surfaces of the second preliminary cell mold structure 230 and the preliminary dummy mold structure 232. That is, the upper surface of the second lower insulation layer formed on the first lower insulation pattern 212 may be higher than the upper surfaces of the second preliminary cell mold structure 230 and the preliminary dummy mold structure 232.

The upper surface of the second lower insulation layer may be planarized until upper surfaces of the second preliminary cell mold structure 230 and the preliminary dummy mold structure 232 are exposed to form the second lower insulation pattern 240 on the first lower insulation pattern 212. The second lower insulation pattern 240 may cover sidewalls of the second preliminary cell mold structure 230 and the preliminary dummy mold structure 232. The planarization process may include a chemical mechanical polishing (CMP) process. As the preliminary dummy mold structure 232 is formed, dishing, e.g., excessive polishing, of the upper surface of the second lower insulation pattern 240 may be decreased in the CMP process.

Thereafter, the first insulating interlayer 242 may be formed on the second preliminary cell mold structure 230, the preliminary dummy mold structure 232, and the second lower insulation pattern 240.

Figure 19:
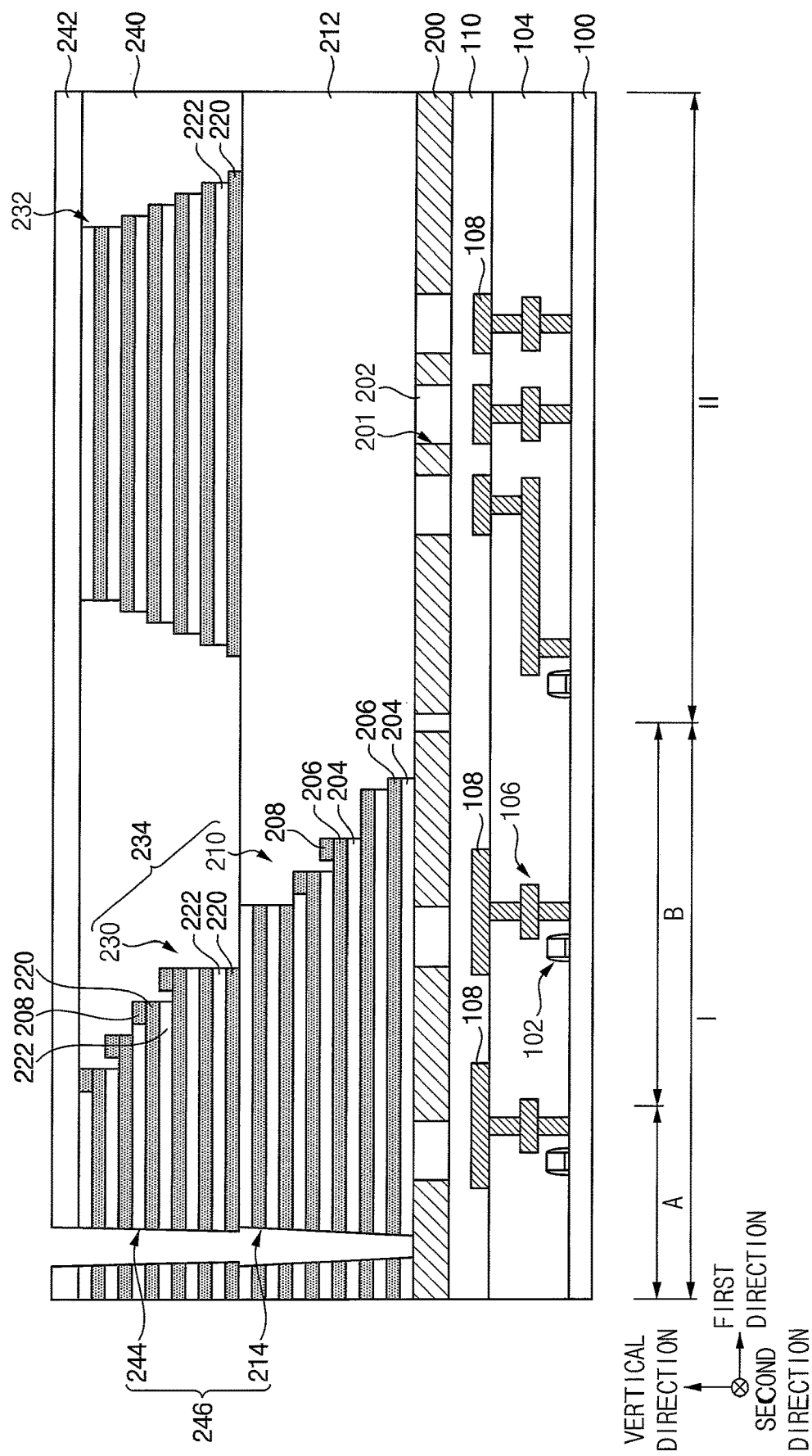

Referring to FIG. 19, the second preliminary cell mold structure 230 may be etched by a photolithography process to form the upper channel hole 244. The upper channel hole 244 may pass through the second preliminary cell mold structure 230, and the upper channel hole 244 may expose an upper surface of the filling sacrificial layer 216 in the lower channel hole 214.

When the upper channel hole 244 is formed by the photolithography process, a photo mask may be aligned using an alignment mark formed on the substrate 100. For example, the alignment mark may be formed in a scribe lane of the substrate.

If dishing, i.e., excessive polishing of a portion of an upper surface, were to occur in the second lower insulation pattern 240 during the previously performed CMP processes, the alignment mark could have been removed during the CMP processes. If the alignment mark were to be removed, the upper channel hole 244 may not have been formed at a normal position, thereby causing misalignment defects.

In contrast, according to the example embodiments, as the preliminary dummy mold structure 232 is formed I the second region II, dishing in the second lower insulation pattern 240 may be prevented or substantially decreased. Thus, removing of the alignment mark due to the dishing may be prevented or substantially decreased. Therefore, the upper channel hole 244 may be formed at the normal position to be properly aligned with the lower channel hole 214 using the alignment mark in the photolithography process.

For example, centers of the lower and upper channel holes 214 and 244 may be aligned with each other. In another example, the lower and upper channel holes 214 and 244 may be communicated with each other, but the centers of the lower and upper channel holes 214 and 244 may not be aligned with each other.

Thereafter, the filling sacrificial layer 216 may be removed to form the channel hole 246. The channel hole 246 may include the lower channel hole 214 and the upper channel hole 244 in fluid communication with each other.

Figure 20:
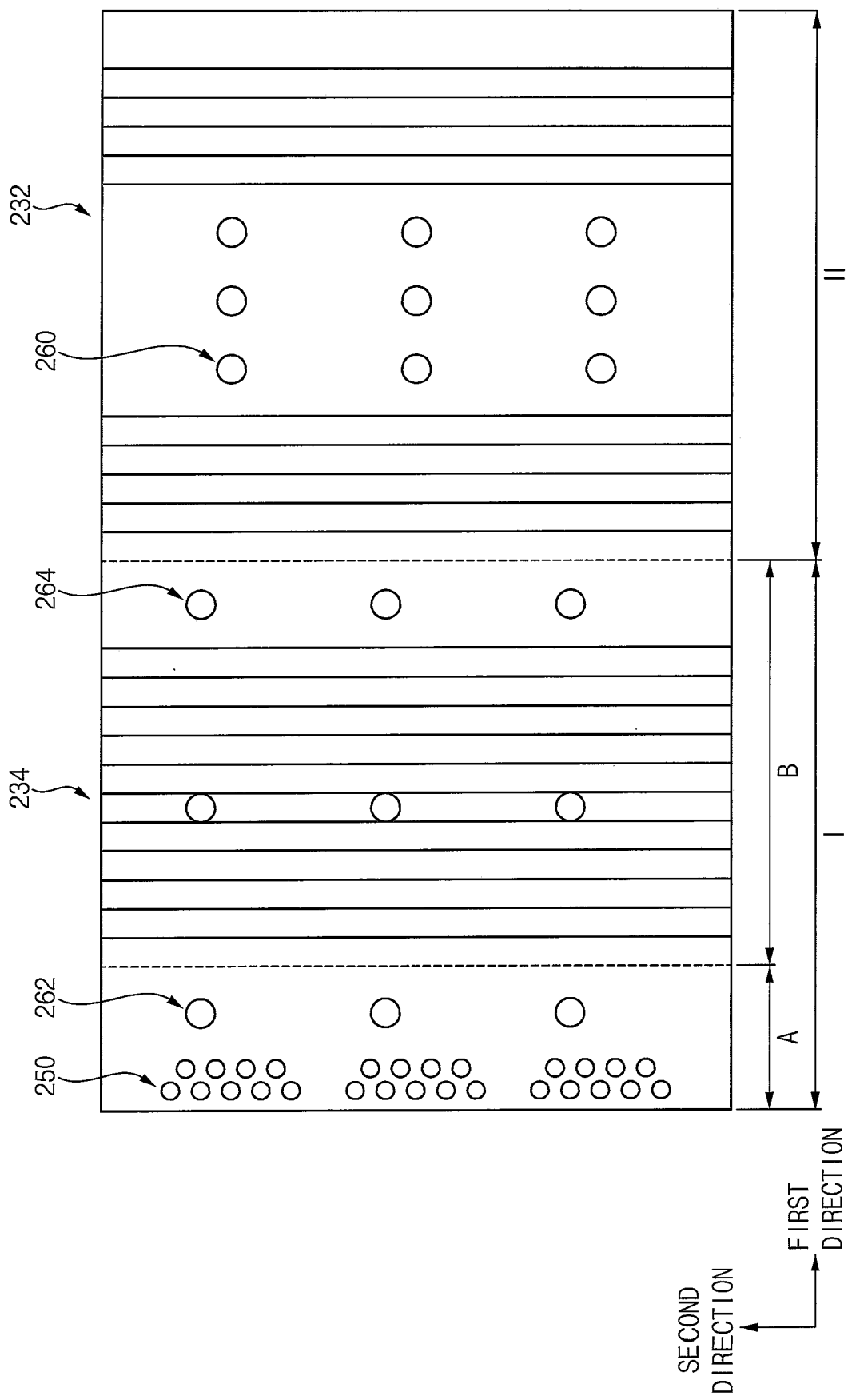
Figure 21:
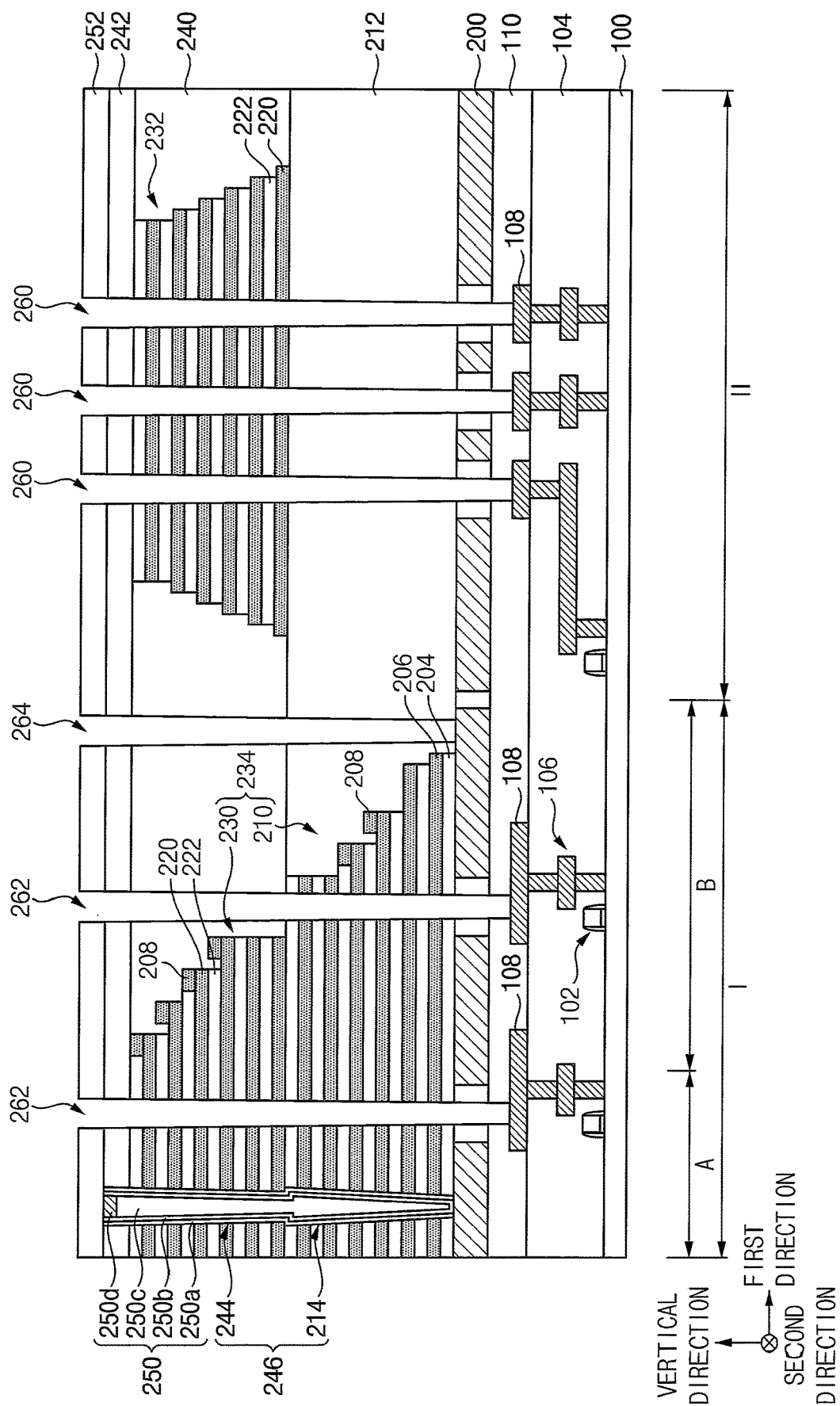

Referring to FIGS. 20 and 21, the channel structure 250 may be formed in the channel hole 246. The channel structure 250 may include the charge storage structure 250a, the channel 250b, the filling insulation pattern 250c, and the capping pattern 250d.

The charge storage structure 250a may include a first blocking layer, a charge storage layer, and a tunnel insulation layer. The first blocking layer, the charge storage layer, and the tunnel insulation layer may be sequentially stacked from a sidewall of the channel hole 246. The channel 250b may contact the tunnel insulation layer, and the channel 250b may be electrically connected to the base semiconductor pattern 200.

Thereafter, the second insulating interlayer 252 may be formed on the channel structure 250 and the first insulating interlayer 242. The second insulating interlayer 252, the first insulating interlayer 242, the second lower insulation pattern 240, the first lower insulation pattern 212, the first and second preliminary cell mold structures 210 and 230, the preliminary dummy mold structure 232, the lower filling pattern 202, and the second lower insulating interlayer 110 may be etched by a photolithography process to form first and second through holes exposing the lower pad pattern 108. In the etching process, the contact hole 264 passing through the second insulating interlayer 252, the first insulating interlayer 242, the second lower insulation pattern 240, and the first lower insulation pattern 212 may be further formed together. The base semiconductor pattern 200 may be exposed by the contact hole 264.

The first through hole 260 may pass through the preliminary dummy mold structure 232. The second sacrificial layers 220 included in the preliminary dummy mold structure 232 may be exposed by a sidewall of the first through hole 260. The second through hole 262 may pass through the preliminary cell mold structure 234. The first and second sacrificial layers 206 and 220 included in the preliminary cell mold structure 234 may be exposed by a sidewall of the second through hole 262. However, the sacrificial layers may not be exposed by a sidewall of the contact hole 264.

Figure 22:
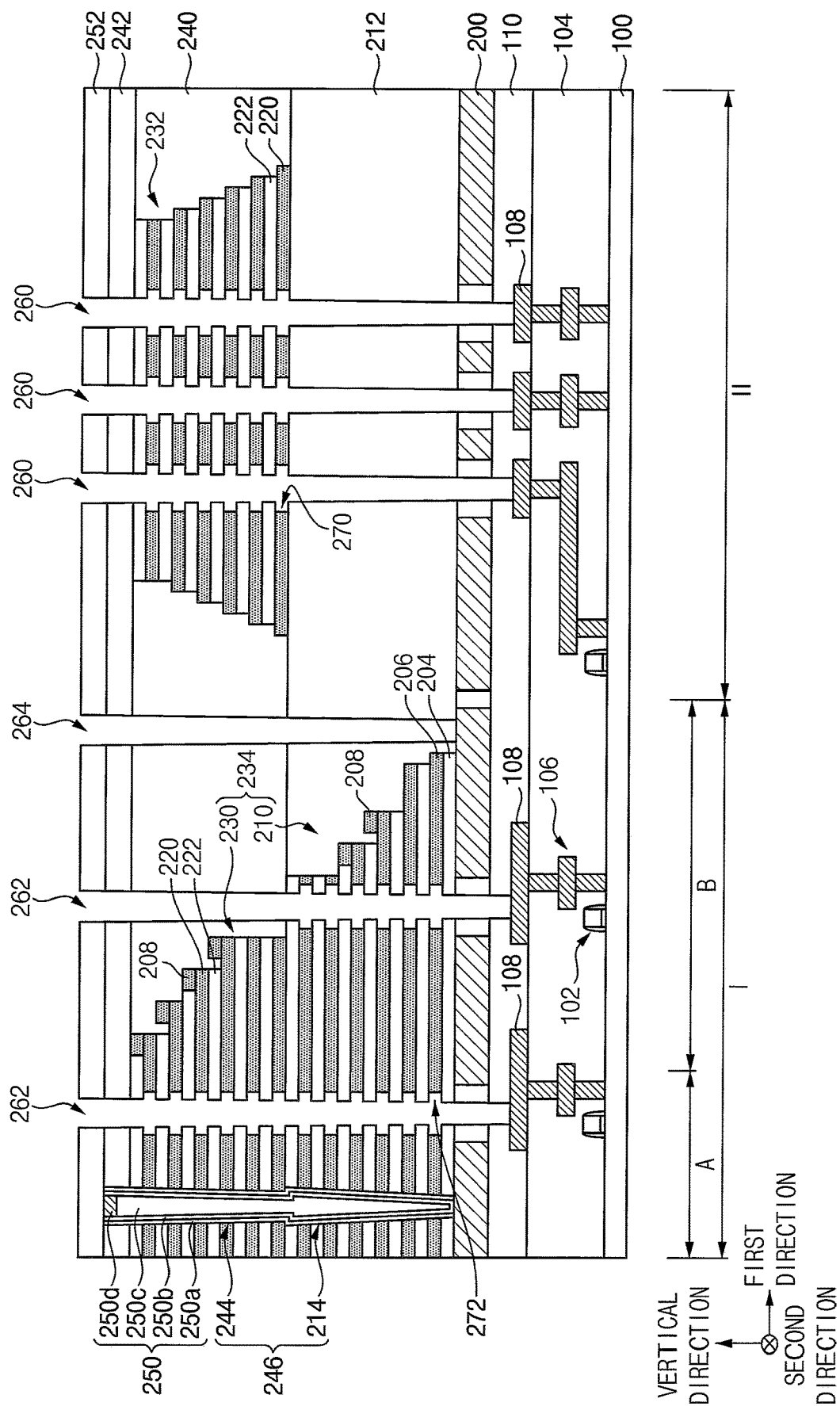

Referring to FIG. 22, the first and second sacrificial layers 206 and 220 exposed by the first and second through holes 260 and 262 may be partially removed by a wet etching process to form the first gap 270 and the second gap 272. The first gap 270 may be communicated with the sidewall of the first through hole 260, and the second gap 272 may be communicated with the sidewall of the second through hole 262.

Figure 23:
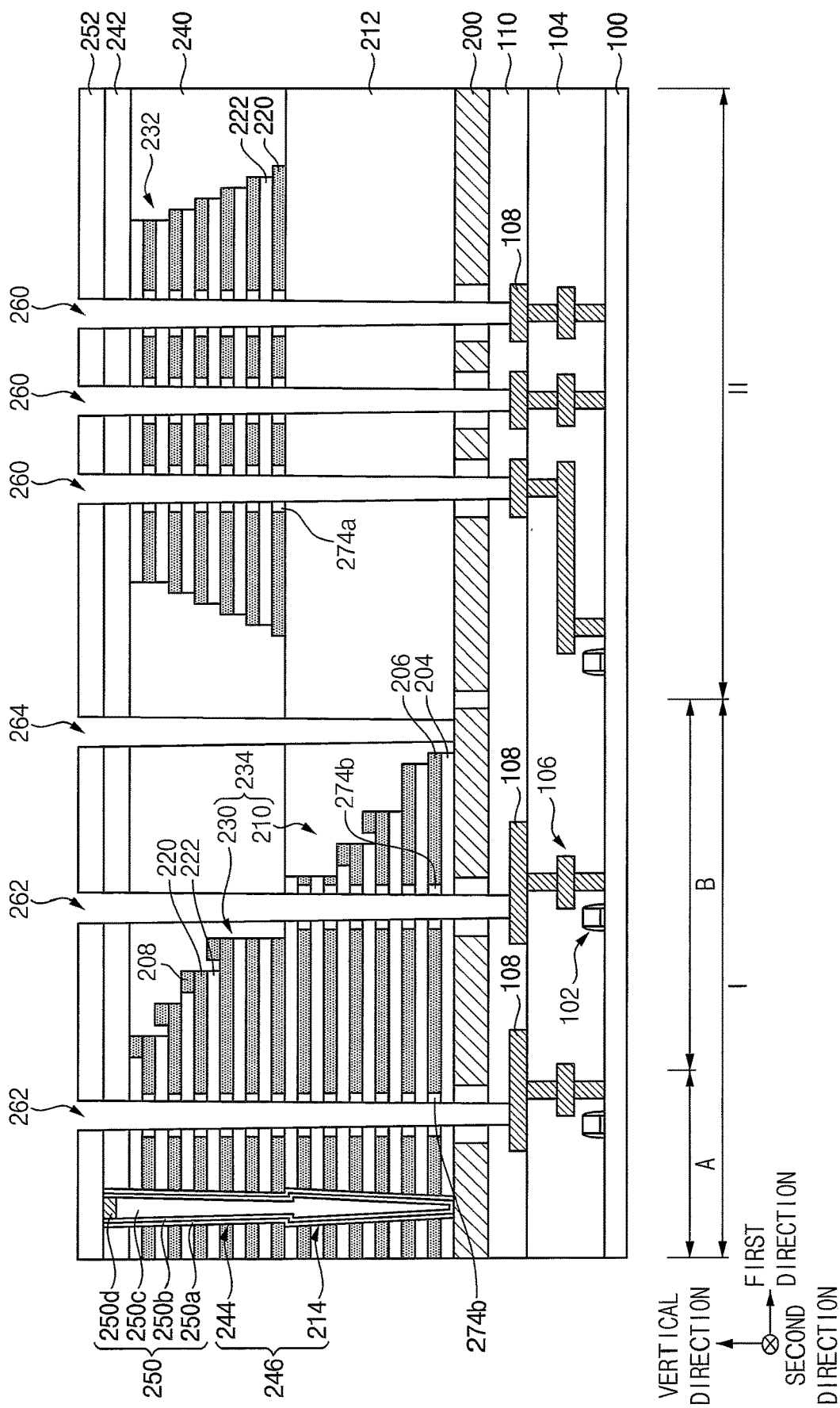

Referring to FIG. 23, a capping insulation layer may be conformally formed on sidewalls of the first and second through holes 260 and 262 and the contact hole 264, upper surfaces of lower pad patterns 108 and the base semiconductor pattern, the first and second gaps 270 and 272, and an upper surface of the second insulating interlayer 252. The capping insulation layer may be formed to completely fill the first and second gaps 270 and 272. However, the capping insulation layer may not be completely filled in the first and second through holes 260 and 262 and the contact hole 264.

The capping insulation layer may be partially removed by, e.g., a wet etching process. When the wet etching process is performed, the capping insulation layer formed in the first and second gaps 270 and 272 may remain, and the capping insulation layers formed on the other portion may be removed. Thus, the first and second capping insulation patterns 274a and 274b may be formed in the first and second gaps 270 and 272, respectively.

Figure 24:
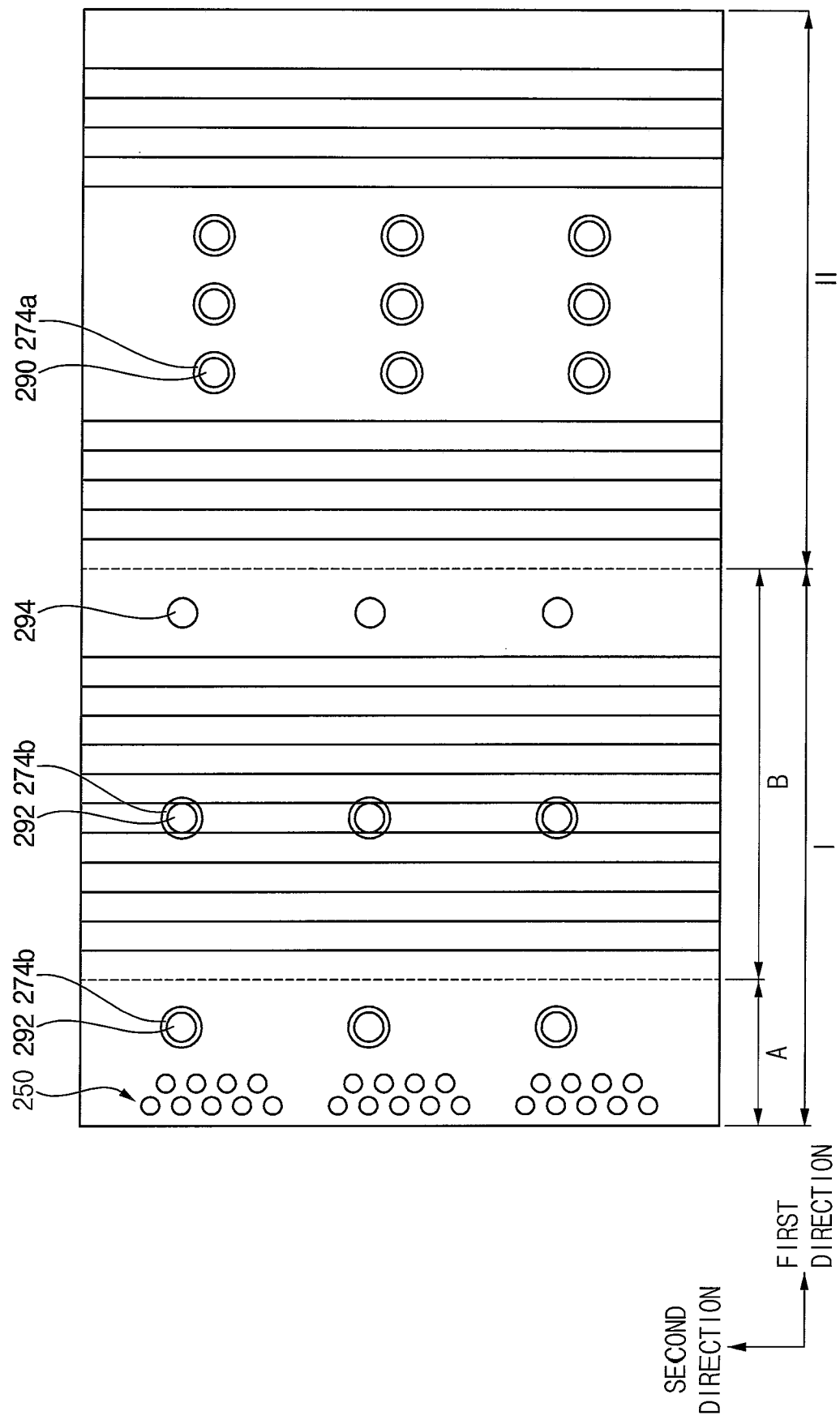
Figure 25:
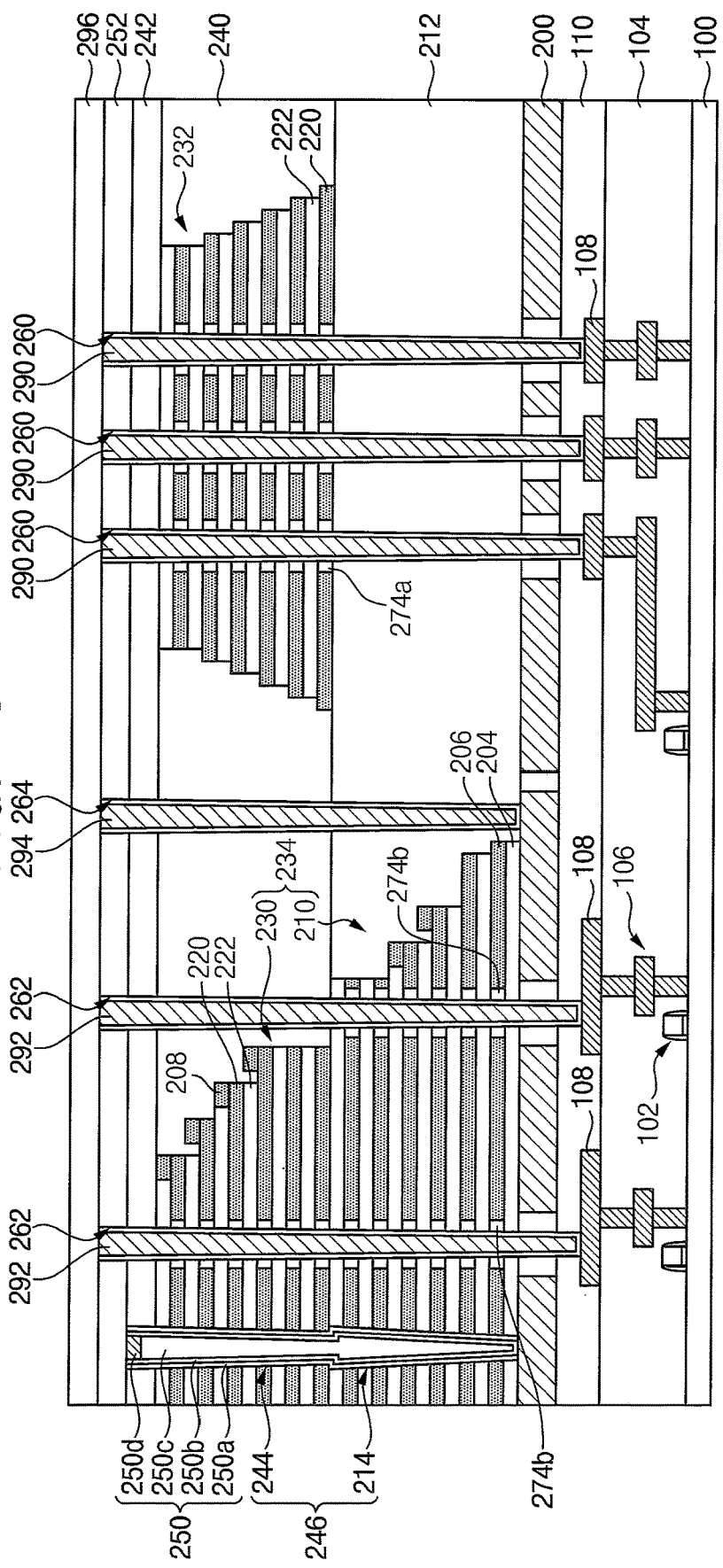

Referring to FIGS. 24 and 25, a conductive material may fill the first and second through holes 260 and 262 and the contact hole 264, so that the first through via contact 290, the second through via contact 292, and the contact plug 294 may be formed in the first and second through holes 260 and 262 and the contact hole 264, respectively.

For example, a barrier metal layer may be conformally formed on surfaces of the first and second through holes 260 and 262 and the contact hole 264. A metal layer may be formed on the barrier metal layer to fill the first and second through holes 260 and 262 and the contact holes 264. Thereafter, the barrier metal layer and the metal layer may be planarized until the second insulating interlayer 252 is exposed to form the first through via contact 290, the second through via contact 292, and the contact plug 294.

The third insulating interlayer 296 may be formed to cover the second insulating interlayer 252, the first through via contact 290, the second through via contact 292, and the contact plug 294.

Figure 26:
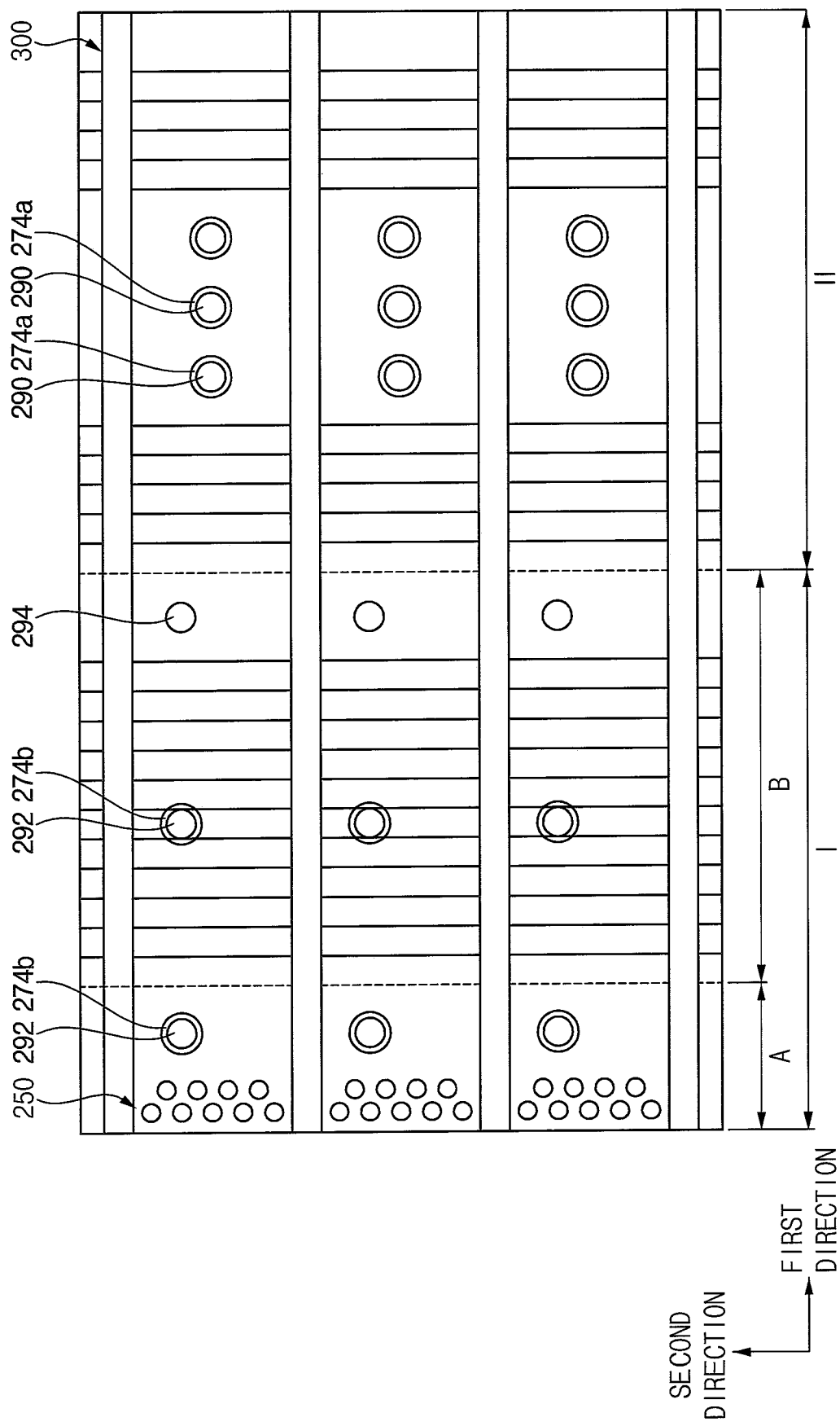

Referring to FIG. 26, the first to third insulating interlayers 242, 252, 296, the preliminary cell mold structure 234, the preliminary dummy mold structure 232, and the first and second lower insulation patterns 212 and 240 may be etched using an etching mask to form the trench 300 extending in the first direction. In example embodiments, the etching process may be performed until the surface of the base semiconductor pattern 200 is exposed by a bottom surface of the trench 300.

The trench 300 may extend in the first direction from the first region I to the second region II. A plurality of trenches 300 may be spaced apart in the second direction. As the trench 300 is formed, the preliminary cell mold structure 234 may be transformed into a cell mold structure extending in the first direction. Further, the preliminary dummy mold structure 232 may be transformed into a dummy mold structure extending in the first direction. First and second sacrificial layers 206 and 220, first and second insulation layers 204 in the cell mold structure and the dummy mold structure, and the first and second lower insulation patterns 212 and 240 may be exposed by sidewalls of the trench 300.

Figure 27:
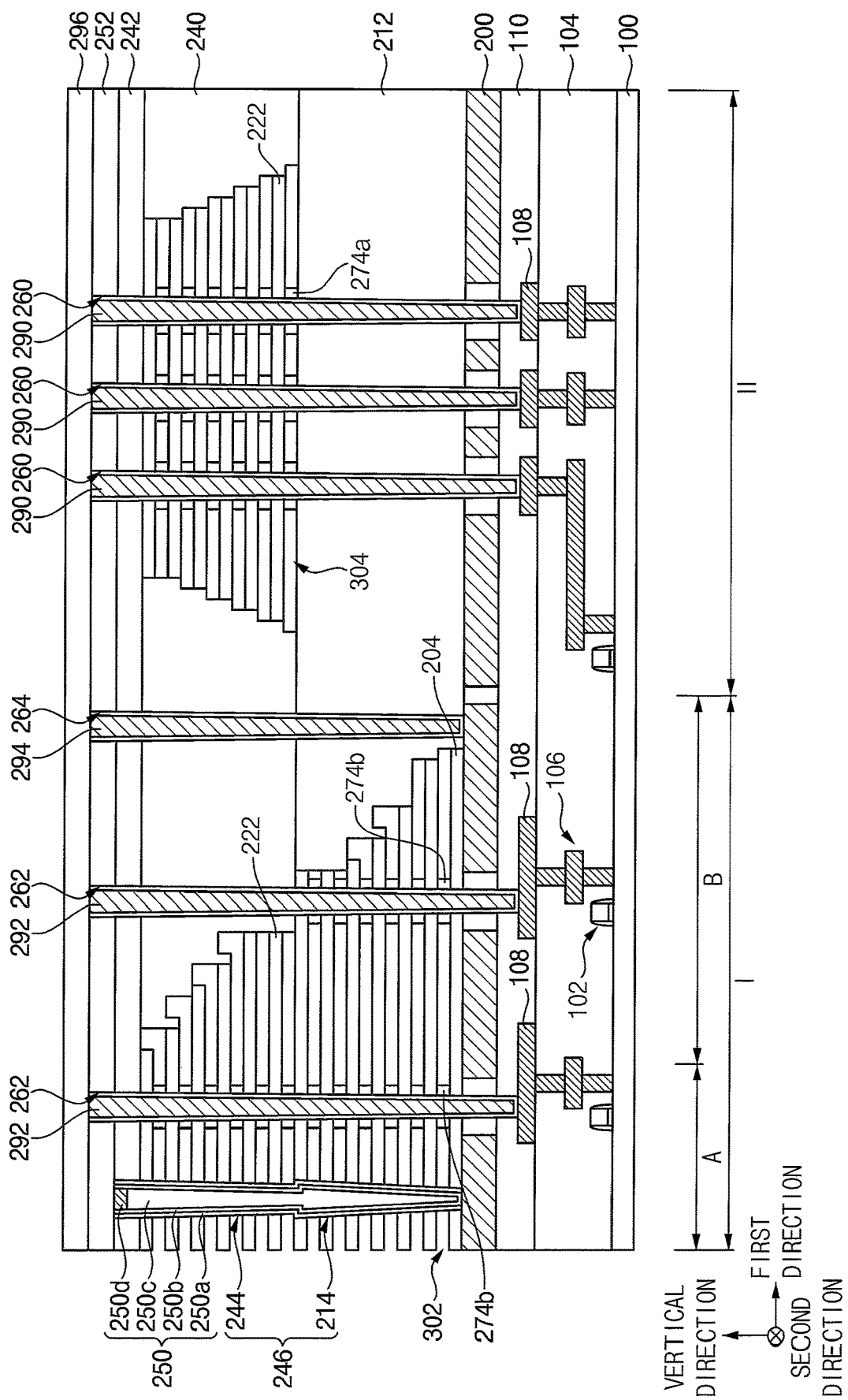

Referring to FIG. 27, the first and second sacrificial layers 206 and 220 and the insulation pad pattern of the cell mold structure and the dummy mold structure exposed by the trench 300 may be removed to form a third gap 302 and a fourth gap 304. The third gap 302 may be formed at a portion between the first insulation layers 204 and a portion between the second insulation layers 222 in the cell mold structure in the vertical direction. The fourth gaps 304 may be formed between the second insulation layers 222 in the preliminary dummy mold structure 232. A second blocking layer may be further conformally formed on the surface of the trench 300 and the surfaces of the third and fourth gaps 302 and 304. For example, the second blocking layer may include aluminum oxide.

Figure 28:
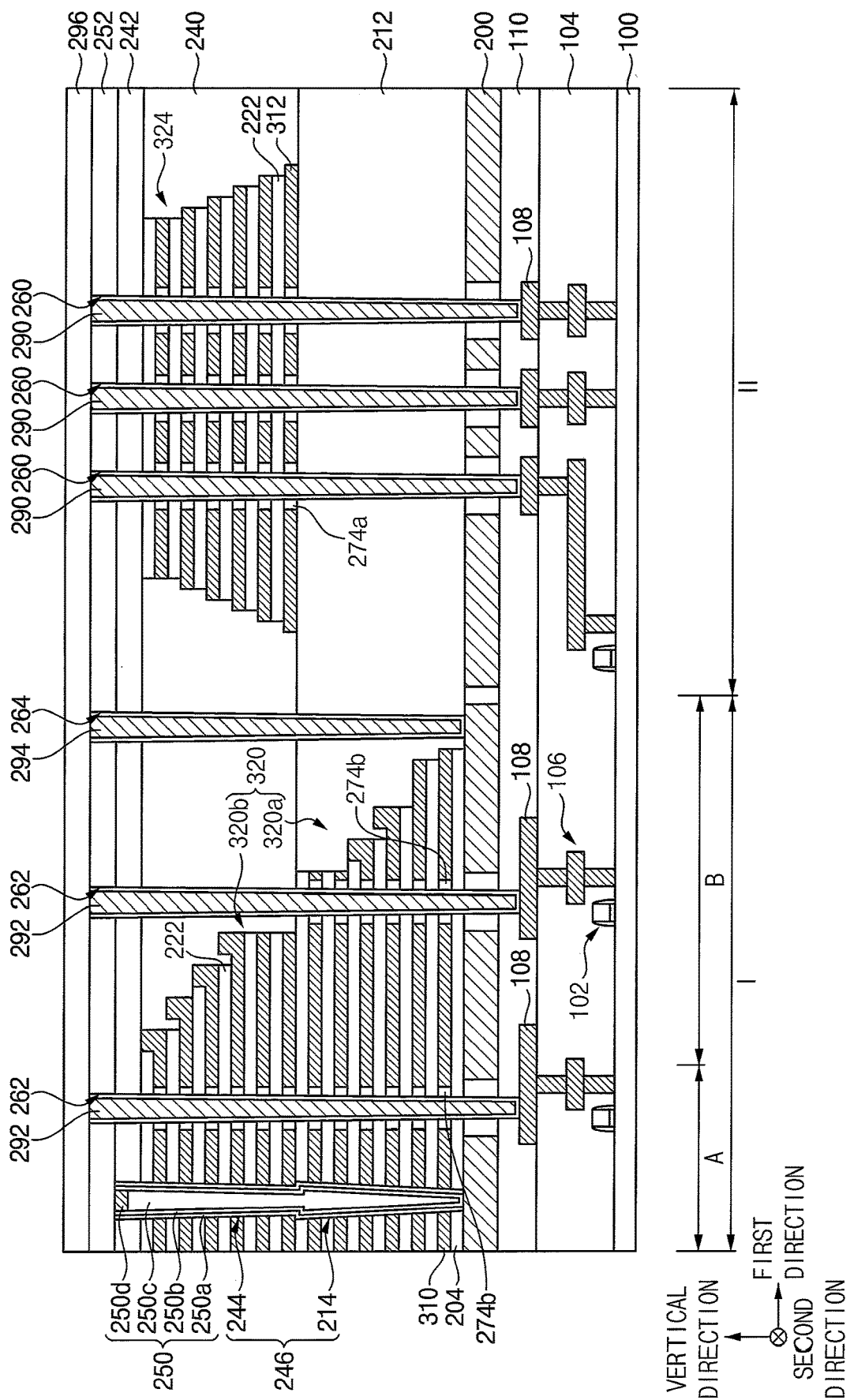

Referring to FIG. 28, a conductive layer may be formed to fill the third and fourth gaps 302 and 304. The conductive layer may include a barrier metal layer and a metal layer. The conductive layer may be partially removed so that the conductive layer remains only in the third and fourth gaps 302 and 304. Thus, the gate pattern 310 may be formed in the third gap 302, and the conductive pattern 312 may be formed in the fourth gap 304.

By the above process, the first and second sacrificial layers 206 and 220 in the cell mold structure may be replaced with the gate patterns 310, and thus the cell mold structure may be transformed into the cell stacked structure 320. The cell stacked structure 320 may include the first and second cell stacked structures 320a and 320b stacked in the vertical direction.

In example embodiments, a step portion of the gate pattern 310 in the cell stacked structure 320 may have a thickness greater than a thickness of the other portion of the gate pattern 310. The step portion of the gate pattern 310 may be referred to as a pad pattern.

Further, the second sacrificial layers 220 in the dummy mold structure may be replaced with the conductive pattern 312, and thus the dummy mold structure may be transformed into the dummy structure 324. The dummy structure 324 may have a structure in which the second insulation layers 222 and the conductive patterns 312 are repeatedly and alternately stacked. The dummy structure 324 may extend in the first direction.

When the first and second sacrificial layers 206 and 220 in the cell mold structure and the dummy mold structure are replaced with the gate patterns 310 and the conductive patterns 312, the gate patterns 310 and the conductive patterns 312 may be slightly contracted downward, in comparison with the first and second sacrificial layers 206 and 220. Therefore, upper surfaces of the cell stacked structure 320 and the dummy structure 324 may be slightly lower than the upper surfaces of the cell mold structure and the dummy mold structure. Further, an upper surface of the second insulating interlayer 252 may be slightly lowered. However, in example embodiments, a difference between the upper surfaces of the cell stacked structure 320 and the dummy structure 324 may be small, e.g., negligible, or nonexistent, after performing the replacement process. Therefore, as the upper surface of the second insulating interlayer 252 may be substantially flat, e.g., along its entire length in the first and second directions, defects potentially caused by a level difference of the upper surface of the second insulating interlayer 252 may be substantially decreased.

In contrast, if the first and second sacrificial layers in the cell mold structure were to be replaced with conductive patterns, while the second sacrificial layer in the dummy mold structure were not to be replaced with a conductive pattern, only the cell stacked structure would have contracted downwardly, thereby causing the cell stacked structure to have an upper surface lower than an upper surface of the dummy mold structure. As such, the upper surface of the second insulating interlayer on the cell mold structure would have been lower than the upper surface of the second insulating interlayer on the dummy mold structure, thereby causing a level difference of the upper surface of the second insulating interlayer.

The conductive patterns 312 of the dummy structure 324 and the gate patterns 310 of the cell stacked structure 320 may contact the first and second capping insulation patterns 274a and 274b having a ring shape, respectively. Therefore, the conductive patterns 312 and the gate patterns 310 may not be electrically connected to the first and second through via contacts 290 and 292. That is, the gate patterns 310 and the second through via contact 292 may be insulated by the second capping insulation patterns 274b in the cell stacked structure 320. The conductive patterns 312 and the first through via contact 290 may be insulated by the first capping insulation patterns 274a.

Referring to FIGS. 6 to 8 again, a separation layer may be formed to fill the trench 300. The separation layer may be planarized until an upper surface of the third insulating interlayer 296 is exposed to form the separation layer pattern 328 filling in the trench 300. The separation layer may include, e.g., oxide such as silicon oxide.

The first to third insulating interlayers 242, 252, 296 and the first and second lower insulation patterns 212 and 240 in the pad region B may be etched by a photolithography process to form cell contact holes exposing the pad patterns. Each of the pad patterns may be exposed by a bottom of the cell contact hole.

Thereafter, a conductive material may be formed in the cell contact holes to form the cell contact plugs 330. Each of the cell contact plugs 330 may include a barrier metal layer and a metal layer. Upper wirings may be further formed on the third insulating interlayer 296, and the upper wirings may be connected to the cell contact plug 330 and the through via contacts 290 and 292.

The dummy structure may be formed on the first lower insulation pattern, and the dummy structure may be positioned at a same vertical level as a vertical level of the second cell stacked structure corresponding to an upper portion of the cell stacked structure. However, a shape of the dummy structure may not be limited thereto. Hereinafter, embodiments including the dummy structure having a different shape are described.

Figure 29:
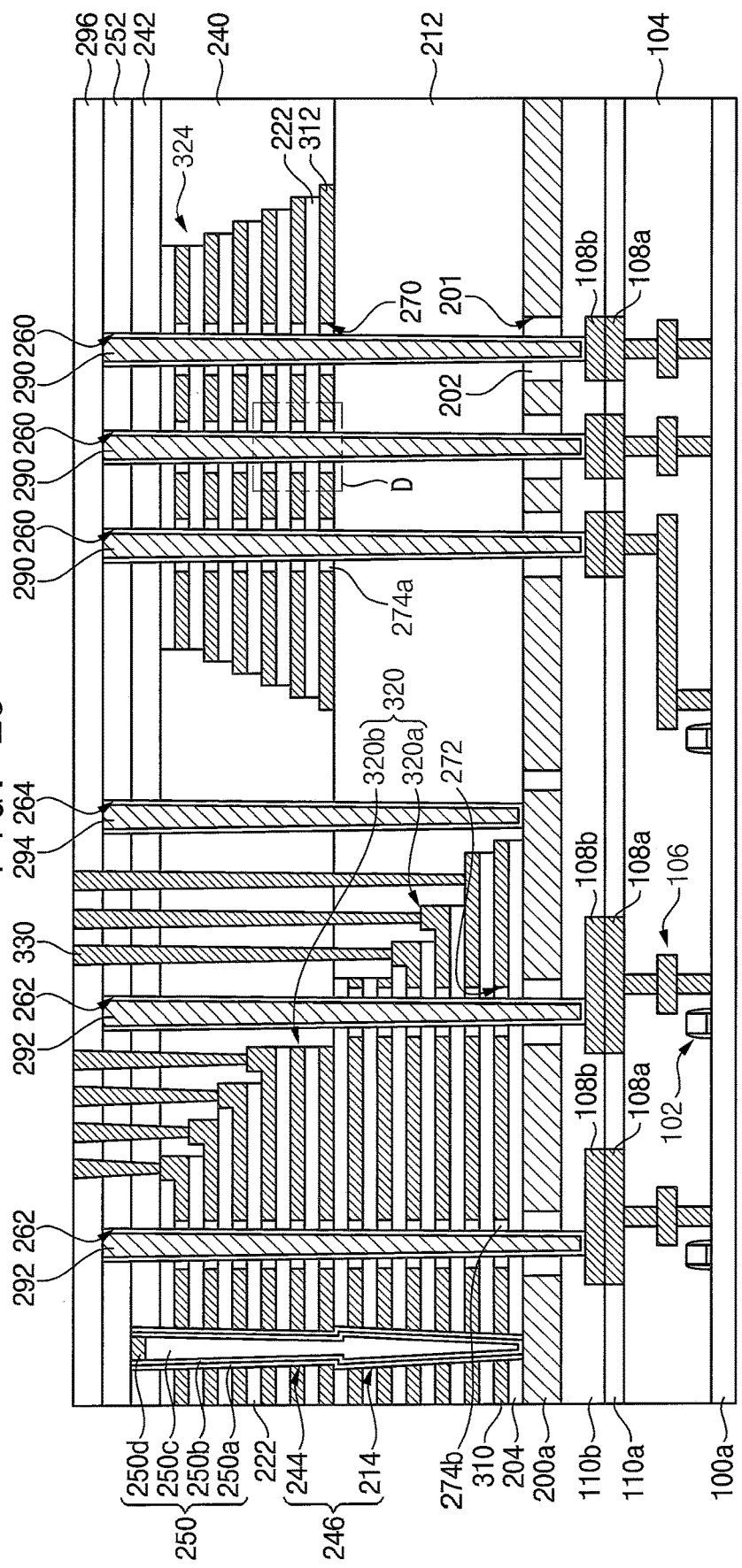
FIG. 29 is a cross-sectional view illustrating a NAND flash memory device in accordance with example embodiments.

FIG. 29 is a cross-sectional view illustrating a NAND flash memory device in accordance with example embodiments. The NAND flash memory device shown in FIG. 29 has a structure similar to or the same as the NAND flash memory device shown in FIG. 6, with the exception that circuit patterns constituting the peripheral circuit may be formed on a first substrate 100a, and the cell stacked structure 320 and the dummy structure 324 may be formed on a second substrate 200a. The NAND flash memory device may have a structure in which the first and second substrates 100a and 200a may be bonded to each other.

Referring to FIG. 29, a first bonding metal wiring 108a may be formed on an uppermost portion of the first substrate 100a. A second lower insulating interlayer 110a may be formed on both sides of the first bonding metal wiring 108a. Upper surfaces of the first bonding metal wiring 108a and the second lower insulating interlayer 110a may be coplanar with each other.

A lower filling pattern 202 may be further formed in the second substrate 200a. A second bonding metal wiring 108b and a lowermost insulating interlayer 110b may be formed under a lowermost portion of the second substrate 200a. The lowermost insulating interlayer 110b may be formed to cover the second bonding metal wiring 108b. Lower surfaces of the second bonding metal wiring 108b and the lowermost insulating interlayer 110b may be coplanar with each other.

In example embodiments, the first bonding metal wiring 108a may include a same material as a material of the second bonding metal wiring 108b. For example, the first bonding metal wiring 108a and the second bonding metal wiring 108b may include copper.

An upper surface of the first bonding metal wiring 108a and a lower surface of the second bonding metal wiring 108b may be bonded to each other. Thus, the first and second substrates 100a and 200a may be bonded to each other.

Figure 30:
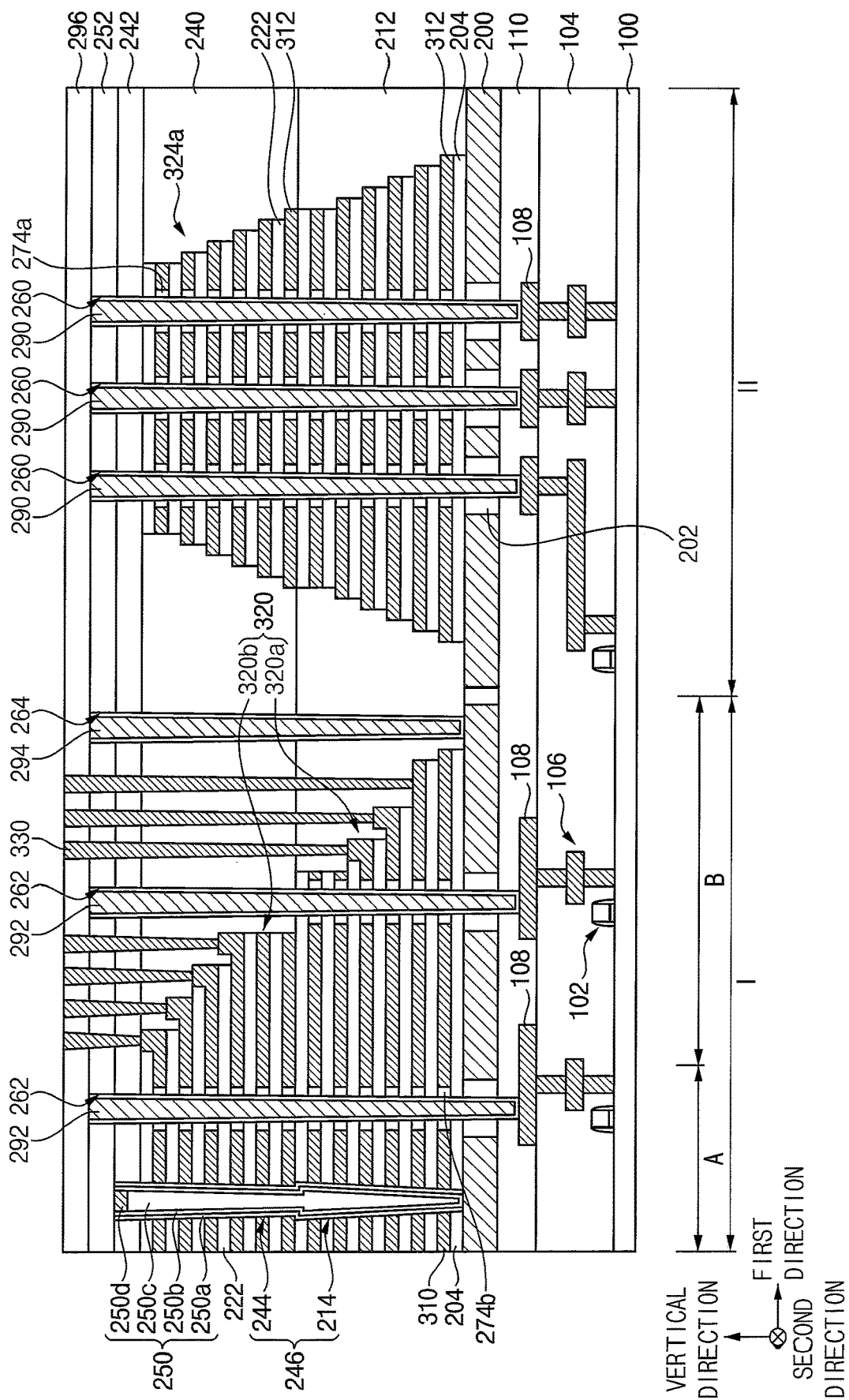
FIGS. 30 to 32 are cross-sectional views illustrating NAND flash memory devices in accordance with example embodiments, respectively.
Figure 31:
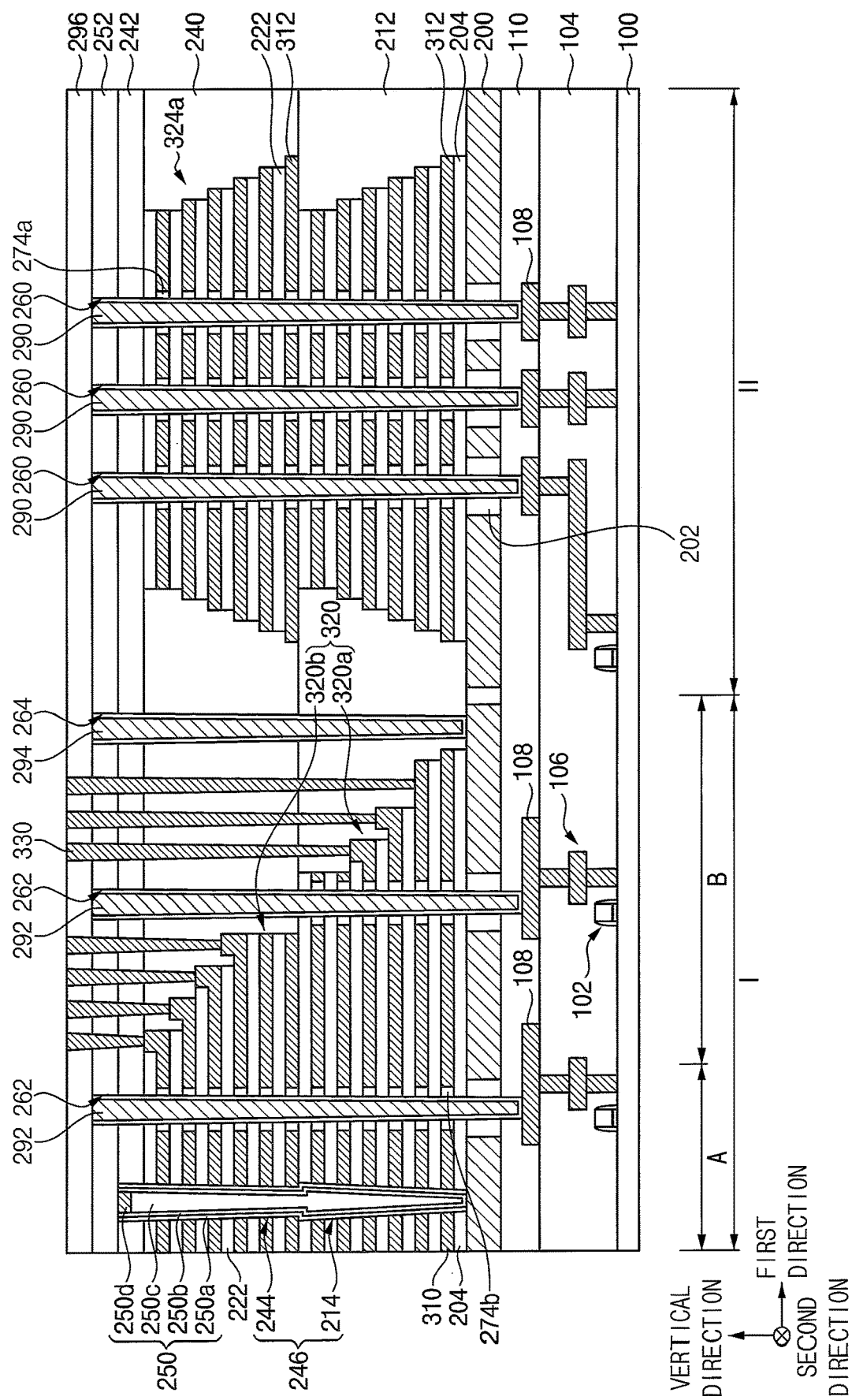
Figure 32:
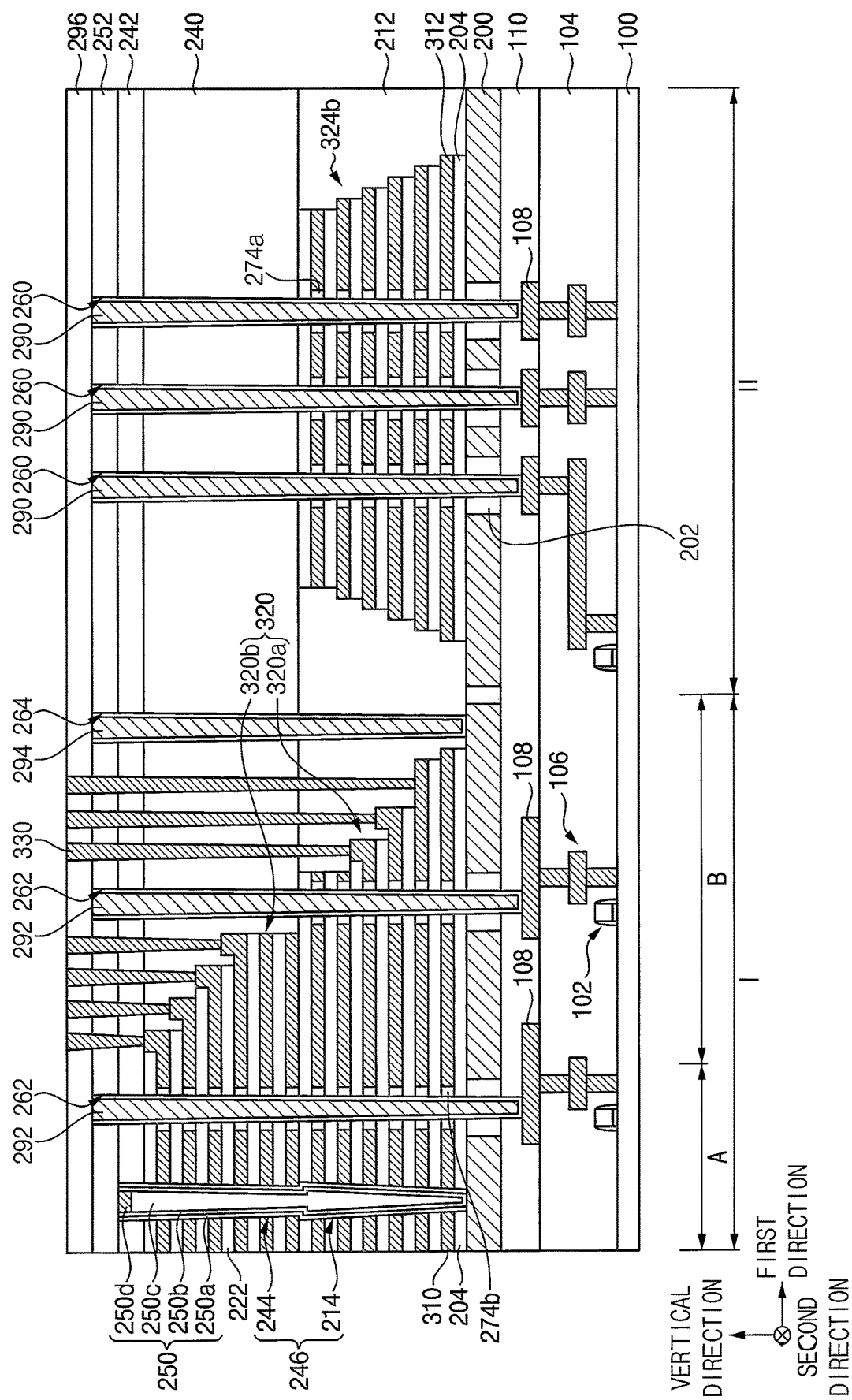

FIGS. 30 to 32 are cross-sectional views illustrating NAND flash memory devices in accordance with example embodiments, respectively. The NAND flash memory devices in FIGS. 30 to 32 may be the same as the NAND flash memory device shown in FIG. 6, except for a shape of the dummy structure.

Referring to FIGS. 30 and 31, a dummy structure 324a may be disposed at a same vertical level as a vertical level of the cell stacked structure 320. That is, lower surfaces of the dummy structure 324a and the cell stacked structure 320 may be coplanar with each other. Upper surfaces of the dummy structure 324a and the cell stacked structure 320 may be coplanar with each other.

In example embodiments, an edge in the first direction of the dummy structure 324a may have a step shape. For example, as shown in FIG. 30, the edge in the first direction of the dummy structure 324a may have a step shape connected in a vertical direction. In another example, as shown in FIG. 31, the edge in the first direction of the dummy structure 324a may have a step shape that is not connected in a vertical direction.

Referring to FIG. 32, a dummy structure 324b may be only positioned at a same vertical level as a vertical level of the first cell stacked structure 320a corresponding to the lower portion of the cell stacked structure 320. That is, lower surfaces of the dummy structure 324b and the first cell stacked structure 320a may be coplanar with each other. Upper surfaces of the dummy structure 324b and the first cell stacked structure 320a may be coplanar with each other. The second lower insulation pattern 240 may be formed to cover the dummy structure 324b.

The NAND flash memory devices illustrated with reference to FIGS. 30 to 32 may be manufactured by processes similar to or the same as described previously with reference to FIGS. 11 to 28. However, in patterning processes for forming the cell mold stacked structure and the dummy mold stacked structure, the dummy mold stacked structure may be formed so as to subsequently form a dummy structure having a target shape. Therefore, one of the NAND flash memory devices illustrated with reference to FIGS. 30 to 32 may be manufactured.

Figure 33:
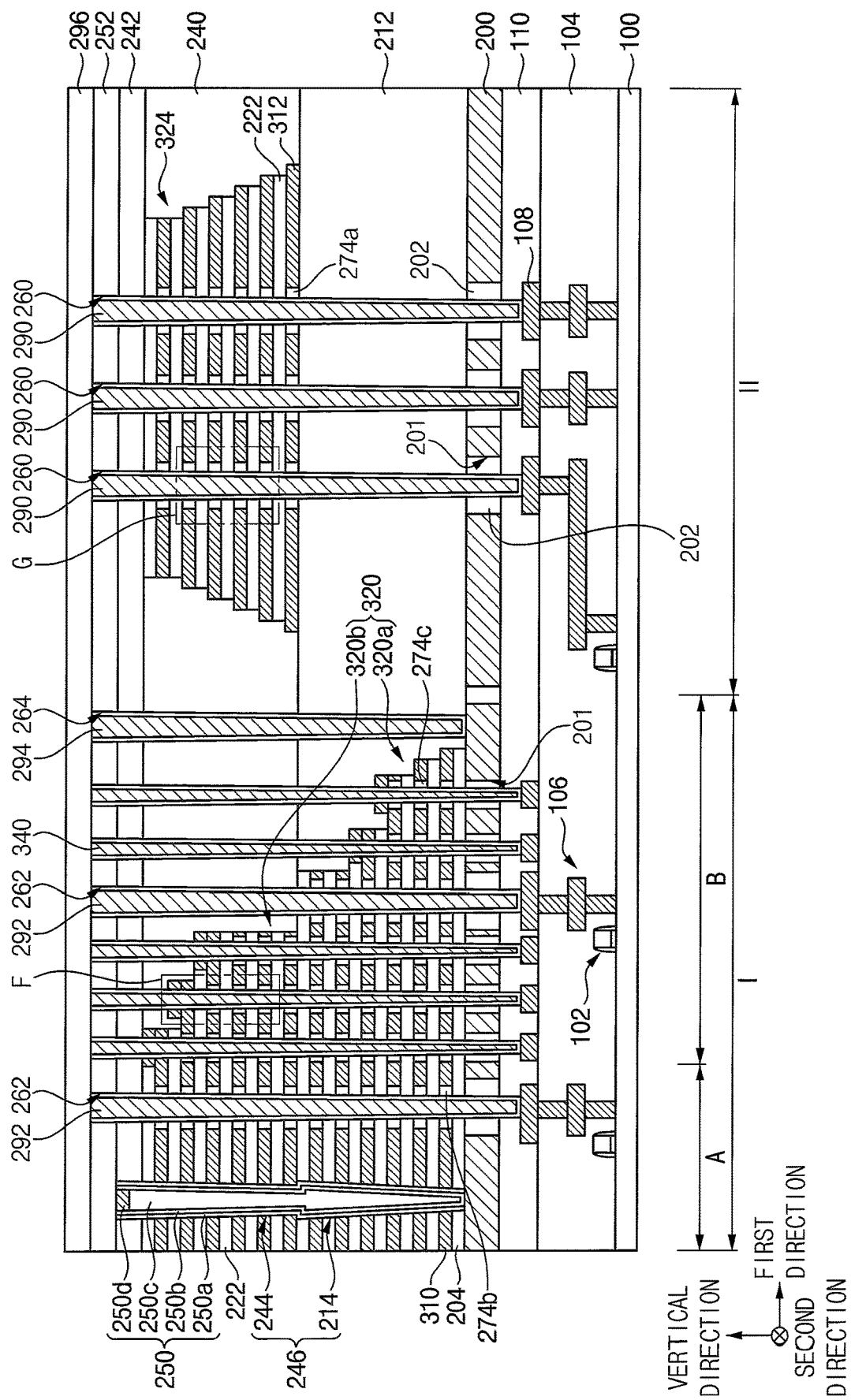
FIG. 33 is a cross-sectional view illustrating a NAND flash memory device in accordance with example embodiments.
Figure 34:
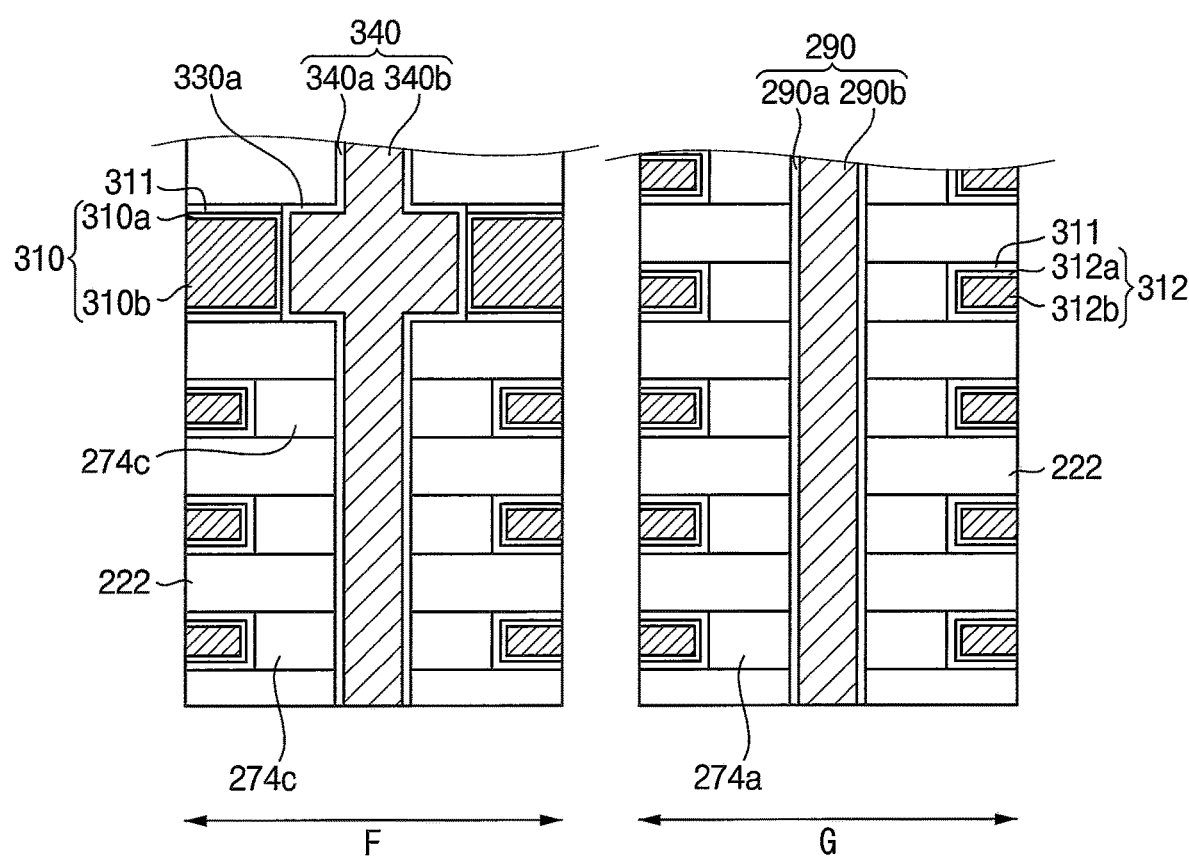
FIG. 34 is enlarged cross-sectional views of portions F and G in FIG. 33, respectively.

FIG. 33 is a cross-sectional view illustrating a NAND flash memory device in accordance with example embodiments. FIG. 34 illustrates enlarged cross-sectional views of portions F and G in FIG. 33, respectively. The NAND flash memory device in FIG. 33 is substantially the same as the NAND flash memory device in FIG. 6, except for a shape of the cell contact plug.

Referring to FIGS. 33 and 34, cell contact holes may pass through the first and second insulating interlayers 242 and 252, the cell stacked structure 320, the lower filling pattern 202, and the second lower insulating interlayer 110. Cell contact plugs 340 may be formed in the cell contact holes, respectively.

The first opening 201 of the base semiconductor pattern 200 may be disposed at a portion for forming the cell contact plug 340 and around the portion forming the cell contact plug 340.

The cell contact plug 340 may pass through a step portion of the cell stacked structure 320 in the pad region B. The cell contact plug 340 may pass through the gate patterns 310 of the cell stacked structure 320. The cell contact plug 340 may be electrically connected to only an uppermost gate pattern 310, and may not be electrically connected to the gate patterns 310 thereunder.

The cell contact plug 340 and the uppermost gate pattern 310 having a step shape may contact each other. A third capping insulation pattern 274c may be formed between the cell contact plug 340 and each of the gate patterns 310 formed under the uppermost gate pattern 310 having the step shape. The third capping insulation pattern 274c may have a ring shape. The third capping insulation pattern 274c may include, e.g., silicon oxide. The third capping insulation pattern 274c may have a same material as materials of the first and second capping insulation patterns 274a and 274b.

As described above, the cell contact plug 340 may be directly connected to the gate pattern 310 and the lower pad pattern 108, so that an upper wiring on the cell contact plug 340 may not be required. Therefore, wirings on the cell contact plug 340 may be simplified.

In some example embodiments, each of the NAND flash memory devices illustrated with reference to FIGS. 30 to 32 may include the cell contact plug in FIG. 33.

FIGS. 35 to 39 are cross-sectional views illustrating stages in a method of manufacturing a NAND flash memory device in accordance with example embodiments. FIGS. 36 to 39 are enlarged cross-sectional views of portions F and G of FIG. 33, respectively. In each of drawings, a left drawing is a step portion of the cell stacked structure, and a right drawing is a portion of the dummy structure.

Some of the stages for manufacturing the NAND flash memory device described below are similar to or the same as processes described previously with reference to FIGS. 11 to 28.

In detail, same processes as described previously with reference to FIGS. 11 to 19 may be performed. However, in the patterning process for forming the base semiconductor pattern 200 and the first opening 201, the first opening 201 may be formed at a portion for forming through via contacts and around the portion for forming the through via contacts and at a portion for forming cell contact plugs and around the portion for forming the cell contact plugs.

Figure 35:
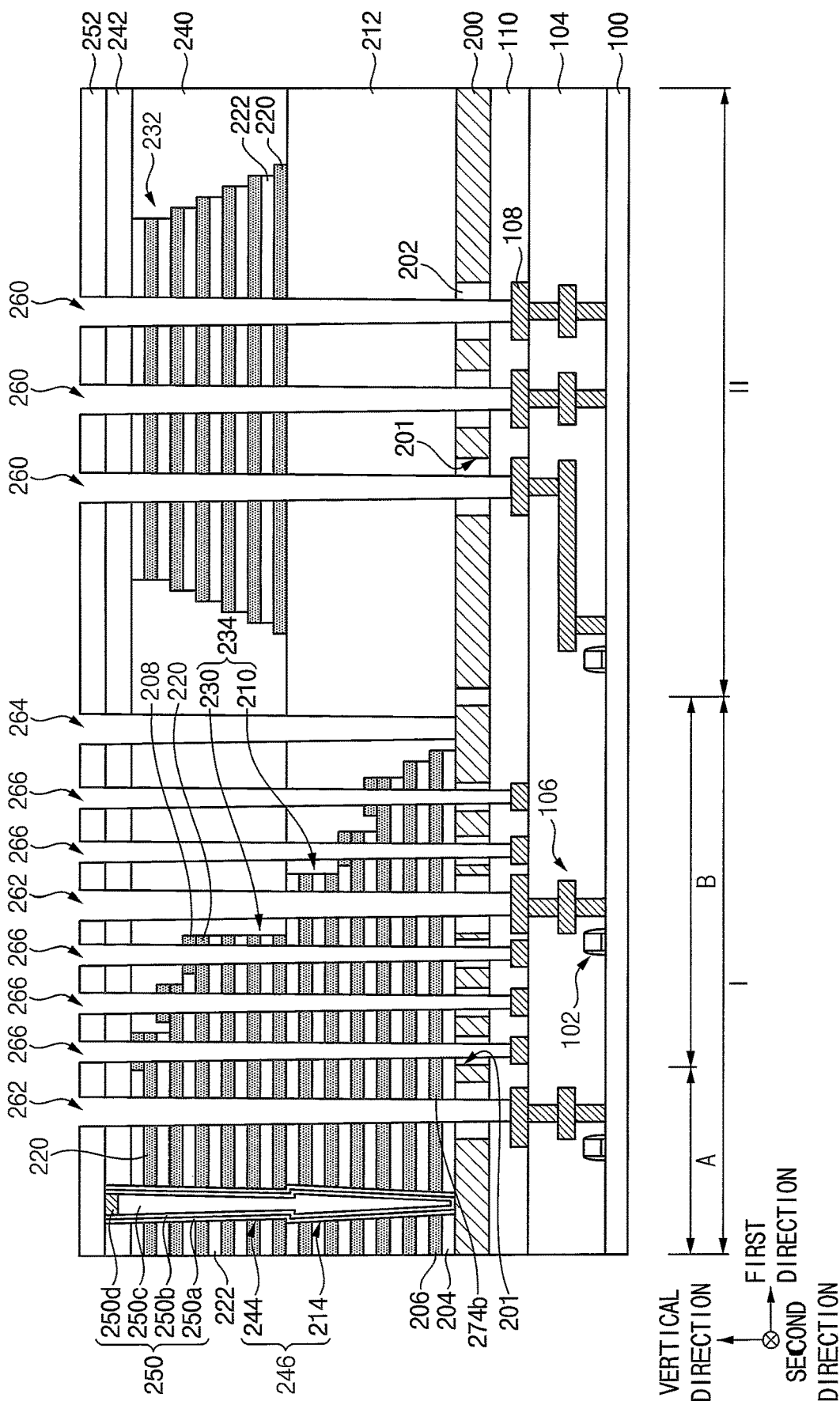
FIGS. 35 to 39 are cross-sectional views of stages in a method of manufacturing a NAND flash memory device in accordance with example embodiments.

Referring to FIG. 35, the second insulating interlayer 252, the first insulating interlayer 242, the second lower insulation pattern 240, the first lower insulation pattern 212, the first and second preliminary cell mold structures 210 and 230, the preliminary dummy mold structure 232, the lower filling pattern 202, and the second lower insulating interlayer 110 may be etched by a photolithography process to form the first and second through holes 260 and 262 and a cell contact hole 266 exposing the lower pad pattern 108.

The cell contact hole 266 may pass through a step portion of the preliminary cell mold structure 234. The cell contact hole 266 may extend to an upper surface of the lower pad pattern 108.

In the etching process, the contact hole 264 passing through the second insulating interlayer 252, the first insulating interlayer 242, the second lower insulation pattern 240, and the first lower insulation pattern 212 may be further formed together. The contact hole 264 may expose the base semiconductor pattern 200.

Figure 36:
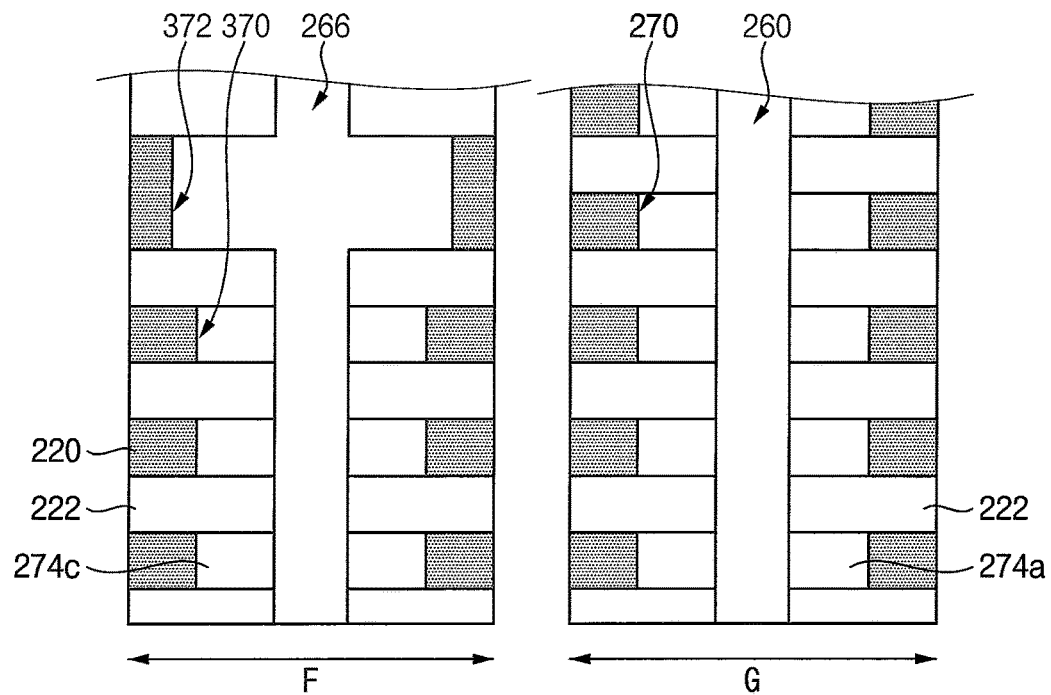

Referring to FIG. 36, the first and second sacrificial layers 206 and 220 and the insulation pad pattern 208 exposed by the first and second through holes 260 and 262 and the cell contact hole 266 may be partially etched by a wet etching process to form a first gap, a second gap, a fifth gap, and a sixth gap. The first gap may be communicated with the sidewall of the first through holes 260, and the second gap may be communicated with the sidewall of the second through holes 262. The fifth gap 370 and the sixth gap 372 may be communicated with the cell contact hole 266.

In the cell contact hole 266, a portion of the sacrificial layer 206 and 220 and the insulation pad pattern 208 stacked may be more etched by the wet etching process to form the sixth gap 372 having a first depth in the horizontal direction. Also, the sacrificial layers 206 and 220 thereunder may be etched by the wet etching process to form the fifth gap 370 having a depth less than the first depth in the horizontal direction.

A capping insulation layer may be conformally formed on sidewalls of the first and second through holes 260 and 262, the cell contact hole and the contact hole 264, upper surfaces of the lower pad patterns 108 and the base semiconductor pattern 200, inner portions of the first, second, fifth, and sixth gaps 270, 272, 370, 372, and an upper surface of the second insulating interlayer 252. The capping insulation layer may be formed to completely fill the inner portions of the first gap 270, the second gap 272, and the fifth gaps 370. However, the capping insulation layer may not completely fill the inner portion of the sixth gap 372. Further, the capping insulation layer may not completely fill inner portions of the first and second through holes 260 and 262, the cell contact hole 266 and the contact hole 264.

The capping insulation layer may be partially removed by, e.g., a wet etching process. Thus, the capping insulation layer may only remain on the inner portions of the first, second, and fifth gaps 270, 272, and 370, and the capping insulation layer on the other portions may be completely removed. First to third capping insulation patterns 274a, 274b, and 274c may be formed in the first, second, and fifth gaps 270, 272, and 370, respectively.

Figure 37:
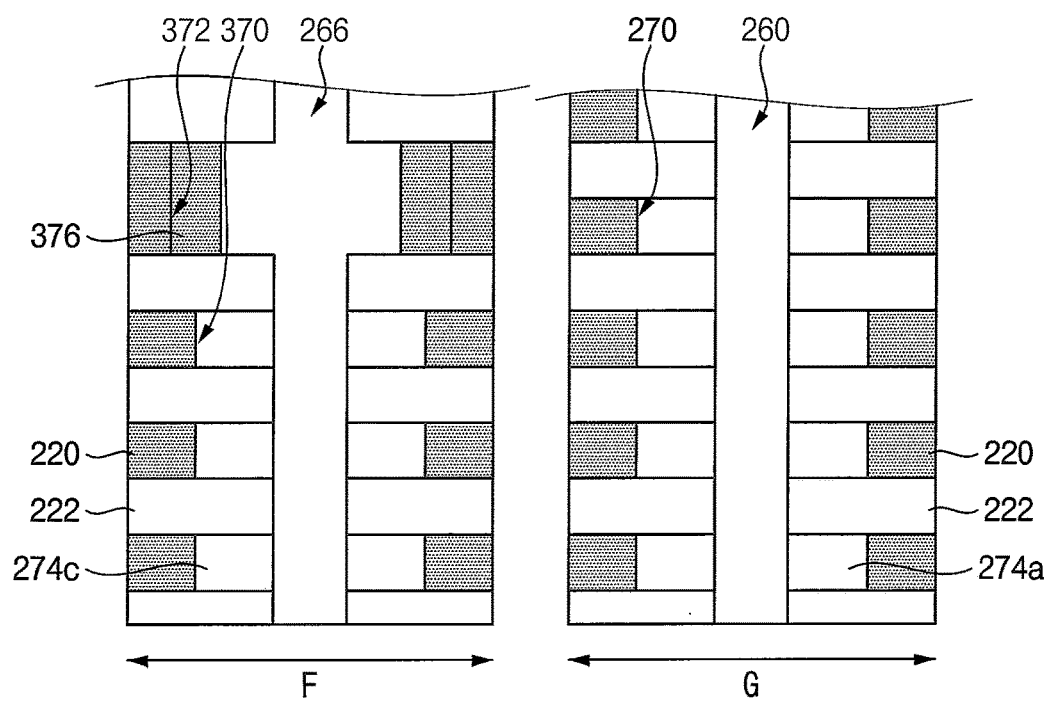

Referring to FIG. 37, a third sacrificial layer may be conformally formed on sidewalls of the first and second through holes 260 and 262, the cell contact hole 266 and the contact hole 264, the upper surfaces of the lower pad patterns 108 and the base semiconductor pattern, the first to third capping insulation patterns 274a, 274b, and 274c, and the upper surface of the second insulating interlayer 252. The third sacrificial layer may be formed to completely fill the inner portion of the sixth gap 372. However, the third sacrificial layer may not completely fill the inner portions of the first and second through holes 260 and 262, the cell contact hole 266 and the contact hole 264.

Thereafter, the third sacrificial layer may be partially removed by, e.g., a wet etching process. Thus, the third sacrificial layer may only remain in the sixth gap 372, and the third sacrificial layer on the other portions may be completely removed. A third sacrificial pattern 376 may be formed in each of the sixth gap 372 by the wet etching process. Therefore, the third sacrificial pattern 376 and the third capping insulation pattern 274c may be exposed by the sidewall of the cell contact hole 266.

Figure 38:
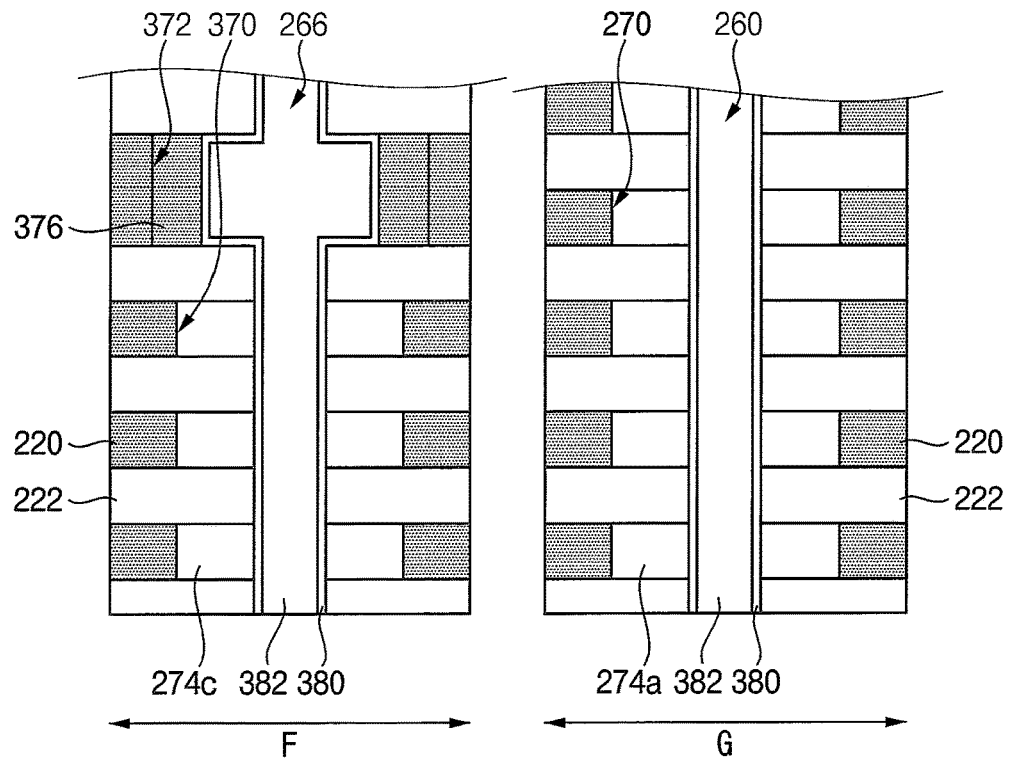

Referring to FIG. 38, a spacer layer may be conformally formed to cover the sidewalls of the first and second through holes 260 and 262, the cell contact hole 266, and the contact hole 264. A fourth sacrificial layer may be formed on the spacer layer to fill the first and second through holes 260 and 262, the cell contact holes 266 and the contact holes 264. Thereafter, the fourth sacrificial layer and the spacer layer may be planarized until an upper surface of the second insulating interlayer 410 is exposed to form a spacer 380 and a fourth sacrificial pattern 382. The spacer 380 and the fourth sacrificial pattern 382 may be formed in the first and second through holes 260 and 262, the cell contact hole 266, and the contact hole 264.

Next, same processes as described previously with reference to FIG. 26 may be performed. That is, the first and second insulating interlayers 242 and 252, the preliminary cell mold structure 234, the preliminary dummy mold structure 232, and the first and second lower insulation patterns 212 and 240 may be etched to form the trench 300 extending in the first direction. Same processes as described previously with reference to FIGS. 27 and 28 may be performed subsequently. That is, in the preliminary cell mold structure and the preliminary dummy mold structure, the sacrificial layers and the sacrificial patterns may be replaced with a metal material by a replacement process. Thus, the stacked structure and the dummy structure may be formed.

Figure 39:
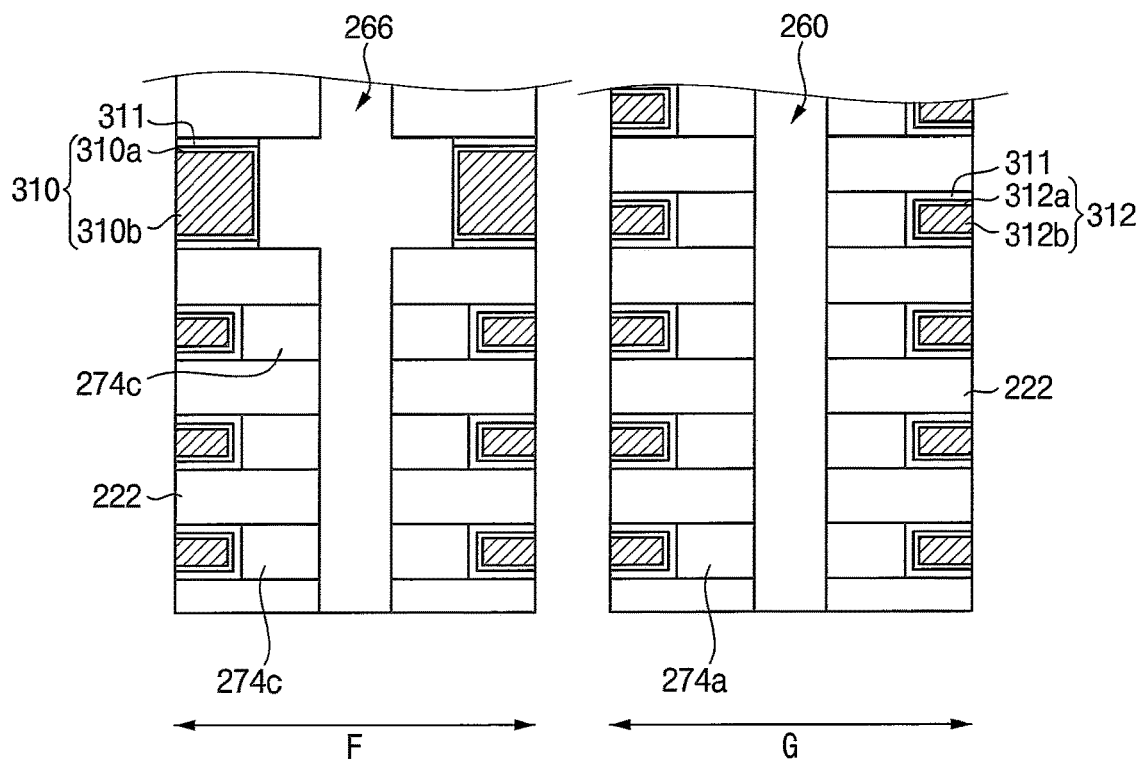

Referring to FIG. 39, the fourth sacrificial pattern 382 and the spacer 380 filling the first and second through holes 260 and 262, the cell contact hole 266, and the contact hole 264 may be removed. In example embodiments, when the spacer is removed, the second blocking layer 311 exposed by the sixth gap 372 communicating with the cell contact hole 266 may be removed together. Therefore, sidewalls of the gate patterns 310 in the cell stacked structure may be exposed by the sixth gap 372.

Referring to FIGS. 33 and 34 again, a conductive material may be formed to fill the first and second through holes 260 and 262, the cell contact holes 266, and the contact holes 264. Thus, the first through via contact 290, the second through via contact 292, the cell contact plug 340, and the contact plug 294 may be formed in the first and second through holes 260 and 262, the cell contact holes 266, and the contact holes 264, respectively. The processes may be similar to those described previously with reference to FIGS. 21 and 22.

By the above process, the NAND flash memory device shown in FIGS. 33 and 34 may be manufactured.

By way of summation and review, example embodiments provide a memory device having a structure for reducing process failures. Example embodiments also provide an electric system including a memory device.

That is, in example embodiments, a memory device may include a dummy structure horizontally spaced apart from a cell stacked structure, thereby minimizing dishing of the upper surface of the lower insulation pattern between the cell stacked structure and the dummy structure. Further, the sacrificial layers included in the upper portion of the dummy structure may have flat upper and lower surfaces, thereby further minimizing dishing of the upper surface of the dummy structure, which in turn, prevents or substantially minimizes defects due to dishing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A memory device, comprising:
a substrate;
a cell stacked structure on the substrate, the cell stacked structure including insulation layers and gate patterns alternately stacked;
a channel structure passing through the cell stacked structure, the channel structure extending in a vertical direction;
a dummy structure on the substrate, the dummy structure being spaced apart from the cell stacked structure, and the dummy structure including the insulation layers and metal patterns alternately stacked;
a first through via contact passing through the dummy structure, the first through via contact extending in the vertical direction; and
a first capping insulation pattern between a sidewall of the first through via contact and each of the metal patterns in the dummy structure, the first capping insulation pattern insulating the first through via contact from each of the metal patterns.
2. The memory device as claimed in claim 1, wherein the first capping insulation pattern includes silicon oxide.
3. The memory device as claimed in claim 1, wherein the first capping insulation pattern has a ring shape contacting a sidewall of each of the metal patterns and surrounding the sidewall of the first through via contact.
4. The memory device as claimed in claim 1, wherein the gate patterns in the cell stacked structure and the metal patterns in the dummy structure include a same material.
5. The memory device as claimed in claim 1, further comprising a trench extending in a first direction parallel to an upper surface of the substrate, the cell stacked structure and the dummy structure being arranged to be adjacent to each other in the first direction along a sidewall of the trench.
6. The memory device as claimed in claim 1, wherein each of the metal patterns in the dummy structure is at a same vertical level as a vertical level of each corresponding one of the gate patterns in the cell stacked structure.
7. The memory device as claimed in claim 1, wherein the cell stacked structure includes:
a first cell stacked structure including first insulation layers of the insulation layers and first gate patterns of the gate patterns alternately stacked; and
a second cell stacked structure on the first cell stacked structure, the second cell stacked structure including second insulation layers of the insulation layers and second gate patterns of the gate patterns alternately stacked.

8. The memory device as claimed in claim 7, wherein the dummy structure is at a same vertical level as a vertical level of the second cell stacked structure.

9. The memory device as claimed in claim 1, wherein the dummy structure is at a same vertical level as a vertical level of the cell stacked structure.

10. The memory device as claimed in claim 1, further comprising:
 a circuit pattern on the substrate; and
 a base semiconductor pattern on the circuit pattern, the first through via contact passing through the base semiconductor pattern, and the first through via contact being electrically connected to the circuit pattern.

11. The memory device as claimed in claim 1, further comprising:
 a second through via contact passing through the cell stacked structure, the second through via contact extending in the vertical direction; and
 a second capping insulation pattern between a sidewall of the second through via contact and each of the gate patterns, the second capping insulation pattern insulating the second through via contact from each of the gate patterns.

12. The memory device as claimed in claim 1, further comprising a cell contact plug contacting an upper surface of a step portion of each of the gate patterns, an edge of each of the gate patterns of the cell stacked structure including the step portion to define a step shape profile of the cell stacked structure.

13. The memory device as claimed in claim 1, further comprising:
 a cell contact plug contacting a sidewall of a step portion of each of the gate patterns, an edge of each of the gate patterns of the cell stacked structure including the step portion to define a step shape profile of the cell stacked structure; and
 a third capping insulation pattern between the cell contact plug and each of the gate patterns, the cell contact plug and each of the gate patterns being insulated from each other by the third capping insulation pattern.

14. A memory device, comprising:
 a circuit pattern on a substrate;
 a base semiconductor pattern on the circuit pattern;
 a cell stacked structure on the base semiconductor pattern, the cell stacked structure including insulation layers and gate patterns alternately stacked;
 a channel structure passing through the cell stacked structure and extending in a vertical direction, the channel structure including a channel electrically connected to the base semiconductor pattern;
 a dummy structure on the base semiconductor pattern and horizontally spaced apart from the cell stacked structure, the dummy structure including the insulation layers and metal patterns alternately stacked, the metal patterns in the dummy structure and the gate patterns in the cell stacked structure including a same material;
 a first through via contact passing through the dummy structure and extending in the vertical direction, the first through via contact being electrically connected to the circuit pattern; and
 a first capping insulation pattern between a sidewall of the first through via contact and each of the metal patterns, the first capping insulation pattern insulating the first through via contact from each of the metal patterns.

15. The memory device as claimed in claim 14, further comprising a trench extending in a first direction parallel to an upper surface of the substrate, the cell stacked structure and the dummy structure being arranged adjacent to each other in the first direction at a sidewall of the trench.

16. The memory device as claimed in claim 14, wherein each of the metal patterns in the dummy structure is at a same vertical level as a vertical level of each of a corresponding one of the gate patterns in the cell stacked structure.

17. The memory device as claimed in claim 16, wherein the first capping insulation pattern has a ring shape contacting a sidewall of each of the metal patterns and surrounding the sidewall of the first through via contact.

18. The memory device as claimed in claim 16, wherein the first capping insulation pattern includes silicon oxide.

19. The memory device as claimed in claim 16, further comprising an insulation pattern between a sidewall of the first through via contact and the base semiconductor pattern.

20. An electric system, comprising:
 a memory device; and
 a controller to control the memory device, the controller being electrically connected to the memory device through an input/output pad of the memory device,
 wherein the memory device includes:
  a peripheral circuit pattern on a substrate, the input/output pad being electrically connected to the peripheral circuit pattern,
  a cell stacked structure on the peripheral circuit pattern, the cell stacked structure including insulation layers and gate patterns alternately stacked,
  a channel structure passing through the cell stacked structure and extending in a vertical direction,
  a dummy structure on the peripheral circuit pattern and horizontally spaced apart from the cell stacked structure, the dummy structure including the insulation layers and metal patterns alternately stacked,
  a first through via contact passing through the dummy structure and extending in the vertical direction, the first through via contact being electrically connected to the peripheral circuit pattern, and
  a first capping insulation pattern between a sidewall of the first through via contact and each of the metal patterns, the first through via contact and each of the metal patterns being insulated from each other by the first capping insulation pattern.

* * * * *